(12) United States Patent
Nishikawa

(10) Patent No.: US 6,791,766 B2
(45) Date of Patent: Sep. 14, 2004

(54) METHOD AND DEVICE FOR HOLDING OPTICAL MEMBER, OPTICAL DEVICE, EXPOSURE APPARATUS, AND DEVICE MANUFACTURING METHOD

(75) Inventor: Jin Nishikawa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/259,385

(22) Filed: Sep. 30, 2002

(65) Prior Publication Data

US 2003/0076602 A1 Apr. 24, 2003

Related U.S. Application Data

(63) Continuation of application No. PCT/JP01/02593, filed on Mar. 28, 2001.

(30) Foreign Application Priority Data

Mar. 31, 2000 (JP) ........................................ 2000-098042
Mar. 31, 2000 (JP) ........................................ 2000-098093

(51) Int. Cl.⁷ .......................... G02B 7/02; G03B 17/26; G03B 21/14; F21V 17/00
(52) U.S. Cl. ....................... 359/811; 359/819; 353/100; 396/526; 362/455
(58) Field of Search ................................ 359/822–823, 359/819, 811, 703–704, 649–651, 642, 754, 763, 766, 728, 820, 809, 824; 353/100; 396/526; 362/455; 349/5–6; 355/53, 67

(56) References Cited

U.S. PATENT DOCUMENTS

| | | | |
|---|---|---|---|
| 4,690,528 A | * | 9/1987 | Tanimoto et al. ........... 353/101 |
| 4,825,247 A | | 4/1989 | Kemi et al. |
| 5,559,584 A | | 9/1996 | Miyaji et al. |
| 5,852,518 A | | 12/1998 | Hatasawa et al. |
| 5,871,587 A | | 2/1999 | Hasegawa et al. |
| 5,883,704 A | * | 3/1999 | Nishi et al. ................... 355/67 |
| 5,973,863 A | | 10/1999 | Hatasawa et al. |
| 6,043,863 A | * | 3/2000 | Ikeda ........................... 355/53 |
| 6,118,599 A | | 9/2000 | Spinali |
| 6,222,610 B1 | | 4/2001 | Hagiwara et al. |
| 6,239,924 B1 | | 5/2001 | Watson et al. |
| 6,252,648 B1 | | 6/2001 | Hase et al. |
| 6,288,769 B1 | | 9/2001 | Akagawa et al. |
| 6,571,057 B2 | * | 5/2003 | Aoki ........................... 396/53 |

FOREIGN PATENT DOCUMENTS

| | | |
|---|---|---|
| JP | 4-103039 | 4/1992 |
| JP | 6-201968 | 7/1994 |
| JP | 11-14876 | 1/1999 |
| WO | WO 99/25010 | 5/1999 |

* cited by examiner

Primary Examiner—Hung Xuan Dang
Assistant Examiner—Joseph Martinez
(74) Attorney, Agent, or Firm—Oblon, Spivak, McClelland, Maier & Neustadt, P.C.

(57) ABSTRACT

A flange portion is provided to at least a part of the periphery at the center position in the direction of the optical axis of a lens. The lens is held with clamping members and a lens holding metallic part, with the flange portion pressed by the clamping members. The portion where the flange portion is provided, suffers no compressive strain and tensile strain due to the bending of the lens, and is a part of the periphery of a neutral plane, which is the farthest plane from the optical surface of the lens. Therefore, the influence of the clamping force on the flange portion acting on other portions of the lens is reduced to the utmost, and the deformation of the optical surface due to the force acting on the flange portion is reduced to a minimum. As a result, the deterioration of the optical properties of the lens can be suppressed to the utmost.

31 Claims, 19 Drawing Sheets

METHOD AND DEVICE FOR HOLDING OPTICAL MEMBER, OPTICAL DEVICE, EXPOSURE APPARATUS, AND DEVICE MANUFACTURING METHOD

CROSS-REFERENCE TO RELATED APPLICATIONS

This is a continuation of International Application PCT/JP01/02593, with an international filing date of Mar. 28, 2001, the entire content of which being hereby incorporated herein by reference, which was not published in English.

BACKGROUND OF THE INVENTION

1. Field of the Invention

The present invention relates to a method and a device for holding an optical member, an optical device, an exposure apparatus, and a device manufacturing method, and more particularly, it relates to a method and a device for holding an optical member that holds an optical member such as a lens having a flange portion on the periphery portion, an optical device having a plurality of the optical members within its barrel, an exposure apparatus comprising the optical device as its optical system, and a device manufacturing method using the exposure apparatus.

2. Description of the Related Art

Conventionally, various exposure apparatus have been used in a lithographic process for producing devices such as semiconductor devices. In recent years, for example, projection exposure apparatus such as reduction projection exposure apparatus (so-called steppers) that reduce and transfer a pattern formed on a mask (also referred to as a reticle) proportionally enlarged around four to five times onto a substrate subject to exposure such as a wafer via a projection optical system based on a step-and-repeat method, or scanning projection exposure apparatus (so-called scanning steppers) that are an improvement of the steppers based on a step-and-scan method, are mainly used for producing semiconductor devices.

With these exposure apparatus, exposure wavelength has shifted to a shorter range in order to cope with finer integrated circuits and to achieve high resolution. Recently, the exposure apparatus using the ArF excimer laser which wavelength is 193 nm is in practical use, and exposure apparatus that use shorter wavelength such as the $F_2$ laser beam (wavelength: 157 nm) or the Ar2 laser beam (wavelength: 126 nm) are also being developed.

Beams in the wavelength range called the vacuum ultraviolet that belong to the band 200 nm–120 nm, such as the ArF excimer laser beam, the $F_2$ laser beam, or the $Ar_2$ laser beam, have low transmittance to optical glass. Therefore, glass materials that can be used are limited to fluorite, magnesium fluoride, or fluoride crystal such as lithium fluoride. In addition, since these beams are greatly absorbed by gases such as oxygen, water vapor, and hydrocarbon gas (hereinafter referred to as "adsorptive gas"), it is necessary to replace gases existing on optical paths of exposure beams with gases which absorption of vacuum ultraviolet beams is low, that is, inert gas such as nitrogen or helium (hereinafter referred to as "low absorptive gas" as appropriate), so as to lower the concentration of the absorptive gases existing on the optical paths so that it does not exceed several ppm.

Therefore, for example, in an exposure apparatus that uses an ArF excimer laser beam as the exposure beam, in an optical system that has a relatively long optical system such as a projection optical system the interior is divided into a plurality of spaces, and each space is either filled with the low absorptive gas referred to above or a flow of the low absorptive gas is created in the space at all times.

FIG. 18 shows an example of a projection optical system used in a conventional exposure apparatus. A projection optical system PL' shown in FIG. 18 comprises a double-structured barrel 350 consisting of an outer barrel 351A and inner barrels $351B_1$–$351B_4$, and optical member cells C1', C2', C3', and C4' arranged within the barrel 350 at a predetermined interval along the AX direction of an optical axis. The optical member cells C1', C2', C3', and C4' are fixed on the inner circumference surface of the inner barrels $351B_1$, $351B_2$, $351B_3$, and $351B_4$, respectively.

The optical member cells C1', C2', C3', and C4' comprise lenses L1', L2', L3', and L4' serving as optical members, and lens holding devices for holding the lenses L1', L2', L3', and L4'. In the space between the adjacent optical member cells, sealed chambers S1', S2', and S3' are formed, respectively. And to each of the sealed chambers S1', S2', and S3', gas supplying routes 330A, 330B, and 330C, and gas exhausting routes 330D, 330E, and 330F are connected, respectively, for example, so as to create a flow of the low absorptive gas at all times inside the sealed chambers S1', S2', and S3'.

FIG. 19A shows an enlarged view of an optical member cell C3' in FIG. 18, while FIG. 19B shows a disassembled perspective view. As is shown in these drawings, a flange portion is provided on an outer periphery of a lens L3' on its lower half portion. The lens L3' is inserted from above into a hollow cylindrical lens holding metallic part 325, and the flange portion is supported from below at three points with supporting members 322a, 322b, and 322c (supporting member 322c is not shown in the drawings) which are arranged projecting from the inner circumference surface of the lens holding metallic part 325 spaced at an angle of approximately 120°. In addition, clamps 352a, 352b, and 352c (clamp 352b located in the depth of field of the drawing is not shown) are fixed to the lens holding metallic part 325 with bolts 354a, 354b, and 354c, respectively, on an upper surface of the flange portion at positions corresponding to the supporting members 322a, 322b, and 322c. So the upper surface of the flange portion is pushed downward with the clamps 352a, 352b, and 352c.

That is, the lens L3' is fixed with respect to the lens holding metallic part 325 by the flange portion provided on its outer periphery being clamped with the supporting members 322a, 322b, and 322c and the clamps 352a, 352b, and 352c. In this case, the movement of the lens L3' is restricted in three degrees of freedom in the optical axis direction by the clamping force of the clamps 352a, 352b, and 352c, and the movement in the directions of the remaining three degrees of freedom is restricted by the friction between the flange portion and the supporting members and the friction between the flange portion and the clamps.

Further, the reason for employing the structure referred to above that require support at three points is because the lens, which is the object of support, can easily be attached to the lens holding metallic part and stresses due to vibration, temperature change, posture change, and the like on the lens and the lens holding metallic part can be reduced most effectively after the lens is attached, as is with the kinematic support mount which is a typical three point structure.

Incidentally, reference number 356 in FIG. 19A is a filler in order to prevent gases from flowing between the sealed chambers S2' and S3' arranged above and below the lens L3' and to also prevent the position of the lens L3 from shifting.

The other optical member cells C1', C2', and C4' are identically configured with the optical member cell C3'.

With the conventional lens holding structure described above, however, since the flange portion of the lens L3' is supported at three points by the supporting members 322a, 322b, and 322c, in other words, the lens L3' is not supported at points other than the three points, the periphery portion of the lens L3' bends slightly in a trefoil shape (the portion not supported sags) with its own weight making the lens L3' deform asymmetrically with respect to the optical axis. Furthermore, the clamping force acting on the flange portion deforms the optical surface of the lens L3' via the flange portion.

So far, such deformation of the lens or the deformation of the optical surface and deterioration in the optical performance of the projection optical system caused by them has been a trivial matter. Due to higher integration of semiconductor devices, however, the performance of the projection optical system required is also becoming higher; therefore, the deformation described above can no longer be dismissed.

In addition, according to recent studies, when the gas inside the barrel of the projection optical system is replaced to an inert gas, it was discovered that the internal pressure of the barrel increases. And, when, for example, the pressure varies within the barrel, especially when the pressure differs between the adjacent sealed chambers (between rooms S1' and S2', and rooms S2' and S3' in the example described above), the situation may occur where the lens is pressurized and in some cases floats from its setting.

In actual, the projection optical system needs to withstand disturbance up to 3G in the direction within the plane perpendicular to the optical axis (lateral direction). So, for example, in order to make the friction force 3G when the coefficient of static friction $\mu$ is $\mu=0.2$, clamping force needs to be around 15G. Under such conditions, and the lens shaped in a disk 20 mm thick with a plurality of diameters using fluorite ($CaF_2$) as its raw material, the inventor performed a trial calculation on each the downward force, which is the sum of the clamping force and the gravitational force of the lens it self, and on the upward force caused by the pressure difference. And, by comparing both calculations, the inventor discovered that the lens is dislodged when the pressure difference reaches around 10,000 Pa.

In addition, with the conventional exposure apparatus, only the flow rate of the low absorptive gas supplied to the space within the projection optical system was different on initial gas replacement period, such as the start-up of the apparatus when gases such as air exist within the space inside the projection optical system and such internal gases have to be replaced with the low absorptive gas, and on gas purity maintenance period (steady period) when the purity of the low absorptive gas within the space needs to be maintained at a constant level after the initial gas replacement has been completed. That is, when gases were initially replaced within each inner space of the projection optical system, the flow rate of the low absorptive gas was large (for example, 50 $dm^3$/min), and when the gas purity was maintained the flow rate of the low absorptive gas supplied to the inner space of the projection optical system was decreased compared with the initial gas replacement. Also, the same gas supplying system was used for the initial gas replacement and the gas purity maintenance described above.

Furthermore, supplying low absorptive gas to a plurality of spaces within the projection optical system was performed via a gas supplying route, which was made by opening vents in the barrel to create a gas supplying route and a gas exhausting route for each space.

By performing an experiment using equipment modeled on a projection optical system having a conventional tube-typed barrel, the inventor confirmed that the amount of light on the image plane of the projection optical system decreases with the elapse of time when the low absorptive gas is continuously purged into the inner space of the projection optical system for many hours. From this result, an assumption can be made that the transmittance decreased because impurities such as absorptive gases accumulated in the inner space of the projection optical system with the elapse of time, and light was absorbed by the impurities along the illumination optical path.

In addition, with such a purge method of low absorptive gas into the projection optical system or the like, even though the flow rate of the low absorptive gas did not have to be as large as the initial gas replacement, the purge had to be performed with a certain amount of flow of low absorptive gas in order to secure a sufficient purge performance. Therefore, when expensive gases such as helium were used as the low absorptive gas, the running cost turned out to be expensive.

Furthermore, in the case of using light which wavelength is shorter than the $F_2$ laser beam (wavelength: 157 nm) as the illumination light for exposure, it is more likely that a reflection refraction system will be employed due to problems such as glass material or color aberration. Normally, when such a projection optical system is employed, the barrel of the projection optical system is different from that of a refraction optical system and has a barrel portion that extends in the direction intersecting the gravitational direction in addition to a barrel portion that extends in the gravitational direction. In such a case, gas flow in the inner space of the barrel portion extending in the direction intersecting the gravitational direction may become sluggish and gas may collect within the inner space of the barrel portion.

SUMMARY OF THE INVENTION

The present invention has been made in consideration of the situation described above, and has as its first object to provide a method and a device for holding an optical member that are capable of suppressing deformation of an optical member and deterioration of its optical performance to the utmost.

It is the second object of the present invention to provide an optical device that is capable of maintaining good optical performance.

It is the third object of the present invention to provide an exposure apparatus capable of performing exposure with high precision.

And, it is the forth object of the present invention to provide a device manufacturing method that can improve the productivity when producing highly integrated microdevices.

According to the first aspect of the present invention, there is provided a method for holding an optical member, the method holding the optical member via a flange portion provided on at least a part of a periphery portion close to a neutral plane position of the optical member.

With this method, the optical member is held via a flange portion provided on at least a part of a periphery portion close to a neutral plane position of the optical plane where it is free of compressive strain and tensile strain caused by the bending of the optical members. Therefore, the effect the holding force acting on the flange portion has on other portions of the optical member is suppressed to the utmost. In addition, since the neutral plane is a plane farthest from the optical surface of the optical member, the deformation of the optical surface due to the force acting on the flange portion is reduced to the minimum. Accordingly, it becomes possible to suppress the deformation of the optical surface of the optical member and deterioration in the optical properties due to the deformation to the utmost.

In this case, a plurality of points on a surface on both sides in an optical axis direction of the optical member in the flange portion can be clamped with a predetermined force.

In this case, the plurality of points can be three points that correspond to each vertex position of a triangle.

According to the second aspect of the present invention, there is provided a holding device which holds an optical member, the holding device for the optical member comprising: a holding member which one end portion in an optical axis direction of the optical member is insertable and supports a surface of a flange portion on one side in the optical axis direction in an inserted state, the flange portion provided on at least a part of a periphery portion at a center position in the optical axis direction of the optical member; and a clamping member which clamps the flange portion with the holding member by pressurizing a surface on a remaining side in the optical axis direction of the flange portion with a predetermined pressure.

With the conventional lens supporting structure previously described as a premise, according to the simulation results regarding the deformation of the optical surface of the lens (lens surface) repeatedly performed by the inventor, it has been confirmed that even with the same supporting structure the deformation of the optical surface differs depending on the thickness and the position of the flange portion, and that the deformation of the optical surface is minimized when the position of the flange portion is at the center position in the optical axis direction.

Therefore, with the present invention where the flange portion is arranged on at least a part of a periphery portion at a center position in the optical axis direction of the optical member, and the flange portion is clamped with the clamp and the holding member in a state where the flange portion is pressurized by the clamp, it becomes possible to suppress the deformation of the optical surface and the deterioration in the optical properties due to the deformation to the utmost. The following reasons can be considered for this case; that the position where the flange portion is arranged is on the periphery portion of a neutral plane where it is free of compressive strain and tensile strain caused by the bending of the optical members so that the effect the holding force acting on the flange portion has on other portions of the optical member is suppressed to the utmost, and that since the neutral plane is a plane farthest from the optical surface of the optical member, the deformation of the optical surface due to the force acting on the flange portion is reduced to the minimum.

Accordingly, the deformation occurring on the optical surface, which is the edge surfaces on both sides of the optical member in the optical axis direction, is reduced to a level that can be neglected, thus, it becomes possible to suppress the deterioration in the optical properties to the utmost.

In this case, the flange portion may be around 5 mm thick in the optical axis direction, or the flange portion may have a thickness around $\frac{1}{10}$ to $\frac{2}{3}$ times as that of the peripheral edge of the portion other than the flange portion. When the thickness of the flange portion is thin, the effect the holding force acting on the flange portion has on other portions of the optical member can be suppressed, however, when it is too thin, the processing becomes difficult and also the optical member will not be able to support its own weight. And based on the results of simulations or the like performed by the inventor, with consideration of the status quo of the processing technology, it has been confirmed that both the manufacturing possibility of the optical member and the suppression of its deformation can be sufficiently satisfied when the thickness of the flange portion in the optical axis direction is around 5 mm, or around $\frac{1}{10}$ to $\frac{2}{3}$ times the thickness of the peripheral edge of the portion other than the flange portion (the distance between the periphery edge on one side of the optical axis direction and the periphery edge on the other side of the optical axis direction).

According to the third aspect of the present invention, there is provided a first optical device, the device comprising: a barrel; a plurality of optical members arranged within the barrel in a predetermined positional relationship; and a holding device which holds a specific optical member via a flange portion provided on at least a part of a periphery portion close to a neutral plane position of the specific optical member, the specific optical member a part of the plurality of optical members.

With this optical device, it comprises a holding device, which holds at least a specific optical member among a plurality of optical members via a flange portion provided on at least a part of a periphery portion close to a neutral plane position of the specific optical member. Accordingly, the deformation (of the optical surface) of the specific optical member as well as the deterioration in the optical properties that occur with the elapse of time are effectively suppressed, and as a consequence, it becomes possible to maintain favorable optical properties (including image forming characteristics) for a long period of time.

In this case, the specific optical member can have the flange portion provided on at least a part of a periphery portion at a center position in an optical axis direction of the specific optical member, and the holding device can have a holding member which one end portion in an optical axis direction of the optical member is insertable and supports a surface of the flange portion on one side in the optical axis direction in an inserted state, and a clamping member which clamps the flange portion with the holding member by pressurizing a surface on a remaining side in the optical axis direction of the flange portion with a predetermined pressure.

According to the fourth aspect of the present invention, there is provided a second optical device, the device comprising: a barrel; a plurality of optical members each held in the barrel and form a plurality of sealed spaces within the barrel; a gas supply unit which supplies a specific gas into each of the sealed spaces; and a control system which controls specific gas environments in each of the sealed spaces to keep pressure difference from occurring in adjacent sealed spaces.

With this optical device, the gas supply unit supplies the specific gas into each of the plurality of sealed spaces formed by the barrel and the plurality of optical members. And upon this operation, the control system controls the specific gas environment so that pressure difference does not occur in adjacent sealed spaces. This allows the specific gas environment to be maintained without putting unnecessary pressure on the optical members. Therefore, the optical members can be kept from floating from their settings by the pressure difference and can be stably held, and damage, deformation, or the like can be effectively suppressed. This makes it possible to maintain favorable optical properties (including image forming characteristics) of the optical device. The sealed structure, in this case, may be a completely sealed structure totally cutting off outside gases, or if impurities in the outside gases do not enter the sealed space, it may be a sealed structure almost all sealed that can be maintained with a predetermined pressure.

In this case, as the control system that controls the specific gas environment, various structures can be considered. For example, the control system may include pressure sensors which measure pressure in each of the sealed spaces, and a flow amount control unit which controls the flow of the specific gas supplied into each of the sealed spaces from the gas supply unit based on measurement results of the pressure sensors, or, the control system may include a pressure adjustment unit which adjusts the internal pressure to keep pressure difference in adjacent sealed spaces from occurring in both of the adjacent sealed spaces.

In this case, various pressure adjustment units may be considered. For example, the pressure adjustment unit can be a pressure adjustment valve arranged on the partition wall of the adjacent sealed spaces, or the pressure adjustment unit can be a diaphragm arranged on the partition wall of the adjacent sealed spaces. In the former case, when pressure difference occurs in the adjacent sealed spaces, the specific gas flows from the sealed space where the pressure is high to the sealed space where the pressure is low via the pressure adjustment valve, thus automatically reducing the pressure difference in the adjacent sealed spaces to almost zero without any complicated controls. Also, in the latter case, when pressure difference occurs in the adjacent sealed spaces, due to the flexibility of the diaphragm arranged on the partition wall deforms in the direction so that the volume of the sealed space where the pressure is high increases and the volume of the sealed space where the pressure is low decreases. As a result, the pressure difference in the adjacent sealed spaces is automatically reduced or dissolved, without any complicated controls.

With the second optical device in the present invention, the specific gas can be a gas with permeability to an energy beam, and at least a part of a supply opening of the gas supply unit which supplies the specific gas into each of the sealed spaces can be arranged in a gap made between the adjacent optical members.

With the second optical device in the present invention, a flange portion can be provided on at least a part of a periphery portion close to a neutral plane position of a specific optical member, the specific optical member at least a part of specific optical members among the plurality of optical members, and the optical device can further comprise: a holding device which holds the specific optical member.

According to the fifth aspect of the present invention, there is provided a third optical device arranged on an optical path of an energy beam, the optical device comprising: a barrel; a plurality of optical members arranged in a predetermined positional relationship on the optical path of the energy beam within the barrel; a gas supply system which has a supply opening that is arranged in the barrel, and supplies a specific gas having permeability to the energy beam into a space divided by the plurality of optical members via the supply opening; an exhaust system which has an exhaust opening that is arranged in the barrel, and exhausts gas within the space via the exhaust opening; wherein the supply opening of the specific gas is arranged closer to the optical path of the energy beam than the exhaust opening of the gas.

With this optical device, the gas supply system supplies the specific gas having the properties that allow transmittance of the energy beam to the space divided by the plurality of optical members within the barrel via the supply opening arranged in the vicinity of the optical path of the energy beam. This allows the specific gas to be efficiently purged into the optical path of the energy beam and its vicinity in the space divided by the plurality of optical members within the barrel, that is, that absorptive gas or the like having the properties of absorbing the energy beam can be efficiently removed from the optical path of the energy beam and its vicinity. In addition, since the exhaust opening is arranged at a position further away from around the optical path than the supply opening of the specific gas, the amount of gas lingering within the space is reduced. Accordingly, the transmittance of the energy beam is hardly cut off by the absorptive gas or the like within the space, therefore, the energy beam transmittance of the optical device and its optical properties (including the image forming characteristics) can be favorably maintained.

As the space within the barrel divided by the plurality of optical members, the space may be formed of a completely sealed structure and completely cut off from the gases outside the space, or if it is structured so that impurities in the gases outside do not enter the space, it may be a space formed of an almost complete sealed structure which sealed state can be maintained with a predetermined pressure.

In this case, the supply opening can be arranged in a gap located between the optical members reciprocally adjacent. In such a case, the specific gas can be purged into gaps in between the optical members where it is difficult to perform a sufficient purge.

With the third optical device in the present invention, a flange portion can be provided on at least a part of a periphery portion close to a neutral plane position of a specific optical member, the specific optical member is at least one of plurality of optical members, and the optical device can further comprise: a holding device which holds the specific optical member.

With the third optical device in the present invention, a plurality of the spaces can be formed inside the barrel with the plurality of optical members, and the optical device can further comprise: a control system which controls specific gas environments in each of the sealed spaces to keep pressure difference from occurring in adjacent spaces.

According to the sixth aspect of the present invention, there is provided a fourth optical device arranged on an optical path of an energy beam, the optical device comprising: a barrel; a plurality of optical members arranged in a predetermined positional relationship on the optical path of the energy beam within the barrel; a first supplying route which is provided along with the barrel, and which has a first supply opening with a predetermined opening area for supplying a specific gas, which has permeability to the energy beam, into a space inside the barrel divided by the plurality of optical members; a second supplying route which is provided a long with the barrel, and which has a second supply opening with an opening area smaller than the first supply opening which supplies the specific gas into the space; an exhausting route which is provided along with the barrel, and which exhausts outside internal gas in the space; and a control unit which controls supply of the specific gas into the space by selecting at least one of the first supplying route and the second supplying route, depending on a state inside the space.

With this optical device, the control unit selects at least either one of the first supplying route or the second supplying route depending on the state inside the space within the barrel divided by the plurality of optical members for supplying the specific gas. That is, the specific gas is supplied to the space via the selected supplying route, and corresponding to the supply of the specific gas the internal gas within the space is exhausted outside via the exhausting route. Since the opening area is large in the first supplying route, in the case this is selected as the supplying route a large amount of the specific gas is supplied to the space. On the other hand, the opening area of the second supplying route is smaller than that of the first supplying route, so in the case this supplying route is selected a small amount of the specific gas is supplied to the space. Accordingly, by controlling the specific gas supply with the control unit selecting at least either one of the first supplying route or the second supplying route depending on the state inside the space, the gas within the space can be replaced with the specific gas in a short period of time, or, the purity of the specific gas within the space can be maintained while reducing the running cost by supplying a small amount of specific gas after the gas is replaced. Therefore, the purge performance of the optical device can be improved, and the optical properties can be favorably maintained for a long period of time.

And, as is previously described, as the space within the barrel divided by the plurality of optical members, the space may be formed of a completely sealed structure and completely cut off from the gases outside the space, or if it is structured so that impurities in the gases outside do not enter the space, it may be a space formed of an almost complete sealed structure which sealed state can be maintained with a predetermined pressure.

In this case, the control unit can replace the internal gas with the specific gas by supplying the specific gas via at least the first supplying route of the first supplying route and the second supplying route, when the internal gas of the space contains much absorptive gas which has properties of absorbing the energy beam.

In addition, the control unit can supply the space with the specific gas via the second supplying route, when the internal gas of the space contains less of absorptive gas which has properties of absorbing the energy beam.

With the fourth optical device in the present invention, the second supply opening can be arranged closer to the optical path of the energy beam than the first supply opening. In such a case, the optical path of the energy beam in the space and its vicinity can be effectively purged with the specific gas.

With the fourth optical device in the present invention, the second supply opening can be arranged in a gap located between the optical members reciprocally adjacent, and the control unit can supply the space with the specific gas via both the first and the second supplying routes, when the internal gas of the space contains much absorptive gas which has properties of absorbing the energy beam.

With the fourth optical device in the present invention, a flange portion can be provided on at least a part of a periphery portion close to a neutral plane position of a specific optical member, the specific optical member is at least one of the plurality of optical members, and the optical device can further comprise: a holding device which holds the specific optical member.

With the fourth optical device in the present invention, a plurality of spaces can be formed inside the barrel with the plurality of optical members, and the optical device can further comprise: a control system which controls specific gas environments in each of the sealed spaces to keep pressure difference from occurring in adjacent spaces.

According to the seventh aspect of the present invention, there is provided a fifth optical device arranged on an optical path of an energy beam, the optical device comprising: a first barrel portion which extends in a direction intersecting a gravitational direction, in which a first space is formed inside; a second barrel portion which is connected to the first barrel portion and extends in the gravitational direction, in which a second space is formed inside; and a first and second gas supply/exhaust systems which are arranged individually for the first space and the second space, the systems purging a specific gas having permeability to the energy beam.

With this optical device, it comprises: a first barrel portion which extends in a direction intersecting a gravitational direction, in which a first space is formed inside; a second barrel portion which is connected to the first barrel portion and extends in the gravitational direction, in which a second space is formed inside; and a first and second gas supply/exhaust systems which are arranged individually in the first space and the second space, the systems for purging a specific gas having properties that allow transmittance of the energy beam. Therefore, not only is the second space within the second barrel portion is purged with the specific gas by the second gas supply/exhaust system, but also the first space within the first barrel portion is purged with the specific gas by the first gas supply/exhaust system. Accordingly, the purge performance of the optical device can be improved by preventing the gas from lingering in the first space, thus the optical properties can be favorably maintained for a long period of time.

In this case, when the specific gas is a gas which relative density is lighter than air, gas supply openings of the first and second gas supply/exhaust systems are preferably arranged in the upper portion of the gravitational direction in each of the spaces, whereas gas exhaust openings are preferably arranged in the lower portion of the gravitational direction in each of the spaces. In such a case, when the density of the specific gas is lighter than air, each of the space is gradually filled from above with the specific gas. Therefore, with the specific gas supplied from the upper side of each space and exhausted from the lower side, the internal gas can be evenly replaced in the entire space with the specific gas.

With the fifth optical device in the present invention, the optical device can have a mirror with a first reflection surface on which the energy beam is reflected and a concave mirror which reflects the energy beam reflected off the first reflection surface onto a second surface of the mirror that are arranged in either one of the first space and the second space in any one of an individual and simultaneous manner, and in a space where the mirror is arranged, the specific gas that has a higher purity level compared with that of other spaces can be purged via a predetermined gas supply/exhaust system of the first and second gas supply/exhaust systems. In such a case, the optical path within the space including the mirror is a so-called double path optical path, thus requiring a higher purge accuracy of the specific gas compared with other portions. The space, however, is purged with the specific gas that has a higher purity than the other portions, therefore, the purge accuracy required can be sufficiently satisfied.

In this case, in the space where the mirror is arranged, a gas supply opening of the specific gas can be arranged in the vicinity of the mirror. In such a case, the mirror can be protected more effectively from deterioration due to impurities and the energy beam.

With the fifth optical device in the present invention, inside at least one of the first and the second barrel portion the optical device can comprise: a plurality of optical members arranged in a predetermined positional relationship; and a holding device which holds the specific optical member via a flange portion provided on at least a part of a periphery portion close to a neutral plane position of a specific optical member, the specific optical member is at least one of the plurality of optical members.

With the fifth optical device in the present invention, the first space and the second space can be reciprocally adjacent, and the optical device can further comprise: a control system which controls specific gas environments within each of the spaces to keep pressure difference from occurring in the first space and the second space.

With the fifth optical device in the present invention, at least one gas supply opening of the specific gas of the first and second gas supply/exhaust systems can be arranged closer to the optical path of the energy beam than a remaining gas supply opening of the specific gas.

With the fifth optical device in the present invention, at least one of the first and second gas supply/exhaust systems can have a first supplying route which has a first supply opening with a predetermined opening area for supplying a specific gas, a second supplying route which has a second supply opening with an opening area smaller than the first supply opening which supplies the specific gas, and an exhausting route which exhausts outside internal gas in a space subject to purge; and a control unit which controls supply of the specific gas into the space by selecting at least one of the first supplying route and the second supplying route, depending on a state inside the space subject to purge.

According to the eighth aspect of the present invention, there is provided a first exposure apparatus that transfers a pattern of a mask onto a substrate via a projection optical system, the exposure apparatus comprising: a first optical device in the present invention as a projection optical system.

With this exposure apparatus, the mask pattern is transferred onto the substrate via a projection optical system consisting of the optical device according to claim 7 which optical properties are favorably maintained. Therefore, the mask pattern can be transferred with high accuracy on the substrate for a long period of time, and it becomes possible to perform exposure with high precision for over a long period of time.

According to the ninth aspect of the present invention, there is provided a second exposure apparatus that illuminates a mask on which a pattern is formed with an energy beam and transfers the pattern onto a substrate via a projection optical system, the exposure apparatus comprising: a second optical device in the present invention as a projection optical system, wherein the specific gas is a gas having permeability to the energy beam.

With this exposure apparatus, since it comprises the second optical device in the present invention as the projection optical system, the optical properties of the projection optical system do not change easily with the elapse of time. Moreover, since the specific gas supplied to the sealed space within the optical system is a gas having properties of transmitting the energy beam, the energy beam entering the optical member can be maintained at a high transmittance (or reflectance), and exposure amount control with high accuracy over a long period of time becomes possible. Therefore, the mask pattern can be transferred with high accuracy on the substrate for a long period of time, and it becomes possible to perform exposure with high precision for over a long period of time.

According to the tenth aspect of the present invention, there is provided a third exposure apparatus that exposes a substrate via an optical system and a mask with an energy beam and transfers a pattern formed on the mask onto the substrate, the exposure apparatus comprising: a third optical device in the present invention arranged on an optical path of the energy beam from the mask to the substrate.

With this exposure apparatus, it comprises the third optical device in the present invention arranged on the optical path of the energy beam from the mask to the substrate, so the absorptive gas or the like having the properties of absorbing the energy beam can be efficiently removed from the optical path of the energy beam and its vicinity, and the amount of gas lingering in the space can be reduced. Accordingly, the absorptive gas or the like in the space cuts off almost none of the transmittance of the energy beam, thus, the energy beam transmittance and the optical properties of the optical device (including the image forming characteristics) can be favorably maintained. This allows exposure with high precision (transfer of the mask pattern onto the substrate) for over a long period of time. In addition, in this case, since the optical path of the energy beam and its vicinity where it greatly influences the light amount control on the substrate surface and the optical properties (including the image forming characteristics) of the optical system is effectively purged with the specific gas, the entire inner space of the optical system does not necessarily have to be purged evenly with the specific gas. Therefore, the amount of the specific gas used can be reduced, which leads to the reduction of the running cost.

As the inner space in the present invention, the space may be formed of a completely sealed structure and completely cut off from the gases outside the space, or if it is structured so that impurities in the gases outside do not enter the space, it may be a space formed of an almost complete sealed structure which sealed state can be maintained with a predetermined pressure.

In this case, the supply opening can be arranged in the gap located between said adjacent optical members. In such a case, the gap in between the optical members where it is normally difficult to perform a sufficient purge can be easily and sufficiently purged with the specific gas.

With the third exposure apparatus in the present invention, the exposure apparatus can further comprise a scanning unit that scans the mask and the substrate synchronously with respect to the energy beam during exposure of the substrate. That is, the exposure apparatus may be a scanning exposure apparatus. In such a case, the area within the optical system transmitting the energy beam is a part of the optical system (an area of a rectangular slit shape or an arcuated shape). Since, however, the optical path of the energy beam and its vicinity is purged with the specific path via the supply opening arranged close to the optical path of the energy beam, the specific gas can be purged sufficiently, regardless of the shape of the area transmitting the energy beam.

According to the eleventh aspect of the present invention, there is provided a fourth exposure apparatus that exposes a substrate via an optical system and a mask with an energy beam and transfers a pattern formed on the mask onto the substrate, the exposure apparatus comprising: a fourth optical device in the present invention as the optical system.

With this exposure apparatus, it comprises the fourth optical device in the present invention as the optical system.

This allows the control system to control the specific gas supply by choosing at least either one of the first supplying route or the second supplying route depending on the state within the space divided by the plurality of optical members inside the barrel of the optical system (optical device), and as a consequence, the space can be replaced with the specific gas within a short period of time, and then the purity of the gas maintained while reducing the running cost by supplying a small amount of the specific gas into the space after the replacement. Accordingly, the purge performance of the optical device can be improved, in addition to maintaining the optical properties at a favorable level for over a long period of time. Therefore, with the present invention, the purge performance of the optical system can be improved, as well as perform exposure with high precision (transferring the mask pattern onto the substrate) for over a long period of time via the optical system that has been favorably purged.

In this case, the second supply opening can be arranged closer to the optical path of the energy beam than the first supply opening. In such a case, the optical path of the energy beam in the inner space of the optical system and its vicinity can be effectively purged with the specific gas.

With the fourth exposure apparatus of the present invention, the second supply opening can be arranged in a gap between adjacent optical elements structuring the optical system, and the control unit can supply the specific gas into the space via both the first supplying route and the second supplying route on initial gas replacement. In such a case, the gap in between the optical members where it is difficult to perform a sufficient purge on initial gas replacement can be sufficiently purged with the specific gas.

According to the twelfth aspect of the present invention, there is provided a fifth exposure apparatus that irradiates an energy beam on a mask and transfers a pattern formed on the mask onto a substrate, the exposure apparatus comprising: a fifth optical device in the present invention arranged on an optical path of the energy beam from the mask to the substrate.

With this exposure apparatus, it comprises the fifth optical device in the present invention, which is arranged on the optical path of the energy beam from the mask to the substrate. This allows not only the second space of the second barrel portion to be purged with the specific gas by the second gas supply/exhaust system, but the first space of the first barrel portion is also purged with the specific gas by the first gas supply/exhaust system. Accordingly, the gas within the first space can be kept from lingering, which improves the purge performance within the optical device, and the mask pattern can be accurately transferred onto the substrate via the optical device that has been favorably purged for over a long period of time.

In this case, the gas supply openings of the first and second gas supply/exhaust systems are preferably arranged in the upper portion of the gravitational direction in each of the spaces, whereas gas exhaust openings are preferably arranged in the lower portion of the gravitational direction in each of the spaces. In such a case, when the density of the specific gas is lighter than air, each of the space is gradually filled from above with the specific gas. Therefore, with the specific gas supplied from the upper side of each space and exhausted from the lower side, the internal gas can be evenly replaced in the entire space with the specific gas.

With the fifth exposure apparatus in the present invention, the optical device can have a mirror having a first reflection surface and a second reflection surface and a concave mirror, and the energy beam emitted from the mask can be reflected off the first reflection surface of the mirror toward the concave mirror whereas the energy beam reflected off the concave mirror can be reflected off the second reflection surface of the mirror toward the substrate, and in a space where the mirror is arranged, the specific gas that has a higher purity level compared with that of other spaces can be purged via a predetermined gas supply/exhaust system of the first and second gas supply/exhaust systems. In such a case, the optical path within the space including the mirror of the optical device becomes a so-called double path optical path, therefore, requires a purge of the specific gas with a higher accuracy compared with other portions. This space, however, is purged with a specific gas which purity is higher than that of the gas purged in the other portions, so the purge accuracy required can be sufficiently satisfied.

In addition, for example, in the case of using an $F_2$ laser beam as the energy beam and a mirror having a reflection surface coated with metal such as aluminum as the mirror, since the reflection surface deteriorates rapidly due to the impurities within the inner space and the $F_2$ laser beam, the present invention is effective to resolve this situation and protect the mirror.

In this case, a gas supply opening of said specific gas may be arranged in the vicinity of the mirror, in the space where the mirror is arranged. In such a case, it becomes possible to increase the efficiency in protecting the mirror from deterioration due to the impurities and the energy beam.

In addition, in the lithographic process, by using the exposure apparatus in the present invention (the first to fifth exposure apparatus) the pattern of the mask can be accurately transferred onto the substrate, therefore, microdevices with high integration can be produced with high yield and its productivity improved. Accordingly, it can be said from another aspect that the present invention is a device manufacturing method using the exposure apparatus in the present invention.

DESCRIPTION OF THE PREFERRED EMBODIMENTS

<<First Embodiment>>

Figure 1:
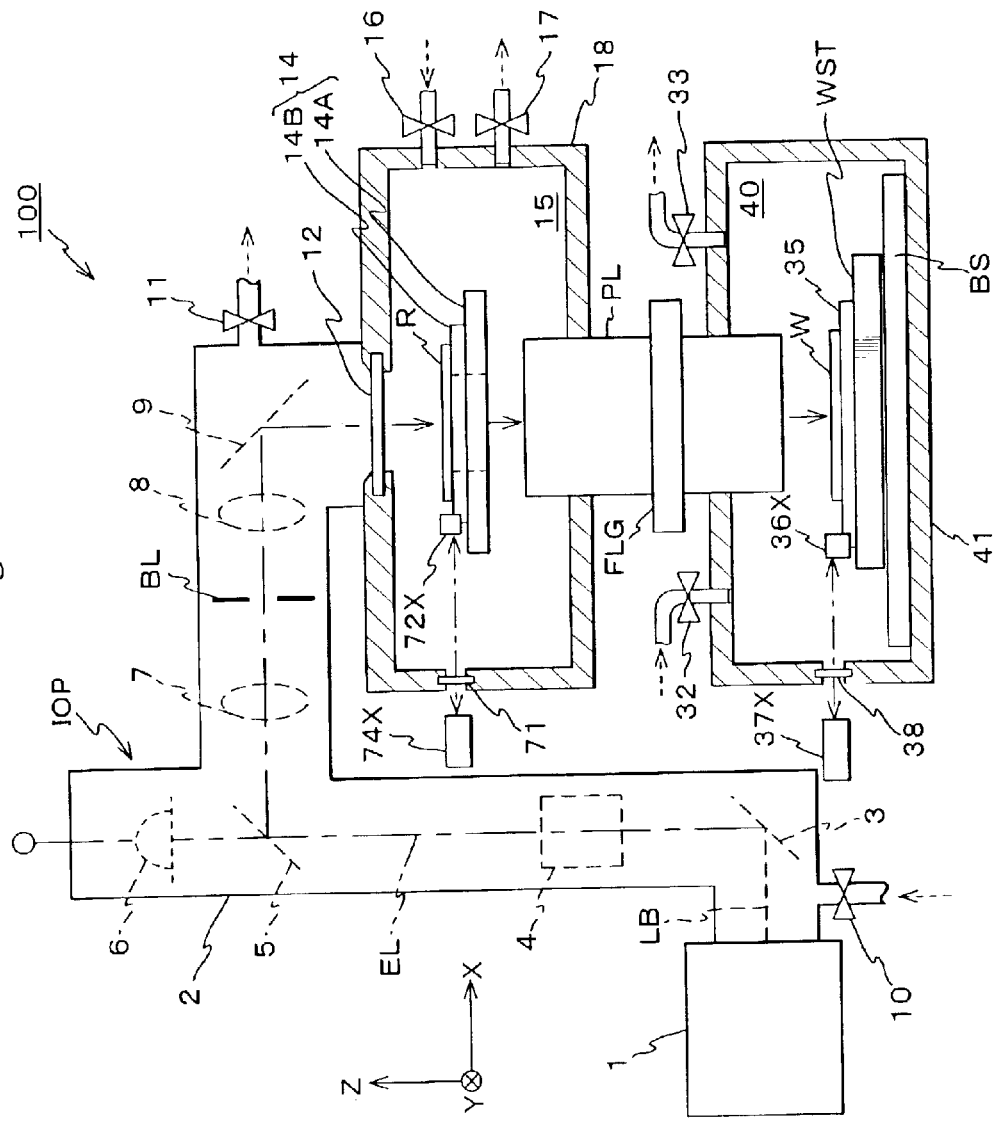
FIG. 1 shows the configuration of an exposure apparatus related to a first embodiment in the present invention.

Referring to FIGS. 1 to 5, a first embodiment of the present invention is described below. FIG. 1 schematically shows a configuration of an exposure apparatus related to the first embodiment. This exposure apparatus 100 is a projection exposure apparatus based on a step-and-scan method, which transfers a pattern of a reticle R serving as a mask onto a wafer W serving as a substrate via a projection optical system PL by irradiating an exposure illumination light EL serving as an energy beam in the vacuum ultraviolet region on the reticle R and relatively scanning the reticle R and the wafer W in a predetermined scanning direction (in this case, the X-axis direction). That is, it is a so-called scanning stepper.

The exposure apparatus 100 includes a light source 1 and an illumination optical system IOP. It also comprises parts such as an illumination system for illuminating the reticle R with the exposure illumination light (hereinafter referred to as "exposure light") EL, a reticle stage 14 serving as a mask stage for holding the reticle R, the projection optical system PL for projecting the exposure light EL emitted from the reticle R onto the wafer W, and a wafer stage WST serving as a substrate stage for holding the wafer W.

As the light source 1, a fluorine laser ($F_2$ laser) that has an output wavelength of 157 nm is used in this embodiment as an example. And, as a matter of course, other light sources that emit light in the vacuum ultraviolet region which wavelength is around 120 nm to 180 nm, such as the krypton dimer laser ($Kr_2$ laser) having an output wavelength of 146 nm, the argon dimer laser ($Ar_2$ laser) having an output wavelength of 126 nm, or the ArF laser excimer laser having an output wavelength of 193 nm may also be used as the light source 1.

The illumination optical system IOP is configured including an illumination system housing 2, and within the illumination system housing 2 a deflection mirror 3, an optical integrator 4 such as a fly-eye lens, a beam splitter 5 which reflectance is large and transmittance small, relay lenses 7 and 8, a reticle blind mechanism BL serving as an aperture stop, a deflection mirror 9, and the like are arranged in a predetermined positional relationship. In this case, the reticle blind mechanism BL is actually configured including a fixed reticle blind, which is arranged on a plane slightly defocused from a conjugate surface against the pattern surface of the reticle R and has an opening portion formed in a predetermined shape that sets the illumination area on the reticle R, and a movable reticle blind, which is arranged on the conjugate surface against the pattern surface of the reticle R in the vicinity of the fixed reticle blind and has an opening portion variable in position and width in the direction corresponding to the scanning direction. And, the opening portion of the fixed reticle blind is shaped in a slit or a rectangle that linearly extends in the Y-axis direction, which is perpendicular to the moving direction (X-axis direction) of the reticle R on scanning exposure, in the center of the circular field of the projection optical system PL.

In this case, exposure on unnecessary portions is avoided by further limiting the illumination area via the movable reticle blind at the start and the end of the scanning exposure. The movable reticle blind is under the control of a main controller 70 (not shown in FIG. 1, refer to FIG. 5) via a driving system (not shown in Figs.). Furthermore, a light amount monitor 6 consisting of a photoelectric conversion device is arranged on the transmittance optical path of the beam splitter 5.

Operation of the illumination optical system IOP is briefly described below. A beam (laser beam) LB in the vacuum ultraviolet light region, which is emitted almost horizontally from the light source 1, is bent at an angle of 90 degrees by the deflection mirror 3, and enters the optical integrator 4. The laser beam LB then is converted into an exposure light EL which intensity distribution is almost uniform. Most of the exposure light EL (for example, around 97%) is reflected off the beam splitter 5, and illuminates the fixed reticle blind that make up the reticle blind mechanism BL with uniform illuminance via the relay lens 7. And the exposure light EL that has passed through the opening portion of the fixed reticle blind then passes through the movable reticle blind and illuminates a predetermined illumination area on the reticle R (a slit or rectangular shaped illumination area extending linearly in the Y-axis direction) with uniform illuminance distribution via the relay lens 8, deflection mirror 9, and a light transmittance window 12 which will be referred to later on in this description.

Figure 5:
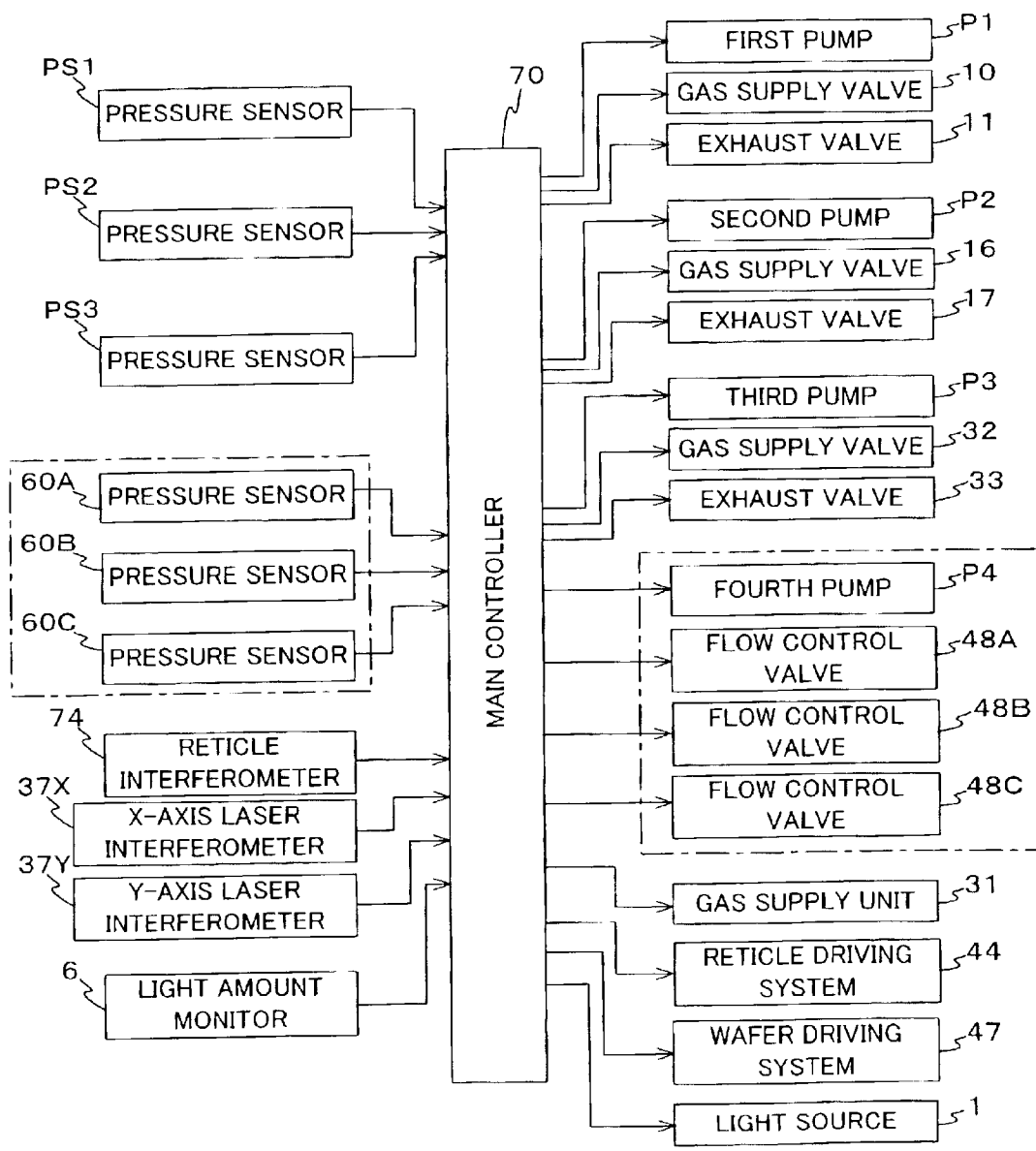
FIG. 5 is a block diagram showing the main portion of a control system for the exposure apparatus related to the first embodiment.

Meanwhile, the remaining exposure light EL that the beam splitter 5 transmits (for example, around 3%) is received by the light amount monitor 6 and photoelectrically converted into photoelectric conversion signals, which are sent to the main controller 70 (refer to FIG. 5). When the light source 1 starts emission, the main controller 70 assumes the illuminance of the image plane (surface of the wafer W) by a predetermined calculation based on the output of the light amount monitor 6. And based on the assumption results, the main controller 70 controls the exposure amount that is to be provided on each point on the wafer W.

In the case of using light having a wavelength in the vacuum ultraviolet region as the exposure light, gases such as oxygen, water vapor, and hydrocarbon that have high absorptive characteristics to light in such wavelength bandwidth (hereinafter referred to as "absorptive gas" as appropriate) need to be eliminated from the optical path. Therefore, in the embodiment, the interior of the illumination system housing 2 is filled with a specific gas which transmits light favorably in the vacuum ultraviolet region, that is, an inert gas that has a low absorptive characteristic to light in the vacuum ultraviolet region such as nitrogen, helium, argon, neon, or krypton, or a concentration of these gases, (hereinafter referred to as "low absorptive gas" as appropriate), and the pressure is set slightly higher, to be more specific, 1 to 10% higher than the atmospheric pressure. As a consequence, the concentration of the absorptive gas within the illumination system housing 2 is kept at several ppm or below. Hereinafter, the pressure that is 1 to 10% higher than the atmospheric pressure will be referred to as a "predetermined target pressure" for the sake of convenience.

More particularly, as is shown in FIG. 1, the illumination system housing 2 has a gas supply valve 10 on one end, on a side where the light source 1 is arranged, and an exhaust valve 11 is arranged on the other side of the illumination system housing 2, farthest from the gas supply valve 10. In this case, the gas supply valve 10 is connected to one end of a gas supply unit 31 (not shown in FIG. 1, refer to FIG. 5) via a gas supplying route, and the exhaust valve 11 is connected to the other end of the gas supply unit 31 via an exhausting route. In addition, although it is omitted in the drawings, filters (hereinafter generally referred to as an "air filter") such as a HEPA filter (high efficiency particulate air-filter) or a ULPA filter (ultra low penetration air-filter) are provided in the exhausting route where the exhaust valve 11 is arranged to remove particles, as well as chemical filters, which remove absorptive gas referred to earlier such as oxygen. Similarly, although it is omitted in the drawings, air filters and chemical filters are provided in the gas supplying route where the gas supply valve 10 is arranged, along with a first pump P1 (not shown in FIG. 1, refer to FIG. 5).

In this embodiment, the gas supply valve 10, the exhaust valve 11, and the first pump P1 are connected to the main controller 70, which is shown in FIG. 5. The main controller 70 operates the first pump P1 in a state where the gas supply valve 10 and the exhaust valve 11 are both open when the gas within the illumination system housing 2 needs to be exchanged (replaced), while monitoring the output of a pressure sensor PS1 (refer to FIG. 5) which is arranged within the illumination system housing 2. This allows the illumination system housing 2 to be filled with the low absorptive gas via the gas supplying route from the gas supply unit 31, and at the same time the gas within the illumination system housing 2 is exhausted via the exhaust valve 11 into the exhausting route back to the gas supply unit 31. In this manner, the gas within the illumination system housing 2 is efficiently replaced.

In this case, due to the operation of the air filters and chemical filters described above, there is almost no adverse effect on exposure even when low absorptive gas is circulated for a long period of time.

The reason for keeping the internal pressure of the low absorptive gas within the illumination system housing 2 at a predetermined target pressure as is described above, is because although it is preferable to set the internal pressure higher than the atmospheric pressure from the viewpoint of preventing the mixture (leakage) of outer air in the illumination system housing 2, if the internal pressure is set too high, the housing 2 needs to be built stronger in order to support the difference in pressure, thus increasing the weight of the housing 2. However, if the floor of the semiconductor factory where the exposure apparatus is arranged is strong enough to allow the weight of the exposure apparatus, it would be more efficient if the interior of the housing 2 is first of all decompressed to around 0.1 Pa upon gas replacement, and then filled with the low absorptive gas.

Referring back to FIG. 1, the reticle stage 14 is arranged inside a reticle chamber 15 holding a reticle R. The reticle chamber 15 is enclosed with a partition wall 18, which is tightly connected without any gap to the illumination system housing 2 and the barrel of the projection optical system PL, and the gas inside is sealed from the outside. The partition wall 18 of the reticle chamber 15 is made of material such as stainless (SUS), which is strong against degassing.

On the ceiling portion of the partition wall 18 of the reticle chamber 15, an opening is formed that is slightly smaller than the reticle R. A light transmittance window 12 is arranged in this opening portion in a state where it separates the interior space of the illumination system housing 2 and the interior space of the reticle chamber 15 where the reticle R used for exposure is arranged. Since the light transmittance window 12 is arranged on the optical path of the exposure light EL irradiated from the illumination optical system IOP onto the reticle R, it is made of crystal material such as fluorite, which has high transmittance to light in the vacuum ultraviolet region such as the exposure light.

In the case of performing gas replacement of the gas inside the illumination housing 2 after performing decompressing operations within the illumination housing 2, the fluorite may be damaged due to the pressure on the light transmittance window 12 during decompression. Therefore, the light transmittance window 12 can be protected from the pressure difference by arranging a movable metal pressure-resistant cover above the light transmittance window 12 illustrated in FIG. 1, while the decompression is performed.

The reticle stage 14 linearly drives the reticle R in large strokes on the reticle base supporting bed (not shown in Figs.) in the X-axis direction, and also has a structure capable of finely driving the reticle R in the Y-axis direction and the $\theta z$ direction (rotational direction around the Z-axis).

More particularly, the arrangement of the reticle stage 14 includes a reticle scanning stage 14A which is driven in the X-axis direction in predetermined strokes on a reticle base supporting bed (not shown in Figs.) by a reticle driving system 44 which includes a linear motor and the like, and a reticle holder 14B which holds the reticle R mounted on the reticle scanning stage 14A by suction. The reticle holder 14B is structured so that it is capable of being finely driven (including rotation) within the XY plane by the reticle driving system 44.

The interior of the reticle chamber 15 is filled with a low absorptive gas, and the pressure is set to the predetermined target pressure referred to above. This is because with exposure apparatus that uses exposure wavelength in the vacuum ultraviolet region, the vicinity of the reticle R also needs to be filled with the low absorptive gas in order to avoid the exposure light from being absorbed by absorptive gases such as oxygen. As a consequence, the concentration of the absorptive gas in the reticle chamber 15 does not exceed the extent of several ppm.

On the partition wall 18 of the reticle chamber 15, a gas supply valve 16 and an exhaust valve 17 are arranged as is shown in FIG. 1. In this case, the gas supply valve 16 is connected to one end of the gas supply unit 31 described earlier (refer to FIG. 5) via a gas supplying route, and the exhaust valve 17 is connected to the other end of the gas supply unit 31 via an exhausting route. Although it is omitted in the drawings, air filters that remove particles and chemical filters that remove absorptive gas such as oxygen are provided in the exhausting route where the exhaust valve 17 is arranged. In addition, although it is omitted in the drawings, air filters, chemical filters, and a second pump P2 (refer to FIG. 5) are provided in the gas supplying route where the gas supply valve 16 is arranged. Also, as is shown in FIG. 5, the gas supply valve 16, the exhaust valve 17, and the second pump P2 are connected to the main controller 70. And, in a manner similar to the procedures of replacing the gas within the illumination system housing 2 described earlier, the main controller 70 opens/closes the gas supply valve 16 and the exhaust valve 17, operates/stops the second pump P2, and at the same time monitors the output of a pressure sensor PS2 (not shown in FIG. 1, refer to FIG. 5) which is arranged within the reticle chamber 15, in order to effectively perform the gas replacement within the reticle chamber 15.

Again, in this case, there is almost no adverse effect on exposure even when the low absorptive gas is circulated for a long period of time, because the air filters and chemical filters provided in the gas supplying route and exhausting route removeal most all the impurities referred to above within the circulated gas.

In addition, the main controller 70 may decide the operation timing of the second pump P2 based on the output of a gas sensor, or the low absorptive gas may be supplied continuously (a flow may be created) to the reticle chamber 15.

The reason for setting the internal pressure of the reticle chamber 15 to the predetermined target pressure referred to previously is similar with the case of the illumination system housing 2. Accordingly, if the increase in weight is allowed, the method of performing decompression first when replacing the gas in the reticle chamber 15, and then injecting the low absorptive gas can be employed.

On the −X side of the side wall of the partition wall 18 of the reticle chamber 15, a light transmittance window 71 is arranged. Similarly, although it is omitted in the drawings, a transmittance window is arranged on the +Y side (in the depth of FIG. 1) of the side wall of the partition wall 18. These light transmittance windows are formed by fitting a light transmittance member, in this case an ordinary optical glass material, into the respective window portions (opening portion) made in the partition wall 18. In this case, in order to prevent gas leaking from the portion where the glass material structuring the transmittance window 71 is attached, metallic seals made of indium or copper, or a sealing by fluorinated resin, is arranged on this portion. In this case, as the fluorinated resin, it is preferable to use a material that has been heat-treated for 2 hours at a temperature of 80° C. and has gone through degassing process.

On the edge of the reticle holder 14B on the −X side, an X movable mirror 72X consisting of a planar mirror is arranged. extending in the Y-axis direction. An X-axis laser interferometer 74X is arranged almost perpendicular to the X movable mirror 72X outside the reticle chamber 15, and the measurement beam from the X-axis laser interferometer 74X is projected on the X movable mirror 72X via the light transmittance window 71. The reflected beam is photo-detected by a detector within the laser interferometer 74X via the transmittance window 71, and the position of the X movable mirror 72X, in other words, the X position of the reticle R, is detected with the position of the reference mirror within the laser interferometer 74X as a reference.

Similarly, although it is omitted in the drawings, on the edge of the reticle holder 14B on the +Y side, a Y movable mirror consisting of a planar mirror is arranged extending in the X-axis direction. And a Y-axis laser interferometer (not shown in drawings) detects the position of the Y movable mirror, in other words, the Y position of the reticle R, through the Y movable mirror in the manner similar as above. The detection values (measurement values) of the two laser interferometers described above are sent to the main controller 70, and the main controller 70 controls the position of the reticle stage 14 based on the detection values of these laser interferometers. Incidentally, although the X-axis laser interferometer 74X and the Y-axis laser interferometer are provided as the reticle laser interferometers, these are representatively shown as a reticle interferometer 74 in FIG. 5.

In this embodiment, as is referred to above, the laser interferometer, that is, a laser light source, optical members such as a prism, and a detector, is arranged outside the reticle chamber 15. Therefore, even in the event that an extremely small amount of absorptive gas may be generated from the parts making up the laser interferometer such as the detector, there is no serious effect on the exposure performed.

As the projection optical system PL, a reduction optical system that is telecentric on both sides as well as a refraction optical system consisting of a plurality of lens elements having a common optical axis in the Z-axis direction is used. The projection optical system PL has a projection magnification β of, for example, ¼ or ⅕. Therefore, when the reticle R is illuminated by the exposure light EL from the illumination optical system IOP as is described earlier, a circuit pattern formed on the reticle R is reduced and projected on shot areas of the wafer W by the projection optical system PL, thus forming and transferring the reduced image of the circuit pattern. In this embodiment, the projection optical system PL is made up of an optical device in the present invention, and details such as the structure will be described later on in the description.

The wafer stage WST is arranged inside a wafer chamber 40. The wafer chamber 40 is covered with a partition wall 41, which is tightly connected without any gap to the barrel of the projection optical system PL, and the gas inside is sealed from the outside. The partition wall 41 of the wafer chamber 40 is made of material such as stainless (SUS), which is strong against degassing.

The wafer stage WST is driven freely along the upper surface of a base BS within an XY plane in a non-contact manner by a wafer driving system 47 (not shown in FIG. 1, refer to FIG. 5). The wafer driving system 47 is made up of, for example, a linear motor, or a magnetic levitation two-dimensional linear actuator (a planar motor).

A wafer holder 35 is mounted on the wafer stage WST, and it holds the wafer W by suction.

With exposure apparatus that use exposure wavelength in the vacuum ultraviolet region, in order to avoid the exposure light from being absorbed by absorptive gases such as oxygen, gases on the optical path from the projection optical system PL to the wafer W also needs to be replaced with the low absorptive gas referred to earlier. Therefore, in this embodiment, the interior of the wafer chamber 40 is filled with the low absorptive gas and the internal pressure is set to the predetermined target pressure described earlier.

More particularly, as is shown in FIG. 1, on the partition wall 41 of the wafer chamber 40 a gas supply valve 32 and an exhaust valve 33 are arranged. The gas supply valve 32 is connected to one end of the gas supply unit 31 referred to earlier via a gas supplying route, and the exhaust valve 33 is connected to the other end of the gas supply unit 31 via an exhausting route. In this case, air filters, which remove particles, and chemical filters, which remove absorptive gas, are arranged in the exhausting route where the exhaust valve 33 is arranged. And in the gas supplying route where the gas supply valve 32 is arranged, air filters, which remove particles, chemical filters, which remove absorptive gas, and a third pump P3 (not shown in FIG. 1, refer to FIG. 5) are provided. In addition, as it is shown in FIG. 5, the gas supply valve 32, the exhaust valve 33, and the third pump P3 are connected to the main controller 70. And, in the manner similar to the procedures of replacing the gas within the illumination system housing 2 described earlier, the main controller 70 opens/closes the gas supply valve 32 and the exhaust valve 33, operates/stops the third pump P3, while monitoring the output of a pressure sensor PS3 which is arranged within the wafer chamber 40, in order to effectively perform the gas replacement within the wafer chamber 40.

Similarly, in this case, due to the air filters and chemical filters described above, almost all impurities in the gas circulated are removed, therefore, there is almost no adverse effect on exposure even when low absorptive gas is circulated for a long period of time.

Similarly, in this case, the main controller 70 may decide the operation timing of the third pump P3 based on the output of a gas sensor, or the low absorptive gas may be supplied continuously (a flow may be created) to the wafer chamber 40.

And the reason for setting the internal pressure of the wafer chamber 40 to the predetermined target pressure referred to previously, is the same with the case of the illumination system housing 2.

On the −X side of the side wall of the partition wall 41 of the wafer chamber 40, a light transmittance window 38 is arranged. Similarly, although it is omitted in the drawings, a transmittance window is arranged on the +Y side (in the depth of FIG. 1) of the side wall of the partition wall 41. These light transmittance windows are formed by fitting a light transmittance member, in this case an ordinary optical glass material, into each window portion (opening portion) made in the partition wall 41. In this case, in order to prevent gas leaking from the portion where the glass material structuring the transmittance window 38 is attached, metallic seals made of indium or copper, or a sealing by fluorinated resin, is arranged on this portion. In this case, as the fluorinated resin, it is preferable to use a material that has been heat-treated for 2 hours at a temperature of 80° C. and has gone through degassing process.

On the edge of the wafer holder 35 on the −X side, an X movable mirror 36X consisting of a planar mirror is arranged extending in the Y direction. An X-axis laser interferometer 37X is arranged almost perpendicular to the X movable mirror 36X outside the wafer chamber 40, and the measurement beam from the X-axis laser interferometer 37X is projected on the X movable mirror 36X via the light transmittance window 38. The reflected beam is photo-detected by a detector within the laser interferometer 37X via the transmittance window 38, and the position of the X movable mirror 36X, in other words, the X position of the wafer W, is detected with the position of the reference mirror within the laser interferometer 37X as a reference.

Similarly, although it is omitted in the drawings, on the edge of the wafer holder 35 on the +Y side, a Y movable mirror consisting of a planar mirror is arranged extending in the X direction. And a Y-axis laser interferometer 37Y (not shown in FIG. 1, refer to FIG. 5) detects the position of the Y movable mirror, in other words, the Y position of the wafer W, via the Y movable mirror in the manner similar as above. The detection values (measurement values) of the two laser interferometers are sent to the main controller 70, and the main controller 70 controls the position of the wafer stage WST via the wafer driving system 47 (refer to FIG. 5), while monitoring the detection values of these laser interferometers.

In this manner, in the embodiment, the laser interferometer, that is, the laser light source, optical members such as a prism, and a detector, is arranged outside the wafer chamber 40. Therefore, even in the event that an extremely small amount of absorptive gas may be generated from the parts making up the laser interferometer such as the detector, there is no serious effect on the exposure performed.

Figure 2:
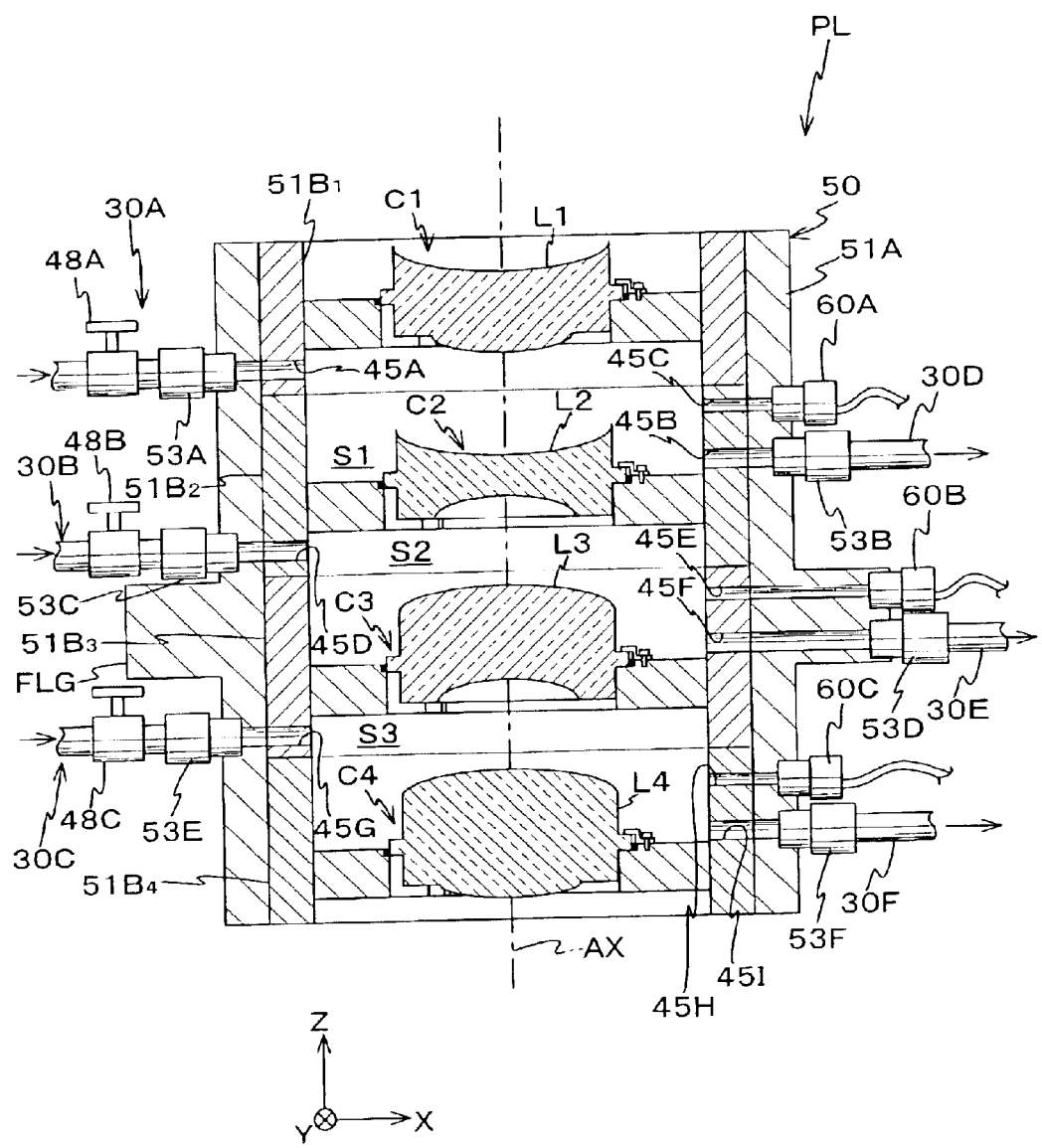
FIG. 2 is a sectional view showing the configuration of a projection optical system related to the first embodiment.

Next, a configuration of the projection optical system PL serving as an optical device is described in detail. FIG. 2 schematically shows a longitudinal sectional view of the projection optical system PL. As is shown in FIG. 2, the projection optical system PL comprises a barrel 50, and a plurality of optical member cells (four in FIG. 2), C1, C2, C3, and C4, arranged within the barrel 50 at a predetermined interval.

The barrel 50 has a double structure, consisting of a cylindrical outer barrel 51A and cylindrical inner barrels $51B_1$ to $51B_4$ that are sequentially arranged inside the outer barrel 51A along an optical axis direction AX (the Z-axis direction) from the top to the bottom and are integrated with the outer barrel 51A. The outer barrel 51A is formed with a casting or the like, and the inner barrels $51B_1$ to $51B_4$ are made of materials such as stainless (SUS) that are strong against degassing. A flange portion FLG is provided slightly below the center of the outer barrel 51A in the height direction, and the projection optical system PL is supported with supporting members (not shown in Figs.) via the flange portion FLG.

The optical member cells C1, C2, C3, and C4 are fixed on the inner circumference surface of the inner barrels $51B_1$, $51B_2$, $51B_3$, and $51B_4$, respectively. The optical member cells C1, C2, C3, and C4 comprise lenses L1, L2, L3, and L4 serving as optical members, and lens holding devices for holding the lenses L1, L2, L3, and L4 (which will be referred to later).

Figure 3:
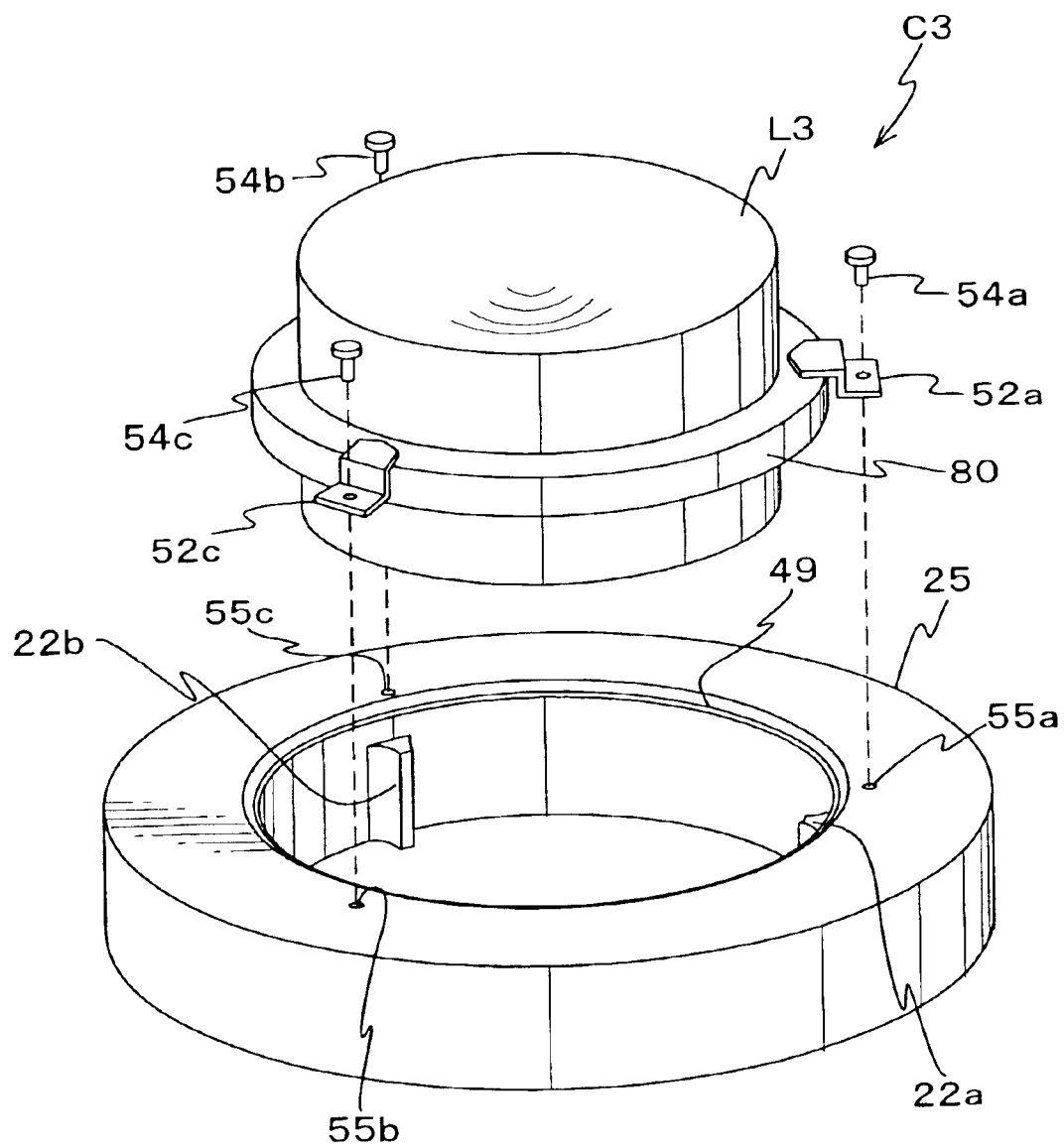
FIG. 3 is a perspective view showing a configuration of an optical member cell C3 in FIG. 2.
Figure 4A:
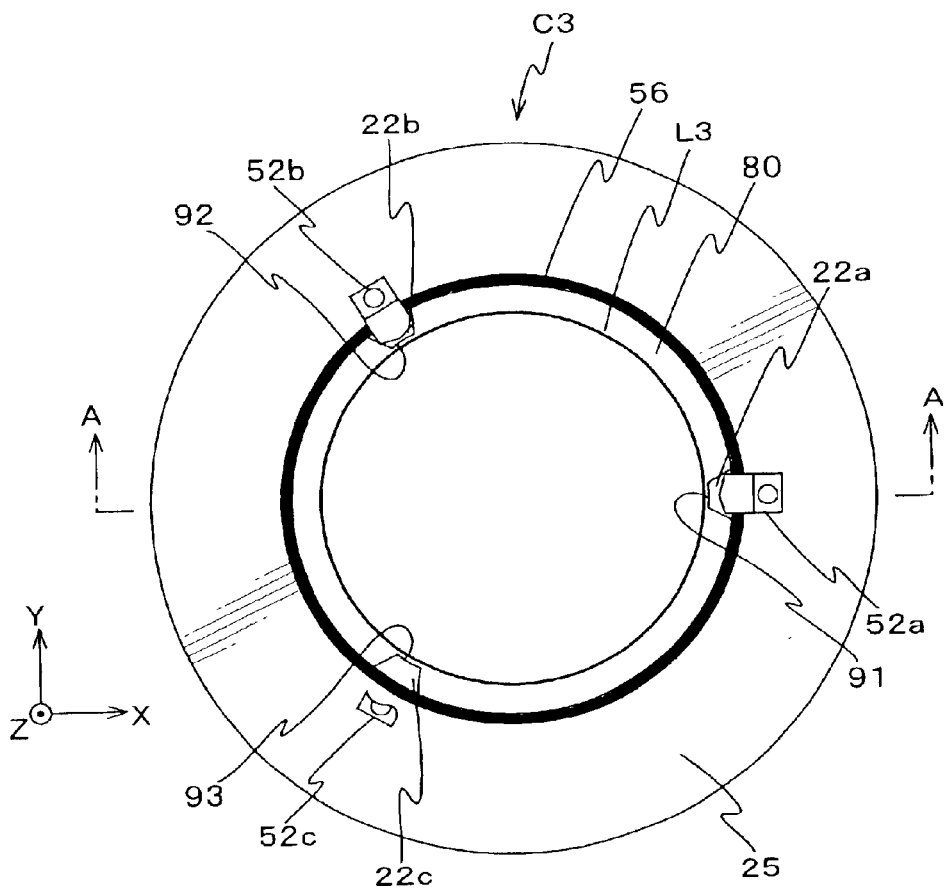
FIG. 4A shows a planar view of the optical member cell in FIG. 3.
Figure 4B:
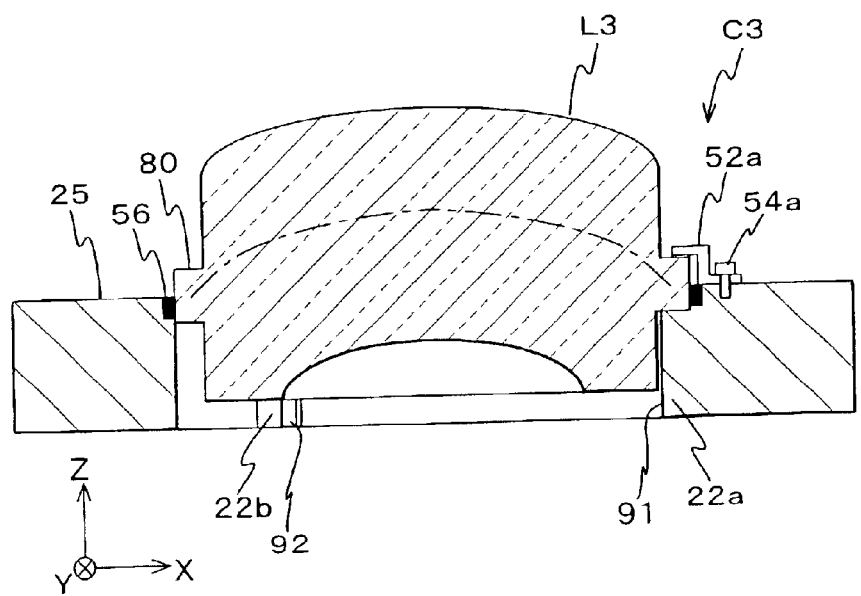
FIG. 4B shows a sectional view along a line A—A in FIG. 4A.

FIG. 3 shows a disassembled perspective view of an optical member cell C3, which structures the projection optical system PL in FIG. 2, while FIG. 4A shows a planar view of the optical member cell C3 and FIG. 4B shows a sectional view of the line A—A in FIG. 4A.

As is shown in FIGS. 3, 4A, and 4B, the optical member cell C3 comprises a lens L3, and a lens holding metallic part 25 serving as a holding member for holding the lens L3 in which the lens L3 can be inserted.

On the lens L3, a flange portion 80 is provided on the outer periphery in the center portion in the height direction. As the lens L3, lenses made of materials that have good transmittance to vacuum ultraviolet light such as the $F_2$ laser beam are used, like fluorite or fluoride crystal such as lithium fluoride. In this case, as a range which satisfies both viewpoints of the manufacturing possibility of the lens L3 and its deformation suppression, the thickness of the flange portion 80 in the optical axis direction is to be around 5 mm or around $\frac{1}{10}$ times to $\frac{2}{3}$ times the thickness of the outer periphery of portions other than the flange portion 80 of the lens L3.

The lens holding metallic part 25 is a hollow cylindrical shape, and on the inner circumference surface of the lens holding metallic part 25 spaced at an angle of approximately 120°, three supporting members 22a, 22b, and 22c, which sectional shape in the XY plane is almost a trapezoid, project inward. The upper surface of the supporting members 22a, 22b, and 22c is a supporting surface parallel to the XY plane, and the supporting surface supports the lens L3 at three points via the flange portion 80. In this case, the most interior surface of the supporting members 22a, 22b, and 22c, that is, surfaces 91, 92, and 93, which are surfaces below the flange portion 80 facing the outer periphery surface of the lens L3, are curved surfaces corresponding to the arcuated shape of the outer periphery surface of the lens L3.

In addition, portions each facing the supporting members 22a, 22b, and 22c provided on the upper surface of the flange portion 80, are pressured downward with clamping members 52a, 52b, and 52c, which are fixed to the lens holding metallic part 25 with bolts 54a, 54b, and 54c, respectively.

That is, the lens L3 is fixed to the lens holding metallic part 25, with the flange portion 80 on the outer periphery of the lens L3 clamped in between the supporting members 22a, 22b, and 22c and the clamping members 52a, 52b, and 52c. In this case, the movement of the lens L3 is restricted in three degrees of freedom in the optical axis direction AX (movement in the Z, θx, and θy directions) by the clamping force of the clamps 52a to 52c, and the movement in the directions of the remaining three degrees of freedom (movement in the X, Y, and θz directions) is restricted by the friction between the flange portion 80, the supporting members 22a, 22b, and 22c, and the clamping members 52a, 52b, and 52c.

Further, the reason for employing the structure referred to above that require support at three points is because the lens, which is the object of support, can easily be attached to the lens holding metallic part and stresses due to vibration, temperature change, posture change, and the like on the lens and the lens holding metallic part can be reduced most effectively after the lens is attached.

In addition, on the upper edge portion of the inner circumference surface of the lens holding metallic part 25, a step portion 49 is formed. And, a gap, which is made between the step portion 49 (in between the outer periphery of the flange portion 80 and the lens holding metallic part 25) when the lens holding metallic part 25 is holding the lens L3, is filled with filler 56. The filler 56 is a seal member that increases air-tightness, and besides filler member (adhesive) such as silicon, packing such as rubber or a combination of both may be used for it. By putting the filler 56 in the gap described above, it prevents the lens L3 from shifting sideways, as well as prevents the core of the lens L3 from shifting against the lens holding metallic part 25.

As the seal member for increasing air-tightness, it is preferable to use a resinous material or an adhesive which substance that causes the lens to cloud is set below a constant value. In the embodiment, for example, it is preferable to use fluorinated rubber that has gone through the degassing process (degassing process, here, for example, refers to heat-treatment for 2 hours at a temperature of 80° C.) as the resinous material, or as the adhesive, it is preferable to use an adhesive which total amount of siloxane, trimethylsilanol, ammonia, ammine complex, and hydrocarbon does not exceed 1 μkg/kg when heat-treated for an hour in 60° C. of nitrogen.

As is obvious from the description so far, in the embodiment, a lens holding device is configured serving as a holding device which holds a lens L3 serving as an optical member with a lens holding metallic part 25, clamping members 52a, 52b, and 52c, bolts 54a, 54b, and 54c, and filler 56.

As it is described above, in the embodiment, the lens L3 is clamped with the clamping members 52a, 52b, and 52c and the lens holding metallic part 25 in a state where the flange portion 80 is pressurized by the clamping members 52a, 52b, and 52c. In this case, the flange portion 80 is arranged on the outer periphery portion of the center in the direction of the optical axis AX of the lens L3, that is, arranged on the periphery of a neutral plane where there is no compressive strain and tensile strain caused by the bending of the lens L3 (described in a dotted line in FIG. 4B). This keeps the clamping force working on the flange portion 80 from affecting the other parts of the lens L3 to the utmost, and at the same time, since the neutral plane is a surface farthest from the optical surface of the lens L3, the deformation of the optical surface due to the force acting on the flange portion 80 is reduced to the minimum.

Furthermore, in this case, since the thickness of the flange portion 80 in the optical axis direction is around 5 mm or around 1/10 times to 2/3 times the thickness of the outer periphery of portions other than the flange portion 80 of the lens L3, this satisfies both of the following viewpoints; the simplicity when producing the lens L3, and suppressing the deformation of the lens L3. The thickness of the flange portion 80 is preferably to be as thin as possible, while covering a range where the weight of the lens L3 itself can be sufficiently supported and the lens L3 can also be easily made.

Accordingly, deformation occurring on the optical surface, which is on both sides of the optical axis direction of the lens L3, is reduced to a level that can almost be neglected, and thus it is possible to suppress deterioration of the optical performance to the utmost.

The other lenses, L1, L2, and L4 also have a flange portion formed like the lens L3, and are similarly held by the lens holding device configured in a similar manner to the one described above. Accordingly, deformation of the optical surface of the lenses L1, L2, and L4 is suppressed to the utmost, as it is with the lens L3.

Referring back to FIG. 2, in between the optical member cells adjacent in the direction of the optical axis AX, that is, between optical member cells C1 and C2, optical member cells C2 and C3, and optical member cells C3 and C4, sealed chambers S1, S2, and S3 are formed, respectively.

As is shown in FIG. 2, the sealed chamber S1 is divided by cylindrical inner barrels $51B_1$, $51B_2$ and optical member cells C1, C2. In FIG. 2, in a wall on the −X side of the inner barrel $51B_1$ dividing the sealed chamber S1 and also the cylindrical outer barrel 51A facing the wall, a gas supply vent 45A is formed. To this gas supply vent 45A, one end of a gas supplying route 30A is connected via a gas joint 53A, whereas the other end of the gas supplying route 30A is connected to one end of a gas supply unit 31 (not shown in FIG. 2, refer to FIG. 5) via a fourth pump P4 (also not shown in FIG. 2, refer to FIG. 5). And, in the vicinity of the gas joint 53A of the gas supplying route 30A, a flow control valve 48A is provided. The manner in which the main controller 70 controls the flow control valve 48A will be described later on in the description.

Meanwhile, in a wall on the +X side of the inner barrel $51B_2$ dividing the sealed chamber S1 and also in the cylindrical outer barrel 51A facing this position, a gas exhaust vent 45B is formed. To this gas exhaust vent 45B, one end of a gas exhausting route 30D is connected via a gas joint 53B, whereas the other end of the gas exhausting route 30D is connected to the other end of the gas supply unit 31.

In addition, at a position above the gas exhaust vent 45B in the inner barrel $51B_2$ and in the cylindrical outer barrel 51A facing the gas exhaust vent 45B, a penetrating hole 45C is formed, and on the outer side of the penetrating hole 45C a pressure sensor 60A which measures the internal pressure within the sealed chamber S1 is arranged. The output of the pressure sensor 60A is sent to the main controller 70.

As is shown in FIG. 2, the sealed chamber S2 is divided by cylindrical inner barrels $51B_2$, $51B_3$ and optical member cells C2, C3. In FIG. 2, in a wall on the −X side of the inner barrel $51B_2$ dividing the sealed chamber S2 and also in the cylindrical outer barrel 51A facing this position, a gas supply vent 45D is formed. To this gas supply vent 45D, one end of a gas supplying route 30B is connected via a gas joint 53C, whereas the other end of the gas supplying route 30B is connected to one end of the gas supply unit 31 (not shown in FIG. 2, refer to FIG. 5) via the fourth pump P4 (also not shown in FIG. 2, refer to FIG. 5). And, in the vicinity of the gas joint 53C of the gas supplying route 30B, a flow control valve 48B is provided. The manner in which the main controller 70 controls the flow control valve 48B will be described later on in the description.

Meanwhile, in a wall on the +X side of the inner barrel $51B_3$ dividing the sealed chamber S2 and also in the cylindrical outer-barrel 51A facing this position, a gas exhaust vent 45F is formed. To this gas exhaust vent 45F, one end of a gas exhausting route 30E is connected via a gas joint 53D, whereas the other end of the gas exhausting route 30E is connected to the other end of the gas supply unit 31.

Furthermore, at a position above the gas exhaust vent 45F in the inner barrel $51B_3$ and in the cylindrical outer barrel 51A facing the gas exhaust vent 45F, a penetrating hole 45E is formed, and on the outer side of the penetrating hole 45E a pressure sensor 60B which measures the internal pressure within the sealed chamber S2 is arranged. The output of the pressure sensor 60B is sent to the main controller 70.

As is shown in FIG. 2, the sealed chamber S3 is divided by cylindrical inner barrels $51B_3$, $51B_4$ and optical member cells C3, C4. In FIG. 2, in a wall on the −X side of the inner barrel $51B_3$ dividing the sealed chamber S3 and also in the cylindrical outer barrel 51A facing this position, a gas supply vent 45G is formed. To this gas supply vent 45G, one end of a gas supplying route 30C is connected via a gas joint 53E, whereas the other end of the gas supplying route 30C is connected to one end of the gas supply unit 31 (not shown in FIG. 2, refer to FIG. 5) via the fourth pump P4 (also not shown in FIG. 2, refer to FIG. 5). And, in the vicinity of the gas joint 53E of the gas supplying route 30C, a flow control valve 48C is provided. The manner in which the main controller 70 controls the flow control valve 48C will be described later on in the description.

Meanwhile, in a wall on the +X side of the inner barrel $51B_4$ dividing the sealed chamber S3 and also in the cylindrical outer barrel 51A facing this position, a gas exhaust vent 45I is formed. To this gas exhaust vent 45I, one end of a gas exhausting route 30F is connected via a gas joint 53F, whereas the other end of the gas exhausting route 30F is connected to the other end of the gas supply unit 31.

In addition, at a position above the gas exhaust vent 45I in the inner barrel $51B_4$ and in the cylindrical outer barrel 51A facing the gas exhaust vent 45I, a penetrating hole 45H is formed, and on the outer side of the penetrating hole 45H a pressure sensor 60C which measures the internal pressure within the sealed chamber S3 is arranged. The output of the pressure sensor 60C is sent to the main controller 70.

Furthermore, in the gas supplying routes 30A, 30B, and 30C, and the gas exhausting routes 30D, 30E, and 30F, air filters for removing particles (not shown in Figs.) and chemical filters for removing absorptive gas such as oxygen (also not shown in Figs.) are each provided.

FIG. 5 is a block diagram showing a main configuration of a control system for the exposure apparatus 100 related to the present embodiment. The center of the control system is the main controller 70, which consists of a microcomputer (or a workstation) configured with parts such as a CPU (center processing unit), a ROM (read only memory), and a RAM (random access memory). The main controller 70 has control over the whole apparatus. Accordingly, the main controller 70 controls the gas environment of each sealed chamber within the projection optical system PL in the following manner.

That is, the main controller 70 opens all the flow control valves 48A to 48C and operates the fourth pump P$, based on instructions from an operator when initial gas replacement is performed at the start-up of the apparatus. This allows the low absorptive gas to be provided from the gas supply unit 31 to the inside of the sealed chambers S1, S2, and S3 via the gas supplying routes 30A, 30B, and 30C, respectively, while internal gases of the sealed chambers S1, S2, and S3 are returned to the gas supply unit 31 via the gas exhausting routes 30D, 30E, and 30F, respectively. In other words, initial gas replacement of the sealed chambers S1, S2, and S3 is performed in this manner.

On such initial gas replacement, the main controller 70 monitors the measurement values of the pressure sensors 60A, 60B, and 60C at all times. And, based on the measurement values, pressure difference between the adjacent sealed chambers, (S1, S2) and (S2, S3), is obtained, and the main controller 70 suitably controls the degree of opening of the flow control valves 48A to 48C so that the pressure difference is maintained within a range set in advance. The permissible range of pressure difference, in this case, for example, may be a range where neither the lenses L2 nor L3 are dislodged. As a matter of course, the main controller 70 can control the flow control valves 48A to 48C so that the internal pressure in the sealed chambers S1, S2, and S3 are all almost even, that is, the pressure difference is almost zero.

The main controller 70 may judge the completion of the initial gas replacement in which the concentration of the absorptive gas in the gas inside the sealed chambers S1 to S3 falls under several ppm, based on a timer or the like (not shown in Figs.), or it may judge the completion based on detection values of a gas sensor (such as an oxygen concentration sensor; not shown in Figs.).

When the initial gas replacement is completed in this manner, the main controller 70 sets the degree of opening of the flow control valves 48A to 48C at a predetermined degree. And from then onward, at all times, the main controller 70 obtains the pressure difference between the adjacent sealed chambers, (S1, S2) and (S2, S3), while monitoring the output of the pressure sensors 60A, 60B, and 60C, and controls the degree of opening of the flow control valves 48A to 48C as appropriate so that the difference in pressure does not exceed the range set in advance. That is, in the embodiment, the flow control valves 48A to 48C and the main controller 70 which controls the flow control valves based on the output of the pressure sensors 60A, 60B, and 60C make up a flow control unit, and the flow control unit and the pressure sensors 60A to 60C make up a control system for controlling the low absorptive gas environment in each sealed chamber to avoid pressure difference between the adjacent sealed chambers, (S1, S2) and (S2, S3).

In this manner, the main controller 70 controls the flow control valves 48A to 48C during the operation of the fourth pump P4 and creates a continuous flow of low absorptive gas within the sealed chambers S1 to S3, as well as circulates the low absorptive gas. The low absorptive gas is circulated for a long period of time. In this case, however, there is almost no adverse effect on exposure even when the low absorptive gas is circulated for a long time, because the air filters and chemical filters provided in the gas supplying routes 30A to 30C and exhausting routes 30D to 30F remove almost all the absorptive gas in the circulated gas.

In addition, since the upper edge surface of the projection optical system PL is connected seamlessly to the reticle chamber 15 and the lower edge surface of the projection optical system PL is connected seamlessly to the wafer chamber 40, internal pressure of the reticle chamber 15 and wafer chamber 40 may also be controlled so that the lenses L1 and L4 are not floating out of its setting. This control is based on the pressure within the reticle chamber 15 measured with the pressure sensor PS2 and the pressure within the sealed chamber S1 measured with the pressure sensor 60A, and the pressure within the wafer chamber 40 measured with the pressure sensor PS3 and the pressure within the sealed chamber S3 measured with the pressure sensor 60C. This prevents the lenses L1 and L4 from being damaged or deformed, and the lenses L1 and L4 can be held in a stable manner.

Furthermore, in the case when concentration of low absorptive gas needs to differ (when a different purge accuracy is required) within the sealed chambers S1, S2, and S3 referred to above, the main controller 70 may decide to adjust the flow control valve based on not only the output of the pressure sensors but also on the output of both the pressure sensors and the gas sensors which are capable of measuring the concentration of low absorptive gas such as oxygen or ozone.

The reason for not creating a vacuum inside the barrel of the projection optical system PL is because in the case a vacuum is created, large pressure difference occurs inside and outside the barrel, therefore, the barrel will require a strong structure to withstand the pressure difference. This causes the barrel to be heavier and larger, leading to an increase in the size of the device. Again, in this case, if the increase in weight were allowed, a method of decompressing the interior of the projection optical system P1 on initial gas replacement, and then filling the interior with low absorptive gas can be employed.

Exposure operations of the exposure apparatus 100 configured in the manner described above are described next, referring to FIGS. 1 and 5. The description focuses on control operations of the main controller 70.

As a premise, various conditions for exposure are set in advance to perform scanning exposure on the shot areas on the wafer W at an appropriate exposure amount (target exposure amount). Also, preparatory operations such as reticle alignment and baseline alignment using a reticle microscope (not shown in Figs.) and an off-axis alignment sensor (also not shown in Figs.) are performed. When these are completed, fine alignment (EGA (Enhanced Global Alignment) and the like) of the wafer W using an alignment sensor is performed, and the position of a plurality of shot areas (arrangement coordinates) on the wafer W is obtained.

Preparatory operations such as the reticle alignment and the baseline alignment are disclosed in detail in, for example, Japanese Patent Laid Open No. 04-324923 and the corresponding U.S. Pat. No. 5,243,195. The EGA that follows is disclosed in detail in, for example, Japanese Patent Laid Open No. 61-44429 and the corresponding U.S. Pat. No. 4,780,617. As long as the national laws in designated states or elected states, to which this international application is applied, permit, the disclosures cited above are fully incorporated herein by reference.

When preparatory operations for exposure on the wafer W are completed in this manner, based on the alignment results, the main controller 70 moves the wafer stage WST to the starting position for scanning exposure (acceleration starting position) of a first shot (the first shot area) on the wafer W via the wafer driving system 47 while monitoring the measurement values of the X-axis laser interferometer 37X and Y-axis laser interferometer 37Y.

Then, the main controller 70 starts scanning the reticle stage 14 and the wafer stage WST in the X direction, and when the reticle stage 14 and the wafer stage WST both reach their target scanning velocity the exposure light EL begins to illuminate the pattern area of the reticle R, thus, the scanning exposure begins.

Prior to the scanning exposure, the light source 1 starts emission. The main controller 70, however, synchronously controls the movement of each blade of the movable reticle blind making up the reticle blind mechanism BL and the movement of the reticle stage 14. Therefore, the irradiation of the exposure light EL onto areas other than the pattern area is avoided, as is with the scanning steppers in general.

The main controller 70 synchronously controls the reticle stage 14 and the wafer stage WST so that especially during the scanning exposure described earlier, the movement velocity Vr of the reticle stage 14 in the X-axis direction and the movement velocity Vw of the wafer stage WST in the X-axis direction is maintained at a velocity ratio which corresponds to the projection magnification P of the projection optical system PL.

Then, different pattern areas of the reticle R are sequentially illuminated with the ultraviolet pulse light, and by completing the illumination of the entire pattern area, the scanning exposure of the first shot on the wafer W is completed. Thus, the circuit pattern formed on the reticle R is reduced and transferred onto the first shot via the projection optical system PL.

When scanning exposure on the first shot is completed in this manner, the main controller 70 steps the wafer stage WST in the X-axis and Y-axis directions so that the wafer stage WST is moved to the starting position for scanning exposure (acceleration starting position) of a second shot (the second shot area). Upon this stepping operation, the main controller 70 measures the positional deviation of the wafer stage WST in the X, Y, and $\theta z$ direction realtime, based on the measurement values of the laser interferometer 37X and 37Y on the wafer side. And based on the measurement results the main controller 70 controls the position of the wafer stage WST, so that the XY positional deviation is set at a predetermined state.

In addition, based on the deviation information of the wafer stage WST in the $\theta z$ direction, the main controller 70 rotatably controls the reticle holder 14B on the reticle stage 14 to compensate for the rotational deviation error on the wafer W side.

Then, the main controller 70 performs scanning exposure likewise as above on the second shot.

In this manner, scanning exposure of the shot area on the wafer W and stepping operations to expose the following shot area is repetitively performed, and the circuit pattern of the reticle R is sequentially transferred onto the entire shot areas subject to exposure on the wafer W.

When scanning exposure is performed on each shot area on the wafer W, since the inside of the barrel (in the sealed chambers S1 to S3) of the projection optical system PL is replaced with low absorptive gas in advance so that the optical properties can be brought to full scope, and furthermore, since the image forming characteristics of the projection optical system PL do not deteriorate with the elapse of time during scanning exposure, deterioration of the pattern transferred onto the wafer W can be avoided.

Therefore, as it is described so far, with the exposure apparatus 100 in the embodiment, since the pattern of the reticle R is transferred onto the wafer W in the manner above via a projection optical system PL which image forming characteristics are favorably maintained, the pattern of the reticle can be transferred onto the wafer with high precision for a long period of time.

In addition, since exposure is performed in a state where the optical path of the exposure light EL from the light source 1 to the surface of the wafer W is entirely replaced with low absorptive gas which absorbs little of the exposure light EL, transmittance (or reflectance) of the energy beam entering the illumination optical system IOP and the projection optical system PL can be maintained at a high level and it becomes possible to control the exposure amount at a high precision for a long period of time. Also, since vacuum ultraviolet light is used as the exposure light EL, resolution of the projection optical system PL can be improved. Accordingly, it becomes possible to accurately transfer the reticle pattern on the wafer for a long period of time.

Now, although it is not pointed out specifically in the description above, temperature adjustment is performed inside the illumination system housing 2, the reticle chamber 15, the barrel 50 of the projection optical system PL, the wafer chamber 40, and the like at the same level of accuracy as the environmental chamber (not shown in Figs.). Also, although it is not specified above, portions such as the illumination system housing 2 where the low absorptive gas is directly in contact is preferably made of material such as stainless (SUS), which is strong against degassing, likewise with the barrel 50 of the projection optical system PL, and the partition wall of the reticle chamber 15 and the wafer chamber 40. Or, the surface of the portion where the low absorptive gas is directly in contact, such as the illumination system housing 2, the reticle chamber 15, the barrel 50 of the projection optical system PL, and the wafer chamber 40, maybe coated with material such as fluorinated resin which does not generate absorptive gas such as hydrocarbon due to degassing.

Further, in the embodiment, the case has been described where a continuous flow of low absorptive gas is created within the sealed chambers S1, S2, and S3. The present invention, however, is not limited to this, and the inside of the sealed chambers S1, S2, and S3 may be maintained at a predetermined pressure by controlling the opening/closing of gas supply valves and exhaust valves in a manner similar with the case such as the illumination optical system.

<<Second Embodiment>>

A second embodiment of the present invention is described next, referring to FIG. 6. Structures and components identical or equivalent to those described in the first embodiment are designated with the same reference numerals, and the description thereabout is briefly made or is entirely omitted.

In the second embodiment, configuration of the projection optical system serving as an optical device is different from the first embodiment. Other portions are identical with the first embodiment; therefore, the following description will be made focusing on this difference.

Figure 6:
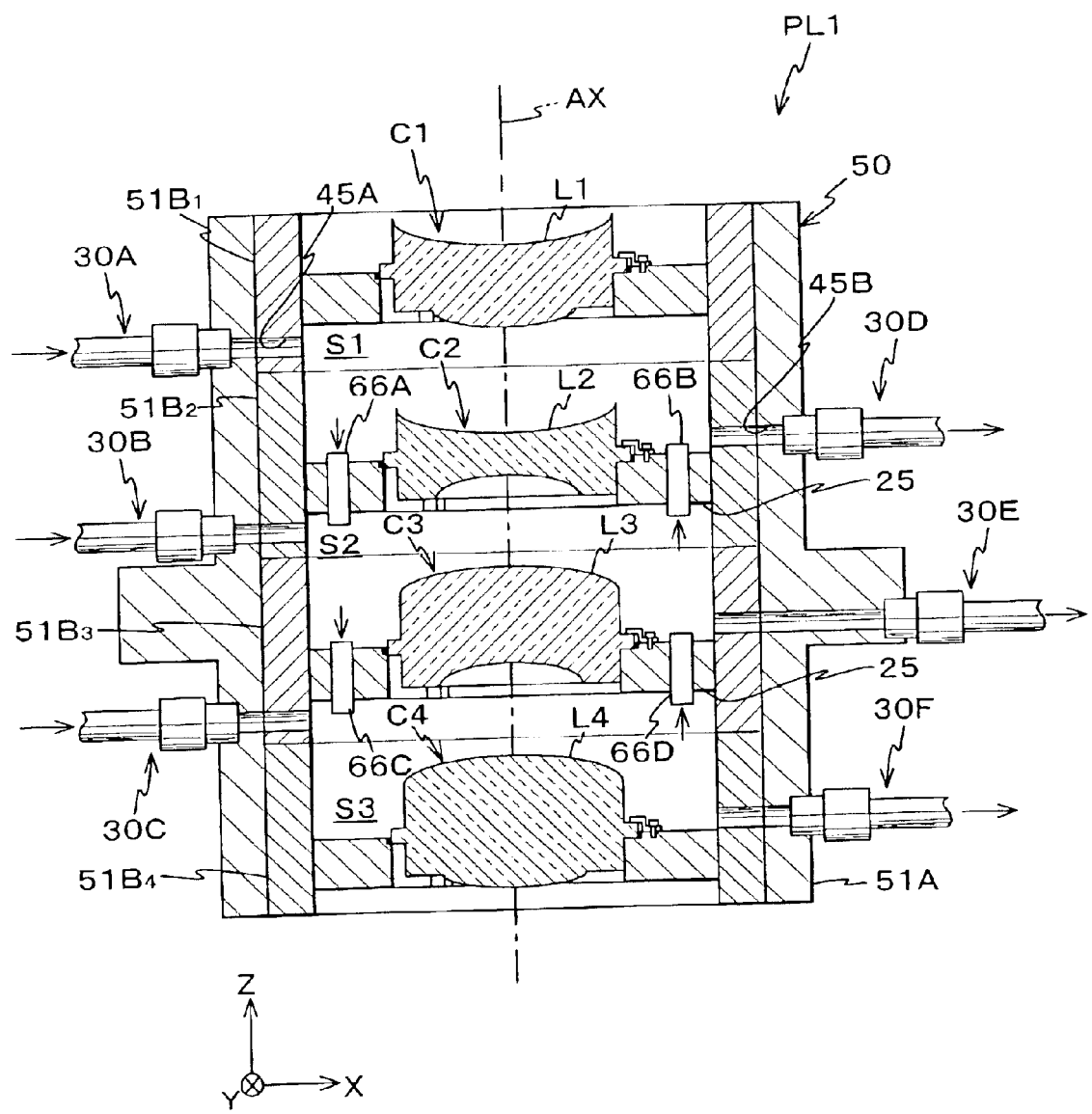
FIG. 6 is a sectional view for describing the inside of a projection optical system related to a second embodiment.

FIG. 6 schematically shows a longitudinal sectional view of a projection optical system PL1 related to the second embodiment. The projection optical system PL1 is similar to the projection optical system PL in the first embodiment except for the part that the pressure sensors 60A, 60B, and 60C and the flow control valves 48A, 48B, and 48C connected to the sealed chambers S1, S2, and S3 are removed, respectively, and that a pair of pressure adjustment valves 66A and 66B serving as pressure adjustment units are provided to the lens holding metallic part 25 configuring the partition wall between the sealed chambers S1 and S2 and a pair of pressure adjustment valves 66C and 66D are provided to the lens holding metallic part 25 configuring the partition wall between the sealed chambers S2 and S3.

In this embodiment, as the pressure adjustment valve 66A, a check valve which automatically opens the valve when the internal gas pressure of the sealed chamber S1 becomes higher than that of the sealed chamber S2, closes the valve when the pressure difference between both chambers becomes zero and continues to close the valve when the internal gas pressure of the sealed chamber S2 becomes higher than that of the sealed chamber S1 is used.

Also, as the pressure adjustment valve 66B, a check valve which automatically opens the valve when the internal gas pressure of the sealed chamber S2 becomes higher than that of the sealed chamber S1, closes the valve when the pressure difference between both chambers becomes zero and continues to close the valve when the internal gas pressure of the sealed chamber S1 becomes higher than that of the sealed chamber S2 is used.

In addition, as the pressure adjustment valve 66C, a check valve which automatically opens the valve when the internal gas pressure of the sealed chamber S2 becomes higher than that of the sealed chamber S3, closes the valve when the pressure difference between both chambers becomes zero and continues to close the valve when the internal gas pressure of the sealed chamber S3 becomes higher than that of the sealed chamber S2 is used.

And, as the pressure adjustment valve 66D, a check valve which automatically opens the valve when the internal gas pressure of the sealed chamber S3 becomes higher than that of the sealed chamber S2, closes the valve when the pressure difference between both chambers becomes zero and continues to close the valve when the internal gas pressure of the sealed chamber S2 becomes higher than that of the sealed chamber S3 is used.

Accordingly, when low absorptive gas is circulated within the sealed chambers S1, S2, and S3 in the same manner as the first embodiment, the pair of pressure adjustment valves (check valves) 66A and 66B operate so as to automatically adjust the internal pressure of the sealed chambers S1 and S2 so that there is almost no pressure difference between the sealed chambers S1 and S2, whereas the pair of pressure adjustment valves (check valves) 66C and 66D operate so as to automatically adjust the internal pressure of the sealed chambers S2 and S3 so that there is almost no pressure difference between the sealed chambers S2 and S3. That is, the pressure adjustment valves 66A to 66D automatically set the gas pressure inside the sealed chambers S1, S2, and S3 so that the pressure is maintained at the same level at all times. In this manner, a control system for controlling the low absorptive gas environment in each sealed chamber is configured by the pressure adjustment valves (check valves) 66A to 66D in this embodiment so as to prevent pressure difference from occurring in between the adjacent sealed chambers.

The remaining configuration of the projection optical system PL1, as well as the configuration of other portions is similar to the first embodiment described earlier.

With the second embodiment that has the configuration described above, the same effect as the first embodiment can be obtained without the pressure sensors and the flow control valves, therefore the flow control using these parts is not necessary. Thus, the control algorithm can be simplified.

In the second embodiment, the check valves were arranged only on the optical member cells C2 and C3 so that pressure difference did not occur in between adjacent sealed chambers. The present invention, however, is not limited to this, and it is as a matter of course possible to arrange check valves on the optical member cells C1 and C4 so that the pressure difference between the reticle chamber 15 and the wafer chamber 40 where the projection optical system is connected is automatically adjusted, and the lenses L1 and L4 are free of damage and deformation and are stably held.

<<Third Embodiment>>

A third embodiment of the present invention is described next, referring to FIG. 7. Structures and components identical or equivalent to those described in the first embodiment are designated with the same reference numerals, and the description thereabout is briefly made or is entirely omitted.

In the third embodiment, configuration of the projection optical system serving as an optical device is different from the first embodiment described earlier. Other portions are identical with the first embodiment; therefore, the following description will be made focusing on the difference.

Figure 7:
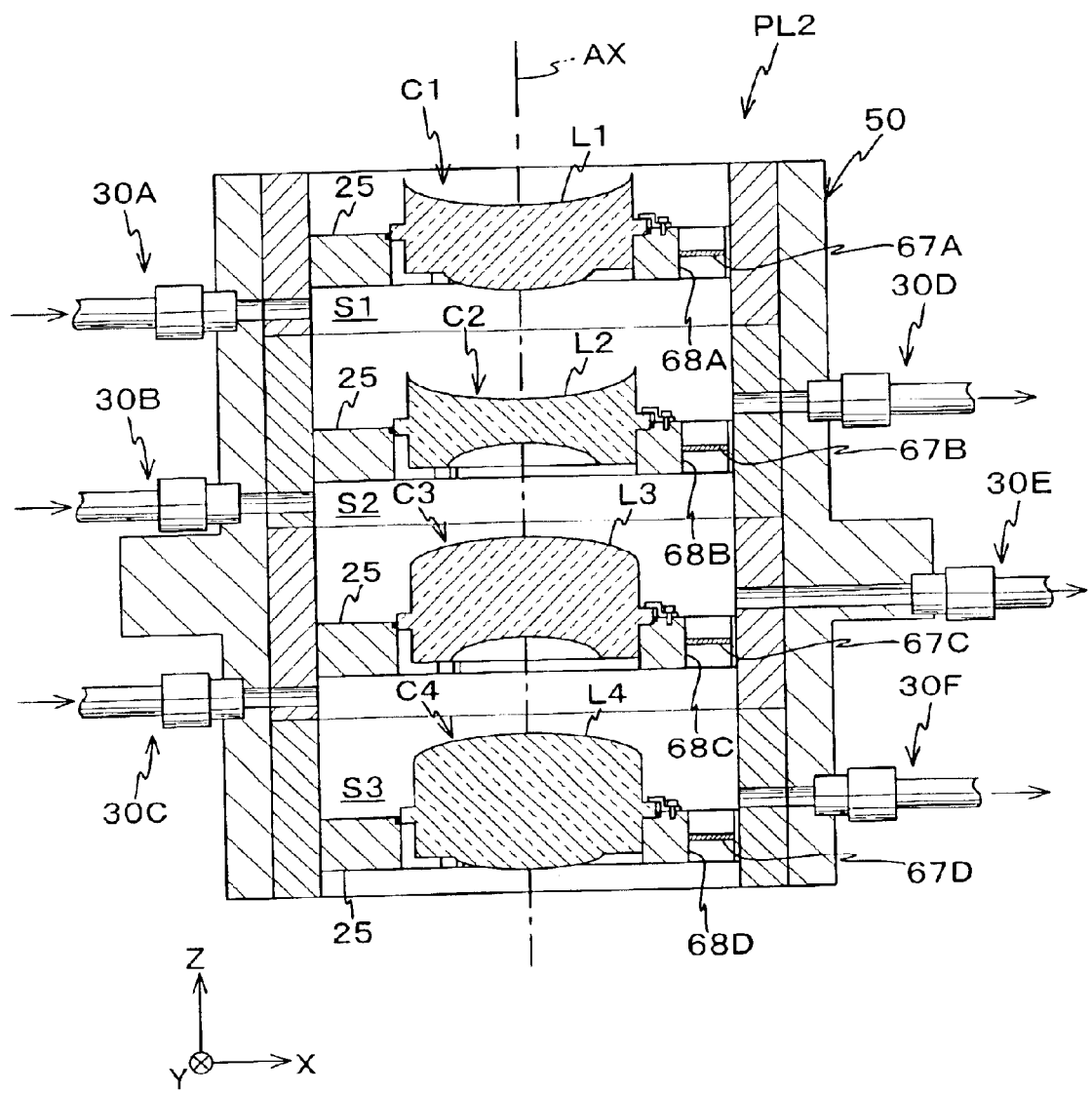
FIG. 7 is a sectional view for describing the inside of a projection optical system related to a third embodiment.

FIG. 7 schematically shows a longitudinal sectional view of a projection optical system PL2 related to the third embodiment. The projection optical system PL2 is similar to the projection optical system PL in the first embodiment except for the part that the pressure sensors and the flow control valves connected respectively to the sealed chambers are removed, and that diaphragms 67A, 67B, 67C, and 67D serving as pressure adjustment units are provided to each of the lens holding metallic part 25 configuring the optical member cells C1, C2, C3, and C4.

In the lens holding metallic part 25 configuring the optical member cells C1, C2, C3, and C4, respectively, penetrating holes 68A, 68B, 68C, and 68D which axes are in the Z-axis direction and have a circular sectional shape are arranged. In these penetrating holes 68A to 68D, diaphragms 67A, 67B, 67C, and 67D, which are made of rubber (or metal) and have flexibility, are fixed with close contact, respectively, so that gases do not pass through the penetrating holes 68A to 68D and flow in/out from the sealed chamber on the upper side to the sealed chamber on the lower side, as well as from the sealed chamber on the lower side to the sealed chamber on the upper side.

Following is a description of the operation of the diaphragms 67A, 67B, 67C, and 67D. For example, when the gas pressure inside the reticle chamber 15 becomes larger than the sealed chamber S1 between the reticle chamber 15 and the sealed chamber S1, the diaphragm 67A bends in the direction to make the volume of the reticle chamber 15 larger and the sealed chamber S1 smaller. This reduces the gas pressure inside the reticle chamber 15 and increases the gas pressure inside the sealed chamber S1, thus reducing the pressure difference between the reticle chamber 15 and the sealed chamber S1.

On the contrary, when the gas pressure inside the reticle chamber 15 becomes smaller than the sealed chamber S1, the diaphragm 67A bends in the direction opposite to the direction referred above to reduce the pressure difference between the reticle chamber 15 and the sealed chamber S1.

Accordingly, pressure difference between the reticle chamber 15 and the sealed chamber S1 is smoothly reduced by the deformation of the diaphragm 67A. In this case, if the pressure difference between the reticle chamber 15 and the sealed chamber S1 is small, the pressure difference is dissolved by the deformation of the diaphragm 67A.

The diaphragms 67B, 67C, and 67D operate likewise with the diaphragm 67A, and deform in directions, respectively, to reduce the pressure difference between the sealed chambers S1 and S2, the sealed chambers S2 and S3, and the sealed chamber S3 and the wafer chamber 40. Again, in this case, if the pressure difference between these chambers is small, the pressure difference is dissolved by the deformation of the diaphragms 67B, 67C, and 67D.

As is obvious in the description so far, in this embodiment, a control system for controlling the low absorptive gas environment in each sealed chamber is configured with the diaphragms 67A to 67D so as to prevent pressure difference from occurring in between the adjacent sealed chambers.

The remaining configuration of the projection optical system PL2, as well as the configuration of other portions is similar to the first embodiment described earlier.

With the third embodiment that has the configuration described above, the same effect as the first embodiment can be obtained without the pressure sensors and the flow control valves, therefore the flow control using these parts is not necessary. Thus, the control algorithm can be simplified.

<<Fourth Embodiment>>

A fourth embodiment of the present invention is described next, referring to FIGS. 8 to 12. Structures and components identical or equivalent to those described in the first embodiment are designated with the same reference numerals, and the description thereabout is briefly made or is entirely omitted.

With the exposure apparatus related to the fourth embodiment, the projection optical system serving as an optical device is configured differently from the first embodiment described earlier. Other portions are identical with the first embodiment; therefore, the following description will be made focusing on this difference.

Figure 8:
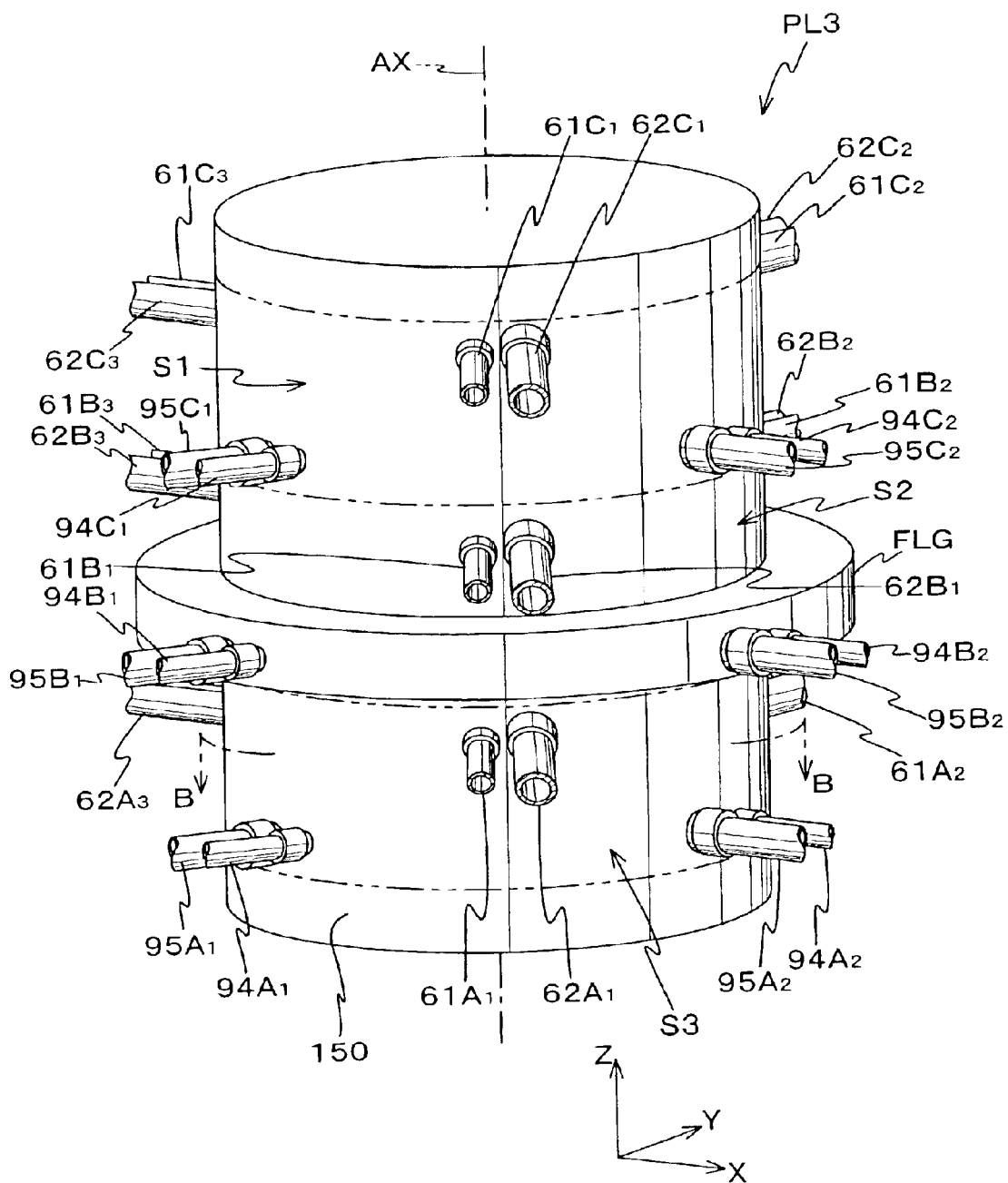
FIG. 8 is an overall perspective view showing a projection optical system related to a fourth embodiment.
Figure 9:
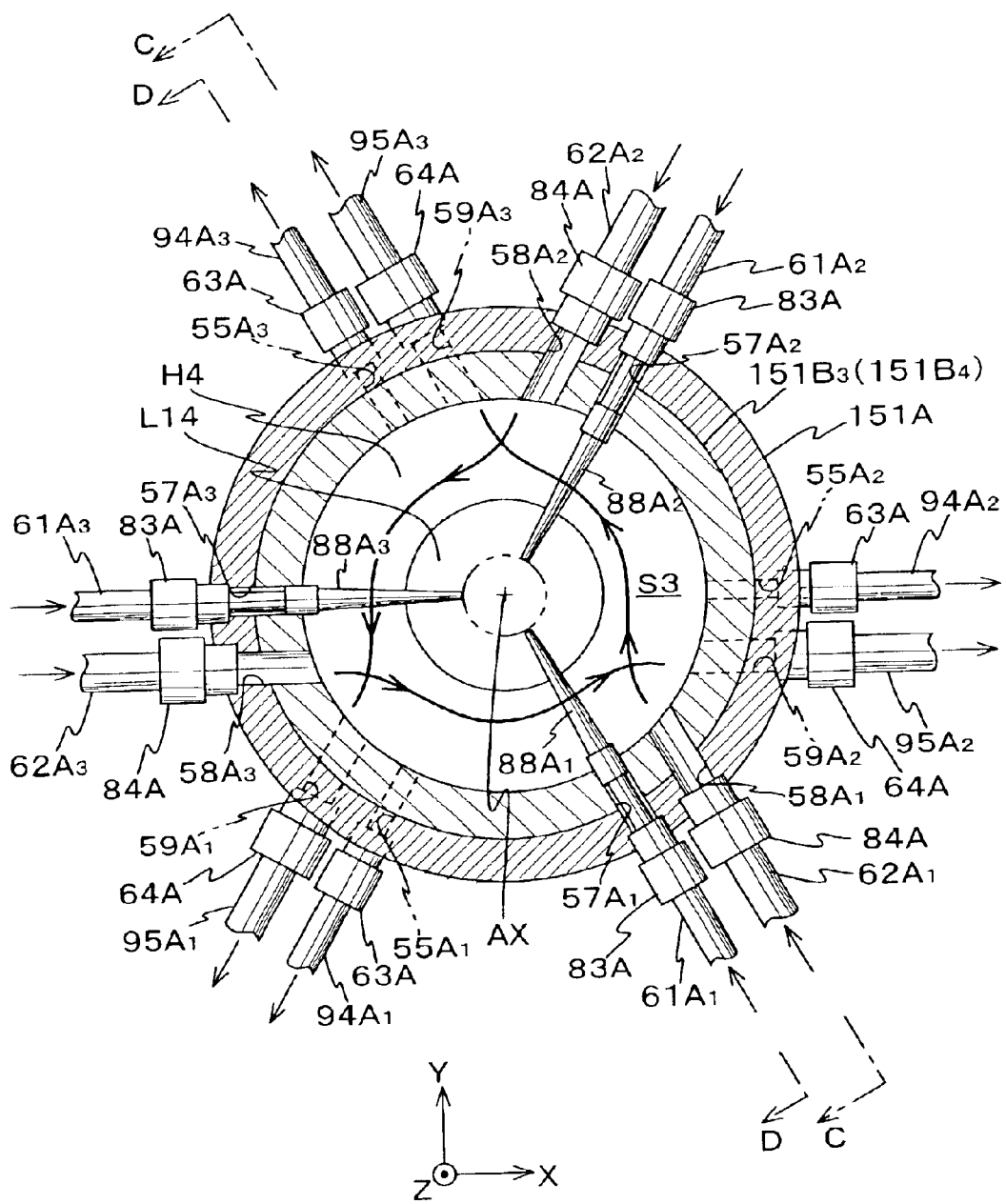
FIG. 9 is a transverse sectional view of the projection optical system related to the fourth embodiment along a line B—B in FIG. 8.
Figure 10:
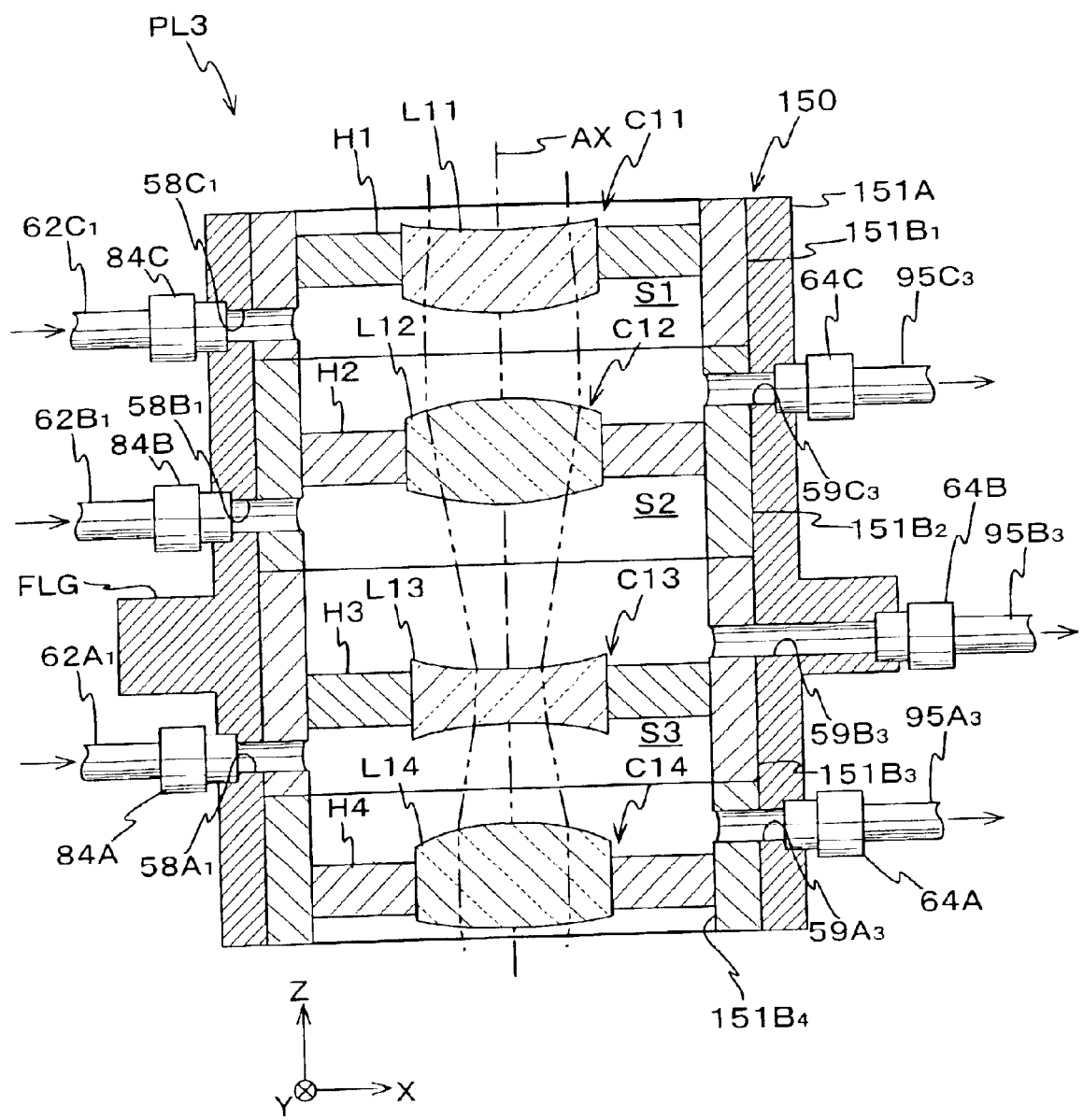
FIG. 10 is an edge surface view of the projection optical system related to the fourth embodiment sectioned along a line C—C in FIG. 9.
Figure 11:
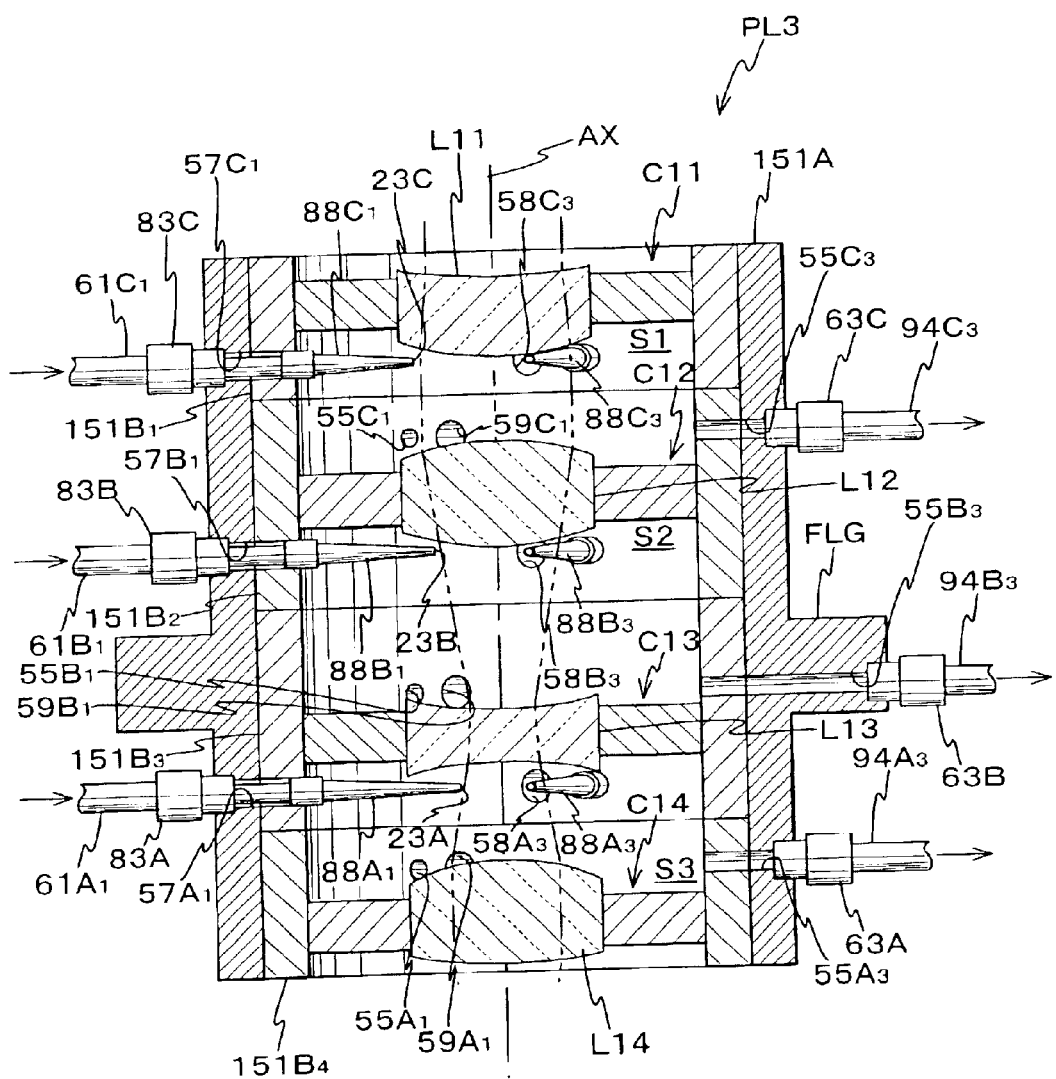
FIG. 11 is a sectional view of the projection optical system related to the fourth embodiment along a line D—D in FIG. 9.

FIG. 8 schematically shows a perspective view of a projection optical system PL3 related to the fourth embodiment, and FIG. 9 shows across-sectional view of the projection optical system PL3 in the vicinity of the line B—B in FIG. 8. FIG. 10 also shows an end view of the sectioned part of the projection optical system PL3 sectioned along the line C—C in FIG. 9, whereas FIG. 11 shows a sectional view of the projection optical system PL3 along the line D—D in FIG. 9. In FIGS. 9 to 11, however, for the sake of convenience and for a better understanding of the configuration visually, only the barrel and its inner configuration of the projection optical system PL3 are shown in sectional views or end views of the sectioned part, and other parts such as piping systems are shown in external views.

As it is obvious when referring comprehensively to the FIGS. 8 to 11, the projection optical system PL3 comprises a cylindrical-shaped barrel 150, and a plurality of optical member cells C11, C12, C13, and C14 (in FIG. 8, however, only the positions of where the optical member cells are arranged are shown in a double dotted line; refer to FIG. 10 for details) arranged sequentially from the top to the bottom within the barrel 150 along an optical axis AX (the Z-axis direction), forming sealed chambers S1, S2, and S3 which serve as a plurality of inner space inside the barrel 150, and the like.

As is shown in FIG. 10, the barrel 150 has a double structure, consisting of a cylindrical outer barrel 151A and cylindrical inner barrels $151B_1$ to $151B_4$ that are sequentially arranged inside the outer barrel 151A along an optical axis direction AX (the Z-axis direction) from the top to the bottom and are integrated with the outer barrel 151A. The outer barrel 151A is formed with a casting or the like, and the inner barrels $151B_1$ to $151B_4$ are made of materials such as stainless (SUS) that are strong against degassing. A flange portion FLG is provided slightly below the center of the outer barrel 151A in the height direction, and the projection optical system PL3 is supported with supporting members (not shown in Figs.) via the flange portion FLG.

The optical member cells C11, C12, C13, and C14 are fixed on the inner circumference surface of the inner barrels $151B_1$, $151B_2$, $151B_3$, and $151B_4$, respectively. These optical member cells C11, C12, C13, and C14 comprise lenses L11, L12, L13, and L14 serving as optical elements, and lens holding mechanisms H1, H2, H3, and H4 for holding the lenses L11, L12, L13, and L14, respectively.

As the lenses L11 to L14, lenses made of materials that have good transmittance to vacuum ultraviolet light such as the $F_2$ laser beam are used, like fluorite or fluoride crystal such as lithium fluoride. And the lenses L11, L12, L13, and L14 are each held in close contact by corresponding lens holding mechanisms H1, H2, H3, and H4 so that no gap exists between the lens holding mechanisms H1, H2, H3, and H4. In addition, the lens holding mechanisms H1, H2, H3, and H4 are each fixed in close contact on the inner circumference surface of the inner barrels $151B_1$, $151B_2$, $151B_3$, and $151B_4$.

With such arrangements, in between the adjacent optical member cells in the optical axis direction AX, that is, in between the optical member cells C11 and C12, the optical member cells C12 and C13, and the optical member cells C13 and 14, sealed chambers S1, S2, and S3 are formed, respectively, inside the optical projection system PL3, which serve as inner spaces in a sealed state from the outside.

More particularly, as is shown in FIG. 10, the sealed chamber S3 is divided by the inner barrels $151B_3$ and $151B_4$, and the optical member cells C13 and C14. As is shown in FIG. 9, three penetrating holes $57A_1$, $57A_2$, and $57A_3$ having a predetermined diameter d (d, for example, is around 6.35 mm) are formed in the inner barrel $151B_3$ and the outer barrel 151A located outside the inner barrel $151B_3$, extending in radial directions at a predetermined length at an angle of around 120 degrees with the optical axis AX as the center. In addition, in the area close to these penetrating holes $57A_1$, $57A_2$, and $57A_3$, penetrating holes $58A_1$, $58A_2$, and $58A_3$ that have a predetermined diameter D (D, for example, is around 12.7 mm) are formed almost in parallel, respectively.

In this case, an end of gas supply piping $62A_1$, $62A_2$, and $62A_3$ is connected to the penetrating holes $58A_1$, $58A_2$, and $58A_3$, respectively, via a gas joint 84A from the outer portion side of the barrel 150. In this case, the penetrating holes $58A_1$, $58A_2$, and $58A_3$ make up a first supply opening that serves as a supply opening, and the penetrating holes $58A_1$, $58A_2$, and $58A_3$ and the gas supply piping $62A_1$, $62A_2$, and $62A_3$ each connected to the penetrating holes $58A_1$, $58A_2$, and $58A_3$ make up a first supplying route, respectively. Accordingly, hereinafter in this description, the penetrating holes $58A_1$, $58A_2$, and $58A_3$ to be referred to as supply openings $58A_1$, $58A_2$, and $58A_3$.

In each of the penetrating holes $57A_1$, $57A_2$, and $57A_3$, base end portions of convergent nozzles (hereinafter referred to as a "nozzle") $88A_1$, $88A_2$, and $88A_3$ are inserted, respectively. To the base end side of the nozzles $88A_1$, $88A_2$, and $88A_3$, gas supply piping $61A_1$, $61A_2$, and $61A_3$ are connected via a gas joint 83A, respectively. That is, in this embodiment, the nozzles $88A_1$, $88A_2$, and $8BA_3$ and gas supply piping $61A_1$, $61A_2$, and $61A_3$ make up a second supplying route, respectively.

As is shown in FIG. 11, a supply opening 23A consisting of a circular opening with a small diameter, which serves as a second supply opening, is formed on the tip surface of the nozzle $88A_1$. The supply opening 23A is arranged in the vicinity of the optical path of the exposure light EL (on the optical path of the effective beam) in between the space between the lenses L13 and L14. The remaining nozzles $88A_2$ and $88A_3$ also have an identical structure, and is also identically arranged in the vicinity of the optical path of the exposure light EL (on the optical path of the effective beam) in between the space between the lenses L13 and L14.

Figure 12:
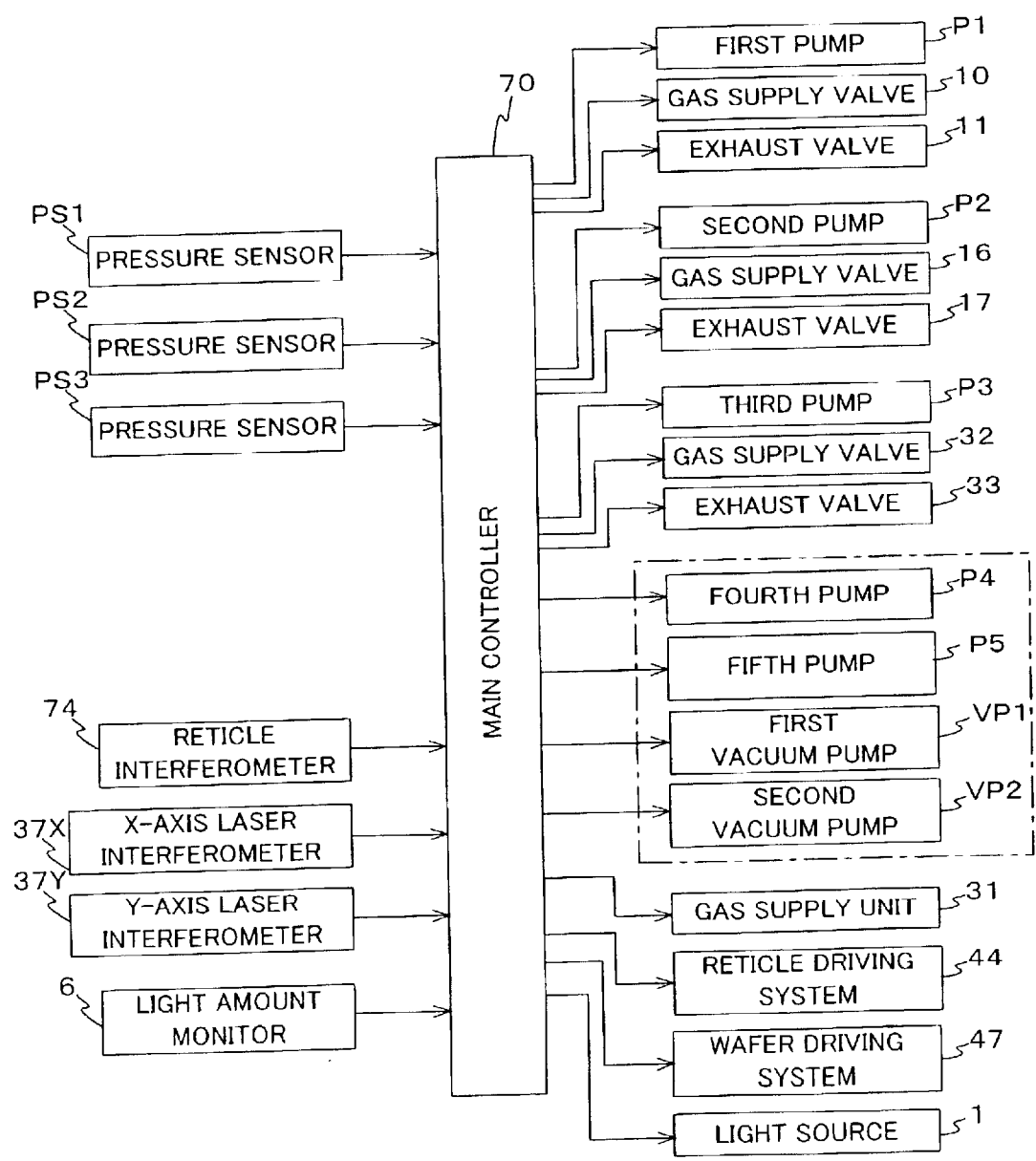
FIG. 12 is a block diagram showing the main portion of a control system for the exposure apparatus related to the fourth embodiment.

The other end of each of the gas supply piping $61A_1$, $61A_2$, and $61A_3$ are connected to one end of a gas supply unit 31 (not shown in FIG. 9, refer to FIG. 12) via a fourth pump P4 (also not shown in FIG. 9, refer to FIG. 12). Similarly, the other end of each of the gas supply piping $62A_1$, $62A_2$, and $62A_3$ are connected to one end of the gas supply unit 31 (not shown in FIG. 9, refer to FIG. 12) via a fifth pump P5 (also not shown in FIG. 9, refer to FIG. 12).

Meanwhile, a plurality of gas exhaust vents are formed in the inner barrel $151B_4$ dividing the sealed chamber S3 and also in the cylindrical outer barrel 151A located on the outside of the inner barrel $151B_4$, the vents being two types that have different diameters. More particularly, as is shown in FIG. 9, in the cylindrical outer barrel 151A and the inner barrel $151B_4$, three gas exhaust vents $55A_1$, $55A_2$, and $55A_3$ that have a diameter e (e, for example, is around 6 mm) are respectively formed, spaced 120 degrees apart with the optical axis AX as the center and at positions where the XY positions are point symmetry with respect to the penetrating holes $57A_1$, $57A_2$, and $57A_3$ and the optical axis AX. In addition, in the area close to these gas exhaust vents $55A_1$ to $55A_3$, gas exhaust vents $59A_1$, $59A_2$, and $59A_3$ that have a diameter D (D, for example, is around 12.7 mm) are formed almost in parallel, respectively.

Furthermore, an end of gas exhaust piping $94A_1$, $94A_2$, and $94A_3$ that have a diameter d are each connected to the gas exhaust vents $55A_1$, $55A_2$, and $55A_3$, respectively, via a gas joint 63A. The other end of the gas exhaust piping $94A_1$ to $94A_3$ are each connected to the other end of the gas supply unit 31 via a first vacuum pump VP1 (not shown in FIG. 9, refer to FIG. 12).

Meanwhile, an end of gas exhaust piping $95A_1$, $95A_2$, and $95A_3$ that have a diameter D are each connected to the gas exhaust vents $59A_1$, $59A_2$, and $59A_3$, respectively, via a gas joint 64A. The other end of the gas exhaust piping $95A_1$ to $95A_3$ are each connected to the other end of the gas supply unit 31 via a second vacuum pump VP2 (not shown in FIG. 9, refer to FIG. 12).

That is, in this embodiment, a gas exhausting route is made up with the gas exhaust vents $55A_1$ to $55A_3$ and the gas exhaust piping $94A_1$ to $94A_3$, and the gas exhaust vents $59A_1$ to $59A_3$ and the gas exhaust piping $95A_1$ to $95A_3$.

The sealed chamber S2 is divided by the inner barrels $151B_2$ and $151B_3$, and the optical member cells C12 and C13, as is shown in FIG. 10. As can be easily imagined from FIGS. 10 and 11, in the inner barrels $151B_2$ and $151B_3$ and the outer barrel 151A located outside the inner barrels $151B_2$ and $151B_3$, three penetrating holes $57B_1$ to $57B_3$ having a diameter d (however, penetrating holes $57B_2$ and $57B_3$ are omitted in the drawings), three supply openings $58B_1$ to $58B_3$ that have a diameter D serving as a first supply opening (however, the supply opening $58B_2$ is omitted in the drawings), three gas exhaust vents $55B_1$ to $55B_3$ having a diameter e (however, the gas exhaust vent $55B_2$ is omitted in the drawings), and three gas exhaust vents $59B_1$ to $59B_3$ having a diameter D (however, the gas exhaust vent $59B_2$ is omitted in the drawings) are formed in an arrangement identical to the sealed chamber S3 previously described.

As is shown in FIG. 11, in each of the penetrating holes $57B_1$, $57B_2$, and $57B_3$, the edge portion opposite to the tip portion of nozzles $88B_1$, $88B_2$, and $88B_3$ are inserted, respectively (however, the nozzle $88B_2$ is omitted in FIG. 11). To the opposite side of each tip portion of the nozzles $88B_1$, $88B_2$, and $88B_3$, gas supply piping $61B_1$, $61B_2$, and $61B_3$, which are shown in FIG. 8, are connected via a gas joint 83B, respectively. That is, in this embodiment, the nozzles $88B_1$ to $88B_3$ and gas supply piping $61B_1$ to $61B_3$ make up a second supplying route, respectively.

As is shown in FIG. 11, a supply opening 23B consisting of a circular opening with a small diameter, which serves as a second supply opening, is formed on the tip surface of the nozzle $88B_1$. The supply opening 23B is arranged in the vicinity of the optical path of the exposure light EL (on the optical path of the effective beam) in between the space between the lenses L12 and L13. The remaining nozzles $88B_2$ and $88B_3$ also have an identical structure, and the supply openings are each identically arranged in the vicinity of the optical path of the exposure light EL (on the optical path of the effective beam) in between the space between the lenses L12 and L13. In this case, since the nozzles $88B_1$ to $88B_3$ are arranged away from the pupil surface of the projection optical system PL3, the sectional shape of the optical path of the exposure light EL is not circular. Therefore, the tip surface of the nozzles $88B_1$ to $88B_3$ is arranged at a position where the supply opening 23B of each nozzle is set as close as possible to the optical path, in correspondence with the sectional shape of the optical path.

An end of gas supply piping $62B_1$, $62B_2$, and $62B_3$ are each connected to the three supply openings $58B_1$ to $58B_3$, as is shown in FIG. 8, respectively, via a gas joint 84B from the outer portion side of the barrel 150. In this case, the supply openings $58B_1$, $58B_2$, and $58B_3$ and the gas supply piping $62B_1$, $62B_2$, and $62B_3$ each connected to the supply openings $58B_1$, $58B_2$, and $58B_3$ make up a first supplying route, respectively.

The other end of each of the gas supply piping $61B_1$, $61B_2$, and $61B_3$ are connected to one end of a gas supply unit 31 (not shown in FIG. 8, refer to FIG. 12) via a fourth pump P4 (also not shown in FIG. 8, refer to FIG. 12). Similarly, the other end of each of the gas supply piping $62B_1$, $62B_2$, and $62B_3$ are connected to one end of the gas supply unit 31 (not shown in FIG. 8, refer to FIG. 12) via a fifth pump P5 (also not shown in FIG. 8, refer to FIG. 12).

In addition, an end of gas exhaust piping $94B_1$, $94B_2$, and $94B_3$ that have a diameter d and are shown in FIG. 8 (however, the gas exhaust piping $94B_3$ is not shown in the drawings) are each connected to the gas exhaust vents $55B_1$, $55B_2$, and $55B_3$, respectively, via a gas joint 63B. The other end of the gas exhaust piping $94B_1$ to $94B_3$ are each connected to the other end of the gas supply unit 31 via a first vacuum pump VP1 (not shown in FIG. 8, refer to FIG. 12).

Meanwhile, an end of gas exhaust piping $95B_1$, $95B_2$, and $95B_3$ that have a diameter D and are shown in FIG. 8 (however, the gas exhaust piping $95B_3$ is not shown in the drawings) are each connected to the gas exhaust vents $59B_1$, $59B_2$, and $59B_3$, respectively, via a gas joint 64B. The other end of the gas exhaust piping $95B_1$ to $95B_3$ are each connected to the other end of the gas supply unit 31 via a second vacuum pump VP2 (not shown in FIG. 8, refer to FIG. 12).

The sealed chamber S1 is divided by the inner barrels $151B_1$ and $151B_2$, and the optical member cells C11 and C12, as is shown in FIG. 10. As can be easily imagined from FIGS. 10 and 11, in the inner barrels $151B_1$ and $151B_2$ and the outer barrel 151A located outside the inner barrels $151B_1$ and $151B_2$, three penetrating holes $57C_1$ to $57C_3$ having a diameter d (however, penetrating holes $57C_2$ and $57C_3$ are omitted in the drawings), three supply openings $58C_1$ to $58C_3$ that have a diameter D serving as a first supply opening (however, the supply opening $58C_2$ is omitted in the drawings), three gas exhaust vents $55C_1$ to $55C_3$ having a diameter e (however, the gas exhaust vent $55C_2$ is omitted in the drawings), and three gas exhaust vents $59C_1$ to $59C_3$ having a diameter D (however, the gas exhaust vent $59C_2$ is omitted in the drawings) are formed in an arrangement identical to the sealed chamber S3 previously described.

As is shown in FIG. 11, in each of the penetrating holes $57C_1$, $57C_2$, and $57C_3$, the edge portion opposite to the tip portion of nozzles $88C_1$, $88C_2$, and $88C_3$ are inserted, respectively (however, the nozzle $88C_2$ is omitted in FIG. 11). To each of the base end side of the nozzles $88C_1$, $88C_2$, and $88C_3$, gas supply piping $61C_1$, $61C_2$, and $61C_3$, which are shown in FIG. 8, are connected via a gas joint 83C, respectively. That is, in this embodiment, the nozzles $88C_1$ to $88C_3$ and gas supply piping $61C_1$ to $61C_3$ make up a second supplying route, respectively.

As is shown in FIG. 11, a supply opening 23C consisting of a circular opening with a small diameter, which serves as a second supply opening, is formed on the tip surface of the nozzle $88C_1$. The supply opening 23C is arranged in the vicinity of the optical path of the exposure light EL (on the optical path of the effective beam) in between the space between the lenses L11 and L12. The remaining nozzles $88C_2$ and $88C_3$ also have an identical structure, and the supply openings are each identically arranged in the vicinity of the optical path of the exposure light EL (on the optical path of the effective beam) in between the space between the lenses L11 and L12. In this case, however, since the nozzles $88C_1$ to $88C_3$ are arranged away from the pupil surface of the projection optical system PL3, the sectional shape of the optical path of the exposure light EL is not circular. Therefore, the tip surface of the nozzles $88C_1$ to $88C_3$ is arranged at a position where the supply opening 23C of each nozzle is set as close as possible to the optical path, in correspondence with the sectional shape of the optical path.

An end of gas supply piping $62C_1$, $62C_2$, and $62C_3$ are each connected to the three supply openings $58C_1$ to $58C_3$ as is shown in FIG. 8, respectively, via a gas joint 84C from the outer portion side of the barrel 150. In this case, the supply openings $58C_1$, $58C_2$, and $58C_3$ and the gas supply piping $62C_1$, $62C_2$, and $62C_3$ each connected to the supply openings $58C_1$, $58C_2$, and $58C_3$ make up a first supplying route, respectively.

The other end of each of the gas supply piping $61C_1$, $61C_2$, and $61C_3$ are connected to one end of a gas supply unit 31 (not shown in FIG. 8, refer to FIG. 12) via a fourth pump P4 (also not shown in FIG. 8, refer to FIG. 12). Similarly, the other end of each of the gas supply piping $62C_1$, $62C_2$, and $62C_3$ are connected to one end of the gas supply unit 31 (not shown in FIG. 8, refer to FIG. 12) via a fifth pump PS (also not shown in FIG. 8, refer to FIG. 12).

In addition, an end of gas exhaust piping $94C_1$, $94C_2$, and $94C_3$ that have a diameter d and are shown in FIG. 8 (however, the gas exhaust piping $94C_3$ is not shown in the drawings) are each connected to the gas exhaust vents $55C_1$, $55C_2$, and $55C_3$, respectively, via a gas joint 63C. The other end of the gas exhaust piping $94B_1$ to $94B_3$ are each connected to the other end of the gas supply unit 31 via a first vacuum pump VP1 (not shown in FIG. 8, refer to FIG. 12).

Meanwhile, an end of gas exhaust piping $95C_1$, $95C_2$, and $95C_3$ that have a diameter D and are shown in FIG. 8 are each connected to the gas exhaust vents $59C_1$, $59C_2$, and $59C_3$, respectively, via a gas joint 64C. The other end of the gas exhaust piping $95C_1$ to $95C_3$ are each connected to the other end of the gas supply unit 31 via a second vacuum pump VP2 (not shown in FIG. 8, refer to FIG. 12).

In each of the gas supply piping $61A_1$ to $61A_3$, $61B_1$ to $61B_3$, $61C_1$ to $61C_3$, $62A_1$ to $62A_3$, $62B_1$ to $62B_3$, and $62C_1$ to $62C_3$, and the gas exhaust piping $94A_1$ to $94A_3$, $94B_1$ to $94B_3$, $94C_1$ to $94C_3$, $95A_1$ to $95A_3$, $95B_1$ to $95B_3$, and $95C_1$ to $95C_3$, air filters for removing particles (not shown in Figs.) and chemical filters for removing absorptive gas such as oxygen (also not shown in Figs.) are provided.

FIG. 12 is a block diagram showing a main configuration of a control system of an exposure apparatus related to the fourth embodiment. Similar to the control system described in the first embodiment, this control system is also configured with a main controller 70 playing the main role and serving as a control unit, consisting of a microcomputer (or a workstation). The main controller 70 has control over the whole apparatus. Furthermore, the main controller 70 controls the gas environment of each sealed chamber within the projection optical system PL3 in the following manner.

That is, when the main controller 70 supplies low absorptive gas (specific gas) to the sealed chambers S1 to S3 in the case gases within the sealed chambers S1 to S3 contain much absorptive gas such as oxygen (air), it operates the fourth pump P4, the fifth pump P5, the first vacuum pump VP1, and the second vacuum pump VP2 based on instructions from an operator at times such as, for example, initial gas replacement during the start-up of the apparatus.

By this operation, a large flow of low absorptive gas (for example, a proportionate amount per volume may be around 50 (dm$^3$/min)) is supplied to the interior of the sealed chambers S3, S2, and S1 via gas supply piping $62A_1$ to $62A_3$, $62B_1$ to $62B_3$, and $62C_1$ to $62C_3$, respectively, and at the same time, a small flow of low absorptive gas (for example, the maximum ejection flow amount from each nozzle, such as around 5 (dm$^3$/min)) is supplied to the interior of the sealed chambers S3, S2, and S1, via gas supply piping $61A_1$ to $61A_3$, $61B_1$ to $61B_3$, and $61C_1$ to $61C_3$, respectively, from the gas supply unit 31.

And, complying with the supply of low absorptive gas to the sealed chambers S3, S2, and S1, gases inside the sealed chambers S3, S2, and S1 (gases that contain much absorptive gas such as air) are smoothly exhausted via the gas exhaust piping $94A_1$ to $94A_3$, $94B_1$ to $94B_3$, $94C_1$ to $94C_3$, $95A_1$ to $95A_3$, $95B_1$ to $95B_3$, and $95C_1$ to $95C_3$, respectively, and returned to the gas supply unit 31.

During this operation, within the sealed chamber S3, the low absorptive gas supplied via the gas supply piping $62A_1$ and the supply opening $58A_1$ proceeds mainly in the direction where it is exhausted to the gas exhaust piping $95A_3$ via the gas exhaust vent $59A_3$, whereas the low absorptive gas supplied via the gas supply piping $62A_2$ and the supply opening $58A_2$ proceeds mainly in the direction where it is exhausted to the gas exhaust piping $95A_1$ via the gas exhaust vent $59A_1$, and the low absorptive gas supplied via the gas supply piping $62A_3$ and the supply opening $58A_3$ proceeds mainly in the direction where it is exhausted to the gas exhaust piping $95A_2$ via the gas exhaust vent $59A_2$, as is shown with the bold solid lines in FIG. 9. That is, by supplying the low absorptive gas from the gas supply openings $58A_1$ to $58A_3$, the internal gas of the sealed chamber S3 is agitated, therefore, it becomes possible to make the concentration (purity) of the low absorptive gas within the sealed chamber S3 almost uniform without any unevenness. Thus, from the viewpoint of concentration uniformity of the low absorptive gas, it is more desirable to form the gas supply openings $58A_1$ to $58A_3$ along the tangential direction of the sealed chamber S3.

Also, with the sealed chambers S2 and S1, likewise the description above, it is possible to make the concentration (purity) of the low absorptive gas within each sealed chamber almost uniform without any unevenness by agitating the gas inside the chamber.

The main controller 70 stops the fifth pump P5, the first vacuum pump VP1, and the second vacuum pump VP2 upon the initial gas replacement described above to replace the internal gas of the sealed chambers S1 to S3 with low absorptive gas when the concentration of the absorptive gas within the sealed chambers S1 to S3 falls below the level of, for example, 1 ppm, judging that the initial gas replacement has been completed. The main controller 70 can determine whether the initial gas replacement has been completed by the judgment based on, for example, timers or the like (not shown in Figs.), or detection values of gas sensors (such as oxygen concentration sensors, also not shown in Figs.) to see that the concentration of the absorptive gas within the sealed chambers S1 to S3 has fallen below the level of 1 ppm.

When the initial gas replacement has been completed in this manner, the main controller 70 then adjusts the flow amount of the low absorptive gas supplied via the gas supply piping $61A_1$ to $61A_3$, $61B_1$ to $61B_3$, and $61C_1$ to $61C_3$ to an amount such as around 1 (dm$^3$/min), for example, which is 1/50 of the proportionate amount per volume. The main controller 70 then continuously operates the fourth pump P4, and continues to supply (or creates a flow of) the low absorptive gas of around 1 (dm$^3$/min), for example, which is 1/50 of the proportionate amount per volume, to the sealed chambers S1 to S3 via the gas supply piping $61A_1$ to $61A_3$, $61B_1$ to $61B_3$, and $61C_1$ to $61C_3$, respectively, in order to maintain the purity level of the low absorptive gas achieved by the initial gas replacement in each sealed chamber. That is, in this embodiment, in the case the low absorptive gas (specific gas) is supplied to the sealed chambers S1 to S3 when the gas inside the sealed chambers do not contain much absorptive gas, it is supplied to the sealed chambers S1 to S3 via the gas supply piping $61A_1$ to $61A_3$, $61B_1$ to $61B_3$, and $61C_1$ to $61C_3$, respectively.

In this manner, the main controller 70 continues to supply (create a flow) and to circulate the low absorptive gas to each of the sealed chambers S1 to S3 at all times, while the fourth pump P4 is operating. And, the circulation of the low absorptive gas continues for a long period of time. In this case, due to the air filters and chemical filters provided in each gas supply piping and gas exhaust piping, impurities such as absorptive gas in the circulated gas are almost all removed. Therefore, even if the low absorptive gas is circulated for a long period of time, it hardly produces any adverse effect upon exposure.

Upon such operations, nozzles are provided in each of the gas supply piping $61A_1$ to $61A_3$, $61B_1$ to $61B_3$, and $61C_1$ to $61C_3$, and gas supply openings of the low absorptive gas on the tip of each nozzle are arranged in the vicinity of the optical path of the exposure light EL (on the optical path of the effective beam). Therefore, the low absorptive gas can be effectively purged into the space along the optical path within the sealed chambers S3, S2, and S1.

As is described, in this embodiment, when gases inside the sealed chambers S1 to S3 contain much absorptive gas such as oxygen (air) at times such as initial gas replacement, the main controller 70 supplies low absorptive gas to the sealed chambers S3, S2, and S1 via the gas supply piping $62A_1$ to $62A_3$, $62B_1$ to $62B_3$, and $62C_1$ to $62C_3$ that have a large diameter, the supply openings $58A_1$ to $58A_3$, $58B_1$ to $58B_3$, and $58C_1$ to $58C_3$ that have a large opening area, the gas supply piping $61A_1$ to $61A_3$, $61B_1$ to $61B_3$, and $61C_1$ to $61C_3$ that have a small diameter, and the nozzles $88A_1$ to $88A_3$, $88B_1$ to $88B_3$, and $88C_1$ to $88C_3$. And, corresponding to this supply of low absorptive gas, the gases inside each sealed chamber (that contain much absorptive gas such as air) are exhausted outside via each gas exhaust vent and gas exhaust piping. In this case, since a large amount of low absorptive gas is supplied to the sealed chambers, gas replacement such as the initial gas replacement is completed within a short period of time.

On the other hand, when gases inside the sealed chambers S1 to S3 do not contain much absorptive gas at times such as the gas purity maintenance period, the main controller 70 supplies low absorptive gas to the sealed chambers only via the gas supply piping $61A_1$ to $61A_3$, $61B_1$ to $61B_3$, and $61C_1$ to $61C_3$ that have a small diameter, and the nozzles $88A_1$ to $88A_3$, $88B_1$ to $88B_3$, and $88C_1$ to $88C_3$. And, corresponding to this supply of low absorptive gas, the gases inside the sealed chambers are exhausted outside via each gas exhaust vent and gas exhaust piping. In this case, the gas purity is maintained using the small flow of low absorptive gas, by effectively purging the low absorptive gas into the space along the optical path within the sealed chambers S1 to S3.

As is described so far, in the fourth embodiment, the main controller 70 controls the supply of specific gas to the sealed chambers S1 to S3 by choosing either the first supplying route (the gas supply piping $62A_1$ to $62A_3$, $62B_1$ to $62B_3$, and $62C_1$ to $62C_3$ that have a large diameter and the supply openings $58A_1$ to $58A_3$, $58B_1$ to $58B_3$, and $58C_1$ to $58C_3$ that have a large opening area) or the second supplying route (the gas supply piping $61A_1$ to $61A_3$, $61B_1$ to $61B_3$, and $61C_1$ to $61C_3$ that have a small diameter and the nozzles $88A_1$ to $88A_3$, $88B_1$ to $88B_3$, and $88C_1$ to $88C_3$) at the least, depending on the internal state of the sealed chambers. Accordingly, in this embodiment, the purge performance of the projection optical system PL3 can be improved, as well as the running cost of the apparatus reduced. Especially in the case when expensive gases such as helium are used as the low absorptive gas, the effect of reducing the running cost increases.

In the description above, from the viewpoint of reducing the time required for initial gas replacement and of effectively removing impurities in the low absorptive gas or the like from the space in between the lenses, the fourth pump P4 and the fifth pump P5 are operated at the same time. Only the fifth pump P5, however, may be operated so that the low absorptive gas is supplied to the sealed chambers S1 to S3 only via the supply openings $58A_1$ to $58A_3$, $58B_1$ to $58B_3$, and $58C_1$ to $58C_3$). In addition, in the description above, the fourth pump P4 and the fifth pump P5 are operated simultaneously with the first and second vacuum pumps VP1 and VP2 upon the initial gas replacement, so as to prevent a vacuumed state from being created inside the sealed chambers S1 to S3. This is due to the fact that the increase in weight and size of the barrel and the size of the apparatus in a vacuumed state has been taken into account, because when a vacuumed state is created, a large pressure difference occurs between the inside and the outside of the barrel, and the structure of the barrel needs to be strong enough to withstand the pressure difference. If, however, the barrel size increase may be allowed, the first and second vacuum pumps VP1 and VP2 may be operated so as to create a vacuumed state within the sealed chambers S1 to S3, and when this is completed, the forth pump P4 and the fifth pump P5 may be operated to supply the low absorptive gas.

In the fourth embodiment, the reticle pattern is transferred onto each shot area on the wafer based on a step-and-scan method in a manner similar to the first embodiment previously described.

And, when scanning exposure (transfer of the reticle pattern) is performed on each shot area on the wafer, since the inside of the projection optical system PL3 is replaced with low absorptive gas in advance so that the optical properties can be brought to full scope, and furthermore, since the image forming characteristics of the projection optical system PL3 do not deteriorate with the elapse of time during scanning exposure, deterioration of the pattern transferred onto the wafer can be avoided.

Accordingly, in the fourth embodiment, since the pattern of the reticle R is transferred onto the wafer W via the projection optical system PL3 which image forming characteristics are maintained at a favorable state in the manner previously described, the pattern of the reticle can be transferred onto the wafer W with high accuracy, likewise the first embodiment previously described. Again, in this case, for similar reasons as the first embodiment, it becomes possible to control the exposure amount at a high precision for a long period of time. In addition, since vacuum ultraviolet light is used as the exposure light EL, resolution of the projection optical system PL3 can be improved. Accordingly, it becomes possible to accurately transfer the reticle pattern on the wafer for a long period of time.

The case has been described in the fourth embodiment where the low absorptive gas is continuously supplied (a flow is maintained) to the sealed chambers S1, S2, and S3. The present invention, however, is not limited to this, and the interior of the sealed chambers S1, S2, and S3 may be maintained at a predetermined pressure by providing gas supply valves and gas exhaust valves in at least a part of the gas supply piping and the gas exhaust piping, and controlling the open/close of these valves, likewise the illumination optical system IOP or the like.

In addition, in the fourth embodiment, the case has been described where a plurality of sealed chambers (inner space) are arranged within the projection optical system PL3, the tip of the nozzles (supply openings) are arranged in the vicinity of the optical path of the exposure light upon purge of the low absorptive gas into the sealed chambers, and gas supply openings with a large diameter are arranged along with the nozzles in each sealed chamber. The present invention, however, is not limited to this. That is, a plurality of inner spaces may be arranged not only in the projection optical system, but also in other optical systems that have optical elements such as the illumination optical system, and the tip of the nozzles (supply openings) may be arranged in the vicinity of the optical path of the exposure light upon purging the low absorptive gas into the inner spaces. In addition, gas supply openings with a large diameter may be arranged with the nozzles in each inner space, so that upon the initial gas replacement the purge may be performed by a large flow amount of low absorptive gas being supplied from the gas supply openings with a large diameter, whereas, upon the gas purity maintenance period the purge may be performed by a small flow amount of low absorptive gas being supplied from the nozzles.

Further, in the fourth embodiment, in the case at least one specific lens of the lenses L11 to L14 has a flange portion on the periphery portion close to a neutral plane, the lens holding device described earlier in the first embodiment may be used as the lens holding mechanism for holding the specific lens. With this arrangement, deformation occurring on the optical surface, which is on both sides of the optical axis direction of the specific lens, is reduced to a level that can almost be neglected, and thus it becomes possible to suppress deterioration of the optical performance to the utmost. In addition, in the fourth embodiment, a control system for controlling the specific gas environment in the between adjacent spaces may be arranged so as to prevent pressure difference from occurring in between the adjacent spaces (in at least one space in between the reticle chamber 15 and the sealed chamber S1, the sealed chambers S1 and S2, the sealed chambers S2 and S3, or the sealed chamber S3 and the wafer chamber 40), naturally, when the lens holding device is used as the lens holding mechanism or even in the case when the lens holding device is not used. As such a control system, the control systems described earlier in the first to third embodiment can be used. In such a case, unnecessary pressure acting on the optical members dividing the adjacent space (at least one of the lenses L11 to L14) is avoided, and it becomes possible to prevent the optical members from floating from its setting.

<<Fifth Embodiment>>

A fifth embodiment of the present invention is described next, referring to FIGS. 13 and 14. Structures and components identical or equivalent to those described in the first embodiment and the fourth embodiment are designated with the same reference numerals, and the description thereabout is briefly made or is entirely omitted.

With the fifth embodiment, the structure of the projection optical system is different from the first embodiment previously described. Other portions are identical with the first embodiment and the fourth embodiment; therefore, the following description will be made focusing on the difference.

Figure 13:
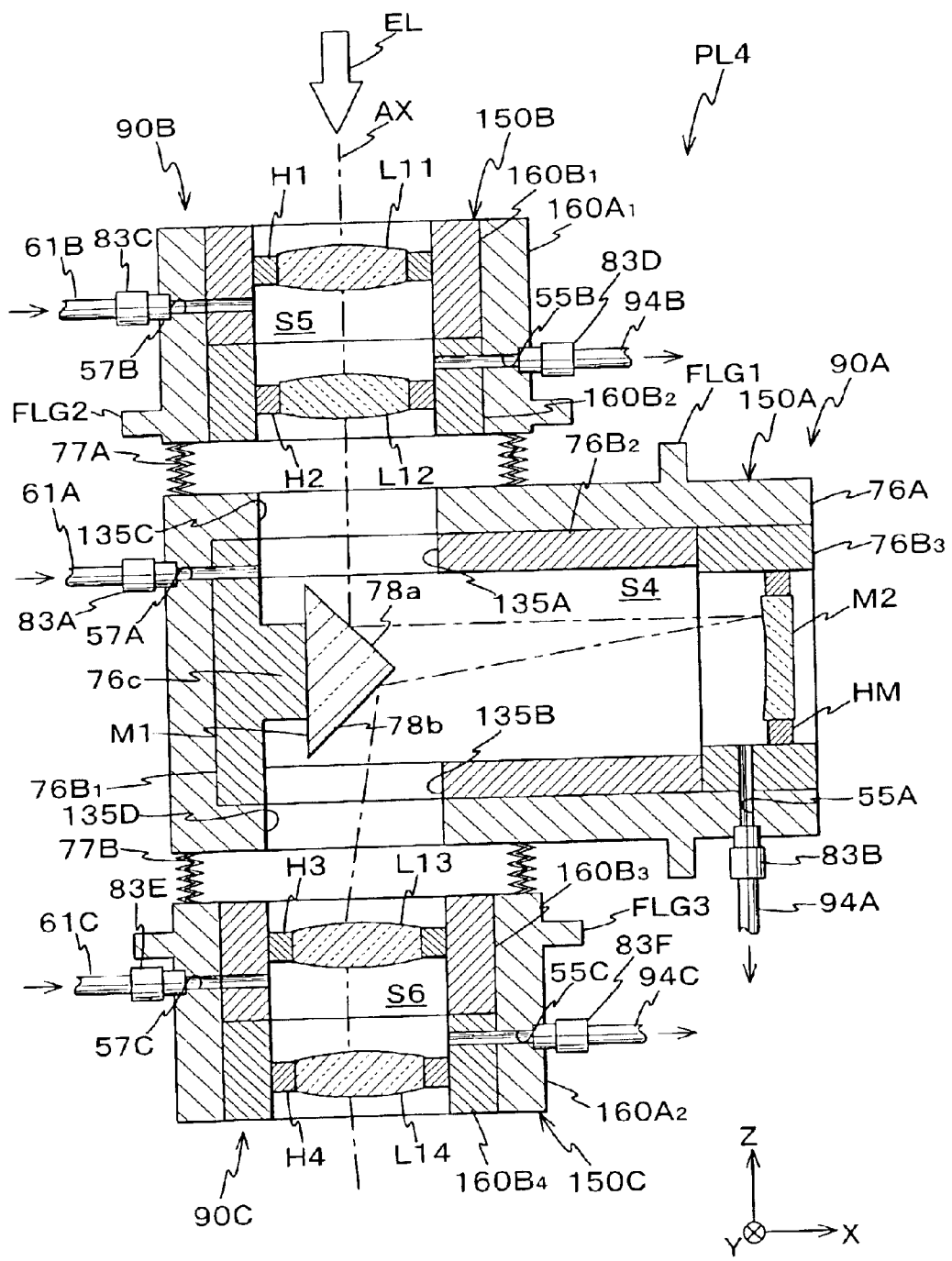
FIG. 13 is a longitudinal sectional view of a projection optical system related to a fifth embodiment.

FIG. 13 schematically shows a longitudinal sectional view of the projection optical system PL4 related to the fifth embodiment. The projection optical system PL4 is a reflection refraction optical system (a catadioptric system) that includes a right-angle mirror and a concave mirror, which are reflection optical elements, in addition to a plurality of lenses, which are refraction optical elements.

As is shown in FIG. 13, the projection optical system PL4 comprises a transverse barrel portion 90A serving as a first barrel portion which longitudinal direction is the X-axis direction, a lengthwise barrel portion 90B serving as a second barrel arranged above the transverse barrel portion 90A on half the −X side (the left half portion in FIG. 13), and a lengthwise barrel portion 90C serving as a third barrel arranged below the transverse barrel portion 90A coaxially with the lengthwise barrel portion 90B.

The transverse barrel portion 90A comprises a barrel 150A, and a right-angle mirror M1 and a concave mirror M2, which serve as mirrors and are arranged within the barrel 150A along the X-axis direction at a predetermined interval. More particularly, the barrel 150A comprises an outer barrel 76A of a hollow cylindrical shape that has a bottom and an opening on a surface in the +X side, a mirror holding member 76B$_1$ inserted in the outer barrel 76A from the +X side and fixed to the bottom wall of the outer barrel 76A in a close contact state, a spacer member 76B$_2$ of a hollow cylindrical shape inserted in the outer barrel 76A in a state where the mirror holding member 76B$_1$ is suppressed from the right hand side in FIG. 13, and an inner barrel 76B$_3$ inserted in the outer barrel 76A fixed in a state where the spacer member 76B$_2$ is suppressed from the right hand side in FIG. 13, and the like. That is, a double-structured barrel consisting of the outer barrel 76A, the mirror holding member 76B$_1$, the spacer member 76B$_2$, and the inner barrel 76B$_3$ is used as the barrel 150A.

At a position slightly on the right hand side of the center portion in the X-axis direction of the outer barrel 76A, a flange portion FLG1 is provided, and the transverse barrel portion 90A is supported via the flange portion FLG1 with a holding member (not shown in Figs.).

The mirror holding member 76B$_1$ is a cylindrical shaped member with a step, consisting of a circular plate portion and a cylindrical shaped convex portion 76c, which is integrally arranged on a surface of the circular plate portion (on the right side in FIG. 13) in the center portion. And, the bottom surface of the right-angle mirror M1 is fixed on the edge surface of the cylindrical shaped convex portion 76c of the mirror holding member 76B$_1$. The right-angle mirror M1 has a first reflection surface 78a at an angle of +45° against the bottom surface, and a second reflection surface 78b at an angle of −45° against the bottom surface. The reflection surfaces 78a and 78b are formed of an aluminum film coated on the surface of the glass material that makes up the right-angle mirror M1. In this case, the mirror M1 is arranged in a state where the first and second reflection surfaces, 78a and 78b, are arranged at the angles of +45° and −45°, respectively, against the YZ plane. Further, as the material that make up the. right-angle mirror M1, metallic material such as aluminum, or a ceramic may be used instead of the glass material described above, and a reflection film may be formed on the surface of the metallic material or the ceramic.

On the peripheral walls of the spacer member 76B$_2$ and the outer barrel 76A located above the first reflection surface 78a, a notch 135A, which is in the shape of a letter U when viewed from above, and an opening portion 135C are formed, respectively. Meanwhile, on the peripheral walls of the spacer member 76B$_2$ and the outer barrel 76A located below the second reflection surface 78b, a notch 135B and an opening portion 135D are formed, respectively, vertically symmetric with the notch 135A and the opening portion 135C.

On the inner periphery surface of the inner barrel 76B$_3$, a concave mirror holding mechanism HM for holding the periphery of the concave mirror M2 made up of a spherical mirror is fixed. In this case, the concave mirror holding mechanism HM and the concave mirror M2 are assembled in a state blocking the opening portion of the inner barrel 76B$_3$.

The lengthwise barrel portion 90B comprises a barrel 150B, and a plurality of lenses (two in FIG. 13) L11 and L12 arranged along the Z-axis direction within the barrel 150B at a predetermined interval, and the like.

The barrel 150B has a double structure, consisting of a cylindrical outer barrel 160A$_1$ and cylindrical inner barrels 160B$_1$ and 160B$_2$ that are arranged inside the outer barrel 160A$_1$ adjacent to each other in the vertical direction. At the lower end portion of the outer barrel 160A$_1$ in the height direction, a flange portion FLG2 is provided, and the lengthwise barrel portion 90B is held with a holding member (not shown in Figs.) via the flange portion FLG2.

The lenses L11 and L12 are each held horizontally by lens holding mechanisms H1 and H2 which periphery is fixed to the inner periphery surface of the inner barrels 160B$_1$ and 160B$_2$, respectively. In this case, within the lengthwise barrel portion 90B, a sealed chamber S5 serving as a second space is formed, sealed from the outside and divided by the lenses L11 and L12, lens holding mechanisms H1 and H2, and the inner barrels 160B$_1$ and 160B$_2$.

The lengthwise barrel portion 90C comprises a barrel 150C, and a plurality of lenses (two in FIG. 13) L13 and L14 arranged along the Z-axis direction within the barrel 150C at a predetermined interval, and the like.

The barrel 150C has a double structure, consisting of a cylindrical outer barrel 160A$_2$ and cylindrical inner barrels 160B$_3$ and 160B$_4$ that are arranged inside the outer barrel 160A$_2$ adjacent to each other in the vertical direction. At the upper end portion of the outer barrel 160A$_2$ in the height direction, a flange portion FLG3 is provided, and the lengthwise barrel portion 90C is held with a holding member (not shown in Figs.) via the flange portion FLG3.

The lenses L13 and L14 are each held horizontally by lens holding mechanisms H3 and H4 which periphery is fixed to the inner periphery surface of the inner barrels 160B$_3$ and 160B$_4$, respectively. In this case, within the lengthwise barrel portion 90C, a sealed chamber S6 serving as a second space is formed, sealed from the outside and divided by the lenses L13 and L14, lens holding mechanisms H3 and H4, and the inner barrels $160B_3$ and $160B_4$.

The outer barrel $160A_1$ and the outer barrel 76A referred to earlier is connected closely via a bellows 77A. And, the outer barrel $160A_2$ and the outer barrel 76A referred to earlier is connected closely via a bellows 77B. That is, in this embodiment, in the portion below the lens L12 and above the lens L13, a sealed chamber S4 serving as a first space is formed that includes the interior of the transverse barrel portion 90A and the interior of the bellows 77A and 77B. The inside of the sealed chamber, naturally, is sealed from the outside.

Next, the operation of the projection optical system PL4 which optical elements are each arranged in the manner above is described. As is representatively shown in the optical path indicated by a dotted line in FIG. 13, when the exposure light EL outgoing from the reticle R to the projection optical system PL4 sequentially passes the lenses L11 and L12, it is concentrated by the lenses L11 and L12, and is then incident on the first reflection surface 78a of the right-angle mirror M1. Then, the exposure light EL reflected off the first reflection surface 78a is reflected again, this time on the reflection surface of the concave mirror M2, and is incident on the second reflection surface 78b of the right-angle mirror M1. And, the exposure light EL reflected off the second reflection surface 78b is condensed on the wafer surface with the lenses L13 and L14. Incidentally, the optical path indicated by a dotted line in FIG. 13 representatively shows an optical path of an arbitrary beam among innumerable beams entering the projection optical system PL4 form the reticle R.

Next, the low absorptive gas supply/exhaust system for gas replacement within the sealed chambers S4 to S6 is described.

Figure 14:
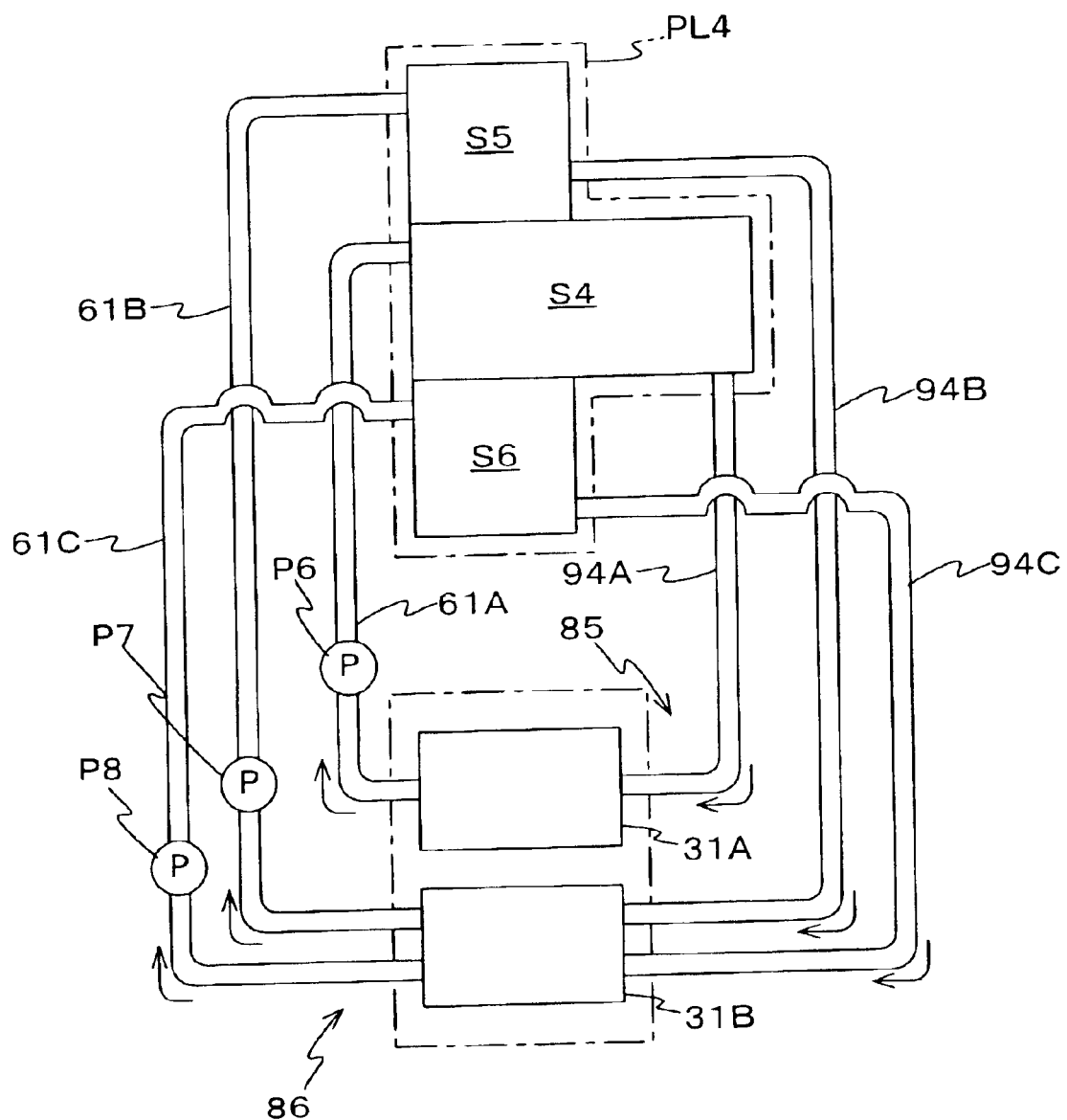
FIG. 14 is a conceptual view showing a model of a gas supply/exhaust system for purging an inside of a sealed chamber of the projection optical system in FIG. 13.

FIG. 14 shows a gas supply/exhaust system modeled in a conceptual view for purging a specific gas having the characteristics of transmitting the exposure light EL serving as an energy beam, that is, a gas supply/exhaust system for purging low absorptive gas described earlier into the interior of the sealed chambers S4 to S6 within the projection optical system PL4.

The gas supply/exhaust system in FIG. 14 comprises a first gas supply/exhaust system 85 for purging the interior of the sealed chamber S4 with the low absorptive gas, and a second gas supply/exhaust system 86 for purging the interior of the remaining sealed chambers S5 and S6 with the low absorptive gas.

The first gas supply/exhaust system 85 comprises a gas supply piping 61A, a first gas supply unit 31A, and an exhaust piping 94A. With the gas supply piping 61A, one end of the piping is connected to one end of the sealed chamber S4, and the other end is connected to one end of the first gas supply unit 31 via a pump P6, whereas with the exhaust piping 94A, one end of the piping is connected to the other end of the sealed chamber S4 and the other end is connected to the other end of the first gas supply unit 31.

More particularly, as is shown in FIG. 13, in the bottom wall (the wall on the –X side) of the outer barrel 76A configuring the barrel 150A of the transverse barrel portion 90A and in the mirror holding member 76c facing the bottom wall, a gas supply vent 57A serving as a gas supply opening is formed above the right-angle mirror M1, extending in the X-axis direction. And, to this gas supply vent 57A, one end of the gas supply piping 61A is connected via a gas joint 83A.

Meanwhile, at a position on the –Z side in the periphery wall of the inner barrel $76B_3$ and on the –X side of the concave mirror M2, and in the portion of the outer barrel 76A facing the position, an exhaust vent 55A serving as an exhaust opening is formed in a vertical direction. And, to this exhaust vent 55A, one end of the exhaust piping 94 is connected via a gas joint 83B.

Inside the first gas supply unit 31, a gas chamber which houses a low absorptive gas having a first purity (a first concentration) is arranged. In this case, also, chemical filters and air filters are arranged in the gas supply piping and exhaust piping. The pump P6 operates under the control of the main controller 70 described earlier in the description, and likewise the first embodiment, the low absorptive gas is provided from the first gas supply unit 31 to the sealed chamber S4 via the gas supply piping 61A, and the internal gas of the sealed chamber S4 is returned to the first gas supply unit 31 via the exhaust piping 94. Thus, the low absorptive gas is purged into the sealed chamber S4 by this circulation route.

As is shown in FIG. 14, the second gas supply/exhaust system 86 comprises: a gas supply piping 61B which one end is connected to one end of the sealed chamber S5 and the other end is connected to one end of a second gas supply unit 31B via a pump P7; an exhaust piping 94B which one end is connected to the other end of the sealed chamber S5 and the other end is connected to the other end of the second gas supply unit 31B; a gas supply piping 61C which one end is connected to one end of the sealed chamber S6 and the other end is connected to one end of the second gas supply unit 31B via a pump P8; an exhaust piping 94C which one end is connected to the other end of the sealed chamber S6 and the other end is connected to the other end of the second gas supply unit 31B; and the second gas supply unit 31B.

More particularly, as is shown in FIG. 13, in the –X side portion of the inner barrel $160B_1$ configuring the barrel 150B of the lengthwise barrel portion 90B, and at a location in the outer barrel $160A_1$ facing this portion, a gas supply vent 57B serving as a gas supply opening is formed extending in the X-axis direction. And to this gas supply vent 57B, one end of the gas supply piping 61B is connected via a joint 83C.

Meanwhile, at a position on the +X side in the inner barrel $160B_2$ and at a location in the outer barrel $160A_1$ facing this portion, an exhaust vent 55B serving as an exhaust opening is formed extending in the X-axis direction. And to this exhaust vent 55B, one end of the exhaust piping 94B is connected via a joint 83D.

In the –X side portion of the inner barrel $160B_3$ configuring the barrel 150C of the lengthwise barrel portion 90C, and at a location in the outer barrel $160A_2$ facing this portion, a gas supply vent 57C serving as a gas supply opening is formed extending in the X-axis direction. And to this gas supply vent 57C, one end of the gas supply piping 61C is connected via a joint 83E.

Meanwhile, at a position on the +X side in the inner barrel $160B_4$ and at a location in the outer barrel $160A_2$ facing this portion, an exhaust vent 55C serving as an exhaust opening is formed. And to this exhaust vent 55C, one end of the exhaust piping 94C is connected via a joint 83F.

Inside the second gas supply unit 31, a gas chamber is arranged housing a low absorptive gas of a second purity, which purity is slightly lower that of the first purity (first concentration). In this case, again, chemical filters and air filters are arranged in each of the gas supply piping and exhaust piping.

The pumps P7 and P8 operate under the control of the main controller 70, and likewise the fourth embodiment described earlier, the low absorptive gas is purged into the sealed chambers S5 and S6 via the gas supply piping 61B and 61C, respectively, from the second gas supply unit 31B in a similar manner previously described.

The configuration of the remaining parts is the same with the first and fourth embodiment.

With the projection optical system PL4 related to the fifth embodiment that has the arrangement described above, since the inside is divided into three sealed chambers S4 to S6 and the low absorptive gas is purged individually into each sealed chamber using its individual gas supply/exhaust system, the gas does not linger in each of the chambers in spite of its complicated shape. Therefore, it is possible to maintain good image forming characteristics.

In addition, in the fifth embodiment, the sealed chamber S5 is connected to the second gas supply unit 31B via the gas supply piping 61B and the exhaust piping 94B, and the sealed chamber S6 is connected likewise, via the gas supply piping 61C and the exhaust piping 94C. The sealed chamber S6, however, is separately connected to the first gas supply unit 31A, which supplies a low absorptive gas having a higher purity level than that of the second gas supply unit, via the gas supply piping 61A and the exhaust piping 94A. Therefore, the inside of the sealed chamber S4 is purged with the low absorptive gas which purity level is higher than that of the gas purged within the sealed chambers S5 and S6. This allows higher purge accuracy in the portion in between the right-angle mirror M1 and the concave mirror M2, where the optical path of the energy beam is a double path optical path bent back in a shape of the letter V, compared with the other portions of the optical path. Therefore, the purge accuracy necessary can be satisfied on the entire optical path, thus allowing an effective purge.

In addition, the reflection surface of the right-angle mirror M1 is formed of a metal coating such as aluminum, which deterioration due to the $F_2$ laser and impurity in the gas is relatively large. Therefore, from the viewpoint of protecting the reflection surface, it is effective to set the concentration of the low absorptive gas high within the sealed chamber S4. Moreover, since the gas supply opening of the low absorptive gas (gas supply vent 57A) is arranged in the vicinity of the right-angle mirror M1, the protection effect of the reflection surface of the right-angle mirror M1 can be further increased.

Furthermore, in the embodiment, the low absorptive gas is provided from above into each of the chambers, S4, S5, and S6, and is exhausted from below. Therefore, in the case of using gas lighter than air such as helium as the low absorptive gas, the gas within the sealed chamber can be evenly replaced from the upper end to the bottom with the low absorptive gas.

In addition, with the exposure apparatus related to the fifth embodiment, by contriving the exposure apparatus in various ways as described above, the optical path of the exposure light EL is effectively purged with the low absorptive gas, and exposure is performed via the projection optical system PL4 which image forming characteristics are favorably maintained. Thus, it becomes possible to maintain good exposure accuracy for a long period of time.

In addition, in the fifth embodiment, a reflection refraction optical system is used as the projection optical system PL4. This keeps the size of the projection optical system itself from increasing unnecessarily, and particularly in the case of using an $F_2$ laser light source as the light source, it becomes possible to achieve exposure with high accuracy that is little-affected by color aberration.

Figure 15:
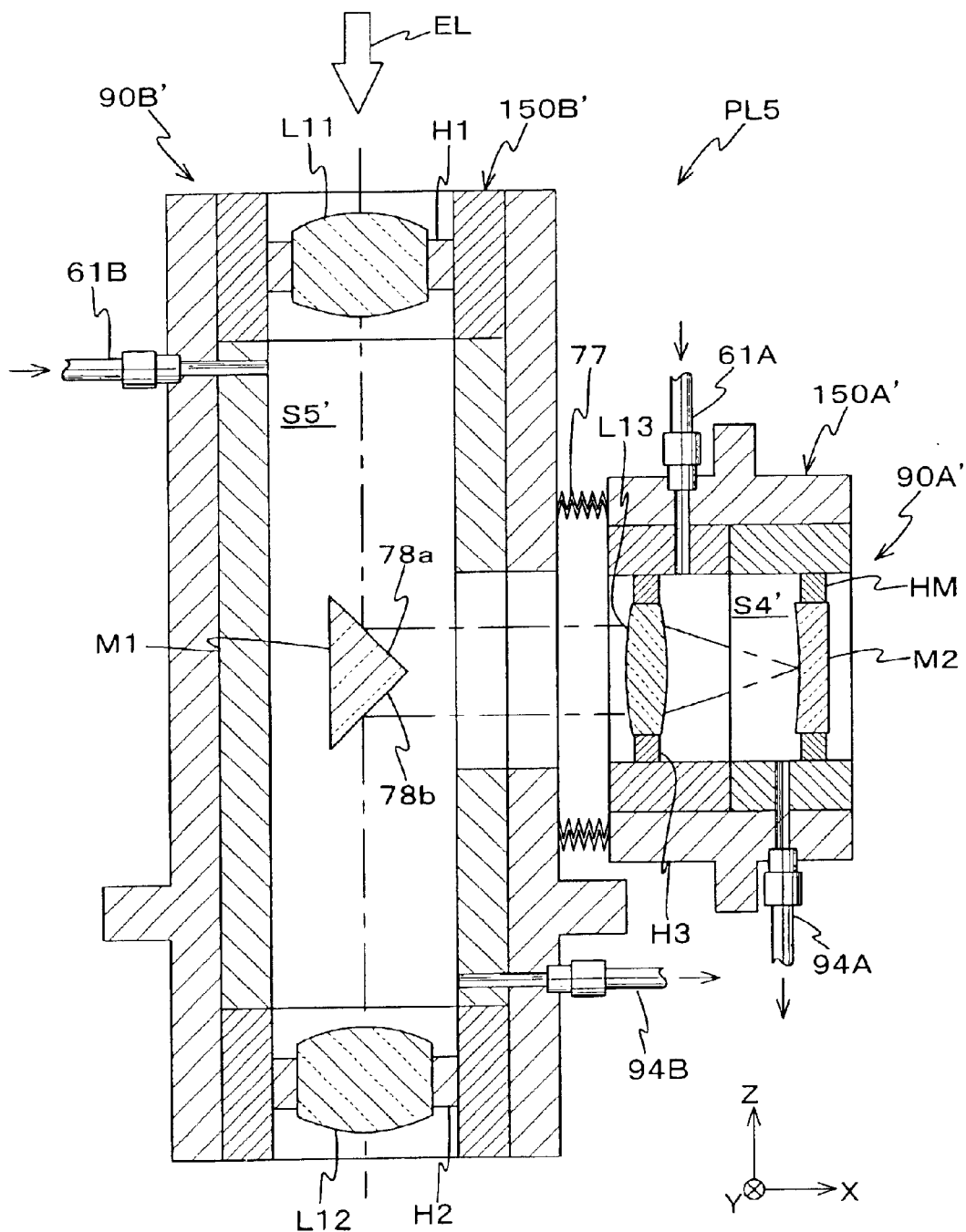
FIG. 15 is a longitudinal sectional view showing a projection optical system consisting of a reflection refraction system related to a modified example.

In the case a reflection refraction system is employed as the projection optical system, not only is the arrangement limited to the one shown in FIG. 13, but the type of projection optical system PL5 shown in, for example, FIG. 15, can also be employed.

With the projection optical system PL5 shown in FIG. 15, it comprises: a transversal first barrel portion 90A', and a lengthwise second barrel portion 90B' which is connected to the first barrel portion 90A' via a bellows 77. And, inside a barrel 150A' of the first barrel portion 90A', a concave mirror M2 and a lens L13 are arranged, whereas, inside a barrel 150B' of the second barrel portion 90B', lenses L11 and L12 and a right-angle mirror M1 are arranged.

With the projection optical system PL5, as is indicated by the dotted lines in FIG. 15, the exposure light EL emitted from the reticle is reflected off a first reflection plane 78a of the right-angle mirror M1 via the lens L11, and after the optical path is bent at an angle of 90°, the exposure light then reaches the reflection surface of the concave mirror M2 via the lens L13. Then, the exposure light EL is reflected off the reflection surface of the concave mirror M2, and reaches a second reflection plane 78b of the right-angle mirror M1 via the lens L13. And, after the exposure light EL is reflected off the second reflection plane 78b and its optical path is bent at an angle of 90°, the exposure light EL reaches the wafer surface via the lens L13. Incidentally, the dotted lines indicated in FIG. 15 representatively show an optical path of a principal ray.

With the projection optical system PL5, inside the first barrel portion 90A', a sealed chamber S4' serving as a first space is arranged divided by a lens holding mechanism H3, the concave mirror M2, a concave mirror holding mechanism HM, and the barrel 150A'. And, in the remaining portion of the projection optical system PL5, a sealed chamber S5' serving as a second space is arranged divided by the lens L11, a lens holding mechanism H1, the lens L12, a lens holding mechanism H2, the barrel 150B', the bellows 77, the lens L13, and the lens holding mechanism H3.

In this case, gas supply piping 61A is connected to the upper portion of the sealed chamber S4', whereas an exhaust piping 94A is connected to the lower portion of the sealed chamber S4'. In addition, with the sealed chamber S5', gas supply piping 61B is connected to the vicinity of the upper end portion, whereas an exhaust piping 94B is connected to the vicinity of the lower end portion. Therefore, low absorptive gas can be individually purged into the sealed chambers S4' and S5', which resolves the problem of lingering gas in the chambers, and allows the favorable image forming characteristics of the projection optical system PL5 to be maintained.

Also, in this case, in each of the chambers S4' and S5', the low absorptive gas is supplied from above and exhausted from below in the gravitational direction. Therefore, in the case of using gas lighter than air such as helium as the low absorptive gas, the air in the sealed chambers can be replaced with the low absorptive gas evenly starting from the top to the bottom.

Further, as the projection optical system, in the case of employing a reflection refraction system with the optical element arrangement likewise the fifth embodiment described above, the inside of the projection optical system may be divided into four portions; a first portion including the lenses L11 and L12, a second portion including the right-angle mirror M1, a third portion including the concave mirror M2, and the fourth portion including the lenses L13 and L14. These portions may be arranged in separate barrels, and within each barrel a sealed chamber may be provided, and the inside of each sealed chamber may be purged with the low absorptive gas individually, as is previously described.

Or, the first portion and fourth portion may be arranged within a barrel at a predetermined interval, whereas the second portion and the third portion may be arranged within another barrel, and the second portion of this barrel may be inserted in between the first portion and fourth portion of the former barrel.

In addition, in the fifth embodiment described above, within each of the barrels where the sealed chambers S5 and S6 are arranged, a nozzle, a gas supply vent, and an exhaust vent corresponding to these parts may be arranged likewise the fourth embodiment described earlier, and the main controller 70 may similarly purge the low absorptive gas into the sealed chambers S5 and S6 on the initial gas replacement and the gas maintenance period, as in the fourth embodiment. In this case, the gas supply vent may be omitted, and only the nozzle and the exhaust vent described in the fourth embodiment may be arranged. Even in such a case, since the opening at the tip of the nozzle which serves as a supply opening of the specific gas is arranged in the vicinity of the optical path of the exposure light EL (energy beam), the absorptive gas having the characteristics of absorbing the exposure light EL on and around the optical path can be effectively removed. Accordingly, the transmittance of the exposure light EL in the sealed chambers S5 and S6 is hardly cut off by the absorptive gas, therefore, the transmittance and the optical properties (including the image forming characteristics) of the exposure light EL of the projection optical system PL4 can be favorably maintained.

In addition, in the fifth embodiment described above, in the case at least one specific lens among the lenses L11 to L14 has a flange portion on the periphery close to a neutral plane, the lens holding mechanism previously described in the first embodiment may be used as the lens holding mechanisms for holding the specific lens. When this arrangement is employed, the deformation occurring on the optical surface, which is both edge surfaces of the specific lens in the optical axis direction, is reduced to a level that can be ignored, and it becomes possible to suppress the deterioration in the optical properties to the utmost. Furthermore, in the fifth embodiment, naturally in the case when the lens holding device is used as the lens holding mechanism, and even in the case when the lens holding device is not used, a control system may be arranged for controlling the specific gas environment in the space between the adjacent chambers (in between either; the reticle chamber 15 and the sealed chamber S5, the sealed chambers S5 and S4, the sealed chambers S4 and S6, or the sealed chamber S6 and the wafer chamber 40) so that pressure difference does not occur in the space. As such a control system, the control system described earlier in the first to third embodiment can be used. In such a case, the optical member dividing the adjacent space (at least one of the lenses L11 to L14) is no longer affected by unnecessary force, and it can also be protected from floating out of its setting.

In addition, for example, in the first to third, and fifth embodiment, a nozzle, a gas supply vent, and an exhaust vent corresponding to these parts may be arranged, likewise the fourth embodiment, and the main controller may similarly purge low absorptive gas into at least one of a plurality of sealed chambers on the initial gas replacement and the gas maintenance period, likewise the fourth embodiment. In this case, the arrangement may be only the nozzle and the exhaust vent in the fourth embodiment.

In this way, the first to fifth embodiment described above can be arbitrarily combined.

Furthermore, in the fifth embodiment above, the case has been described where the housing of the projection optical system is configured by combining a lengthwise barrel portion and a transverse barrel portion, however, the present invention is not limited to this, and the housing of the projection optical system may be configured by combining a lengthwise barrel portion and a diagonal barrel portion. Again, in such a case, the inner space of each barrel can be effectively purged with the low absorptive gas using the gas supply/exhaust system similar to the one described in the fifth embodiment.

Each optical device related to the present invention, or the barrel(s) structuring the projection optical system related to the present invention, may be configured stacking a barrel module divided into multiple parts. That is, a barrel module is configured of a reflection optical element, an inner ring for holding an optical element such as the lens (corresponding to the holding device in the present invention), and an outer ring on which the inner ring is attached and other barrel modules are stacked. The barrel related to the present invention may also be structured by attaching a seal member in between the outer rings, or by employing a cover.

In addition, with each optical device related to the present invention, at least one of a plurality of optical members forming the sealed space or the space within the barrel is not limited only to a lens but also includes a parallel plate. For example, this parallel plate includes the parallel plate attached to the edge portion on the mask side of the illumination optical system, and the parallel plate attached on both ends of the projection optical system.

In each of the embodiments described above, the case has been described where each inner space within the projection optical system is a sealed chamber which is in a sealed state against the outer portion, however, the present invention is not limited to this, and each of the inner space within the projection optical system maybe a closed space (chamber) which is not in a sealed state against the outer portion.

In each of the embodiments described above, the case has been described where the pulse laser light source in the vacuum ultraviolet region has been used as the light source, such as the $F_2$ laser, the $Kr_2$ laser, the $Ar_2$ laser, or the ArF excimer laser. The present invention, however, is not limited to this, and it is possible to use the KrF excimer laser light source. Also, for example, other than the laser beams emitted from each light source as vacuum ultraviolet light, a harmonic, which is obtained by amplifying a single-wavelength laser beam in the infrared or visible range being emitted by a DFB semiconductor laser or fiber laser with a fiber amplifier doped with erbium (Er) (or both erbium and ytteribium (Yb)) and converting the wavelength into ultraviolet light using a nonlinear optical crystal, may be used.

If, for example, the oscillation wavelength of a single-wavelength laser is set within the range of 1.51 to 1.59 $\mu$m, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 $\mu$m, in particular, an eighth-harmonics whose generation wavelength falls within the range of 193 to 194 nm, that is, ultraviolet light having almost the same wavelength as that of an ArF excimer laser beam can be obtained. If the oscillation wavelength is set within the range of 1.57 to 1.58 a tenth-harmonics whose generation wavelength falls within the range of 157 to 158 nm, that is, ultraviolet light having almost the same wavelength as that of an $F_2$ laser beam can be obtained.

If the oscillation wavelength is set within the range of 1.03 to 1.12 $\mu$m, a seventh-harmonics whose generation wavelength falls within the range of 147 to 160 nm is output.

If the oscillation wavelength is set within the range of 1.099 to 1.106 $\mu$m, in particular, a seventh-harmonics whose generation wavelength falls within the range of 157 to 158 $\mu$m, that is, ultraviolet light having almost the same wavelength as that of an $F_2$ laser beam, can be obtained. In this case, as a single-wavelength oscillation laser, for example, an ytteribium-doped fiber laser can be used.

As the projection optical system PL, in the case of using the ArF excimer laser light source or the KrF excimer laser light source as the light source, a refraction system made up of only refraction optical elements (lens elements) is mainly used. In the case of using the $F_2$ laser or the $Ar_2$ laser as the light source, the so-called catadioptric system (a reflection/refraction system) being a combination of both reflection optical elements and refraction optical elements (such as a concave mirror and a beam splitter), which details are disclosed in, for example, Japanese Patent Laid Open No. 03-282527 or a reflection optical system made up of only reflection optical elements, are mainly used. In these cases, the holding device for holding an optical member related to the present invention can also be suitably applied as the holding device for holding the reflection optical element. In the case of using the $F_2$ laser light source, however, it is possible to use the refraction system, likewise the first to fourth embodiment described above.

In addition, the material (glass material) of the lenses structuring the projection optical system needs to differ depending on the light source used. In the case of using the ArF excimer light source or a KrF excimer light source, both synthetic quartz and fluorite may be used. But in the case of using vacuum ultraviolet light source such as the $F_2$ laser as the light source, all the lenses need to be made of fluorite. However, in the case of using material other than fluorite, fluoride single crystal such as lithium fluoride, magnesium fluoride, and strontium fluoride, or a conjugate fluoride crystal of lithium-calcium-aluminum (Li—Ca—Al) or a conjugate fluoride crystal of lithium-strontium-aluminum (Li—Sr—Al) may be used. Or, fluoride glass made of zirconium-barium-lanthanum-aluminum (Zr—Ba—La—Al), or an improved quartz such as quartz glass doped with fluorine, quartz glass doped with both fluorine and hydrogen, quartz glass containing the OH group, or quartz glass containing fluorine and the OH group may be used.

In each embodiment above, the case is described when the present invention is applied to the scanning exposure apparatus based on the step-and-scan method, however, as a matter of course, the scope of the present invention is not limited to this. That is, the present invention can also be suitably applied to the reduction projection exposure apparatus based on the step-and-repeat method.

In addition, as the levitation method, the wafer stage WST and the reticle scanning stage 14A may employ a levitation method utilizing the gas flow instead of magnetic levitation. In such a case, the gas supplied for levitation is preferably the low absorptive gas referred to earlier in the description.

The exposure apparatus in the embodiments above related to the present invention can be made by incorporating the illumination optical system made up of a plurality of lenses and the projection optical system into the main body of the exposure apparatus and performing optical adjustment, while incorporating the wafer stage (and the reticle stage in the case of the scanning exposure apparatus) that are made up of various mechanical components into the main body of the exposure apparatus, connecting the wiring and piping, assembling each of the partition walls configuring the reticle chamber 15 and the wafer chamber 40, connecting the gas piping system, connecting each portion to the control system such as the main controller 70, and furthermore, performing total adjustment (electrical adjustment, operational adjustment). The exposure apparatus is preferably made in a clean room in which temperature, degree of cleanliness, and the like are controlled.

Device Manufacturing Method

A device manufacturing method using the exposure apparatus and the exposure method described above in a lithographic process will be described next.

Figure 16:
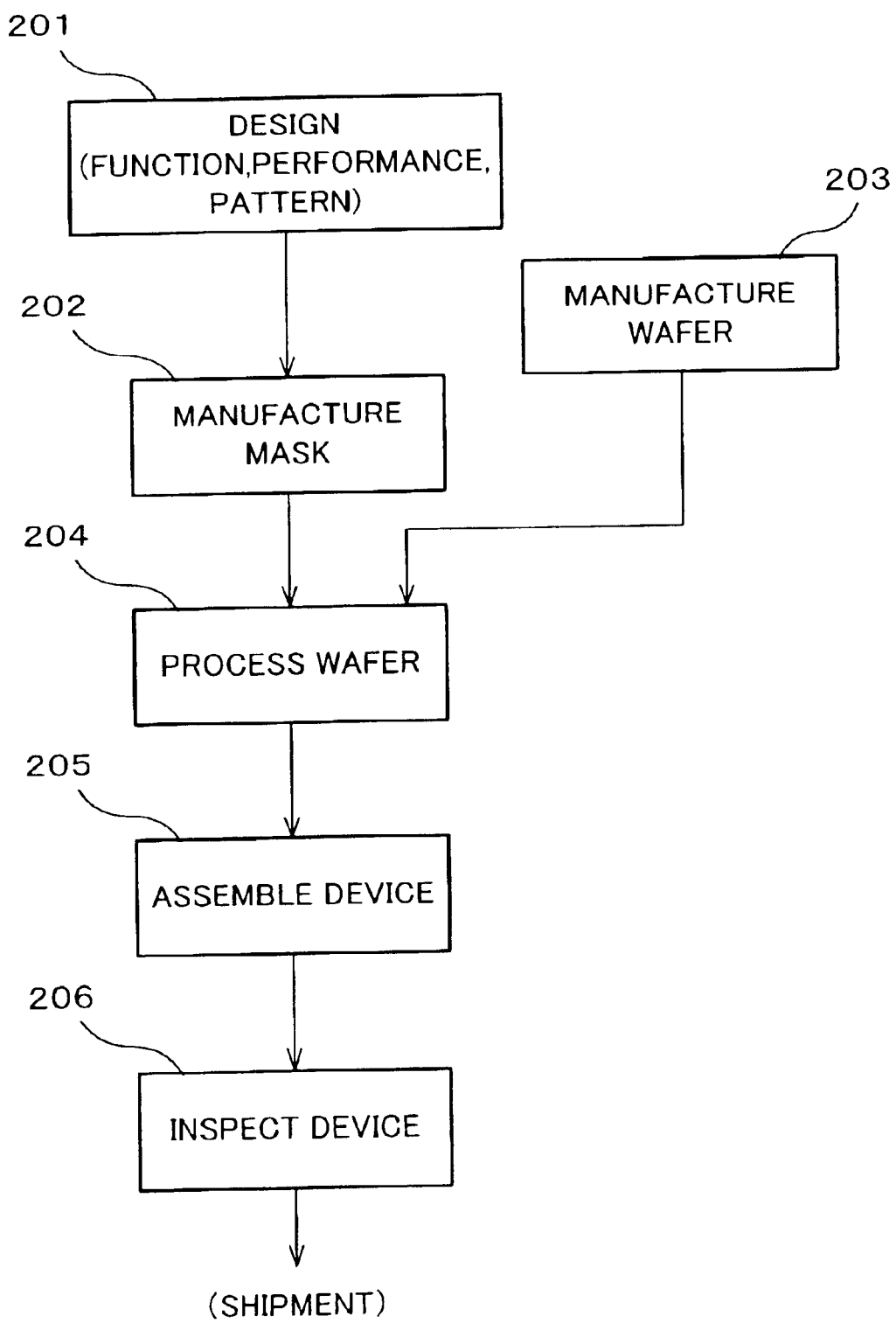
FIG. 16 is a flow chart for explaining an embodiment of a device manufacturing method according to the present invention.

FIG. 16 is a flowchart showing an example of manufacturing a device (a semiconductor chip such as an IC or LSI, a liquid crystal panel, a CCD, a thin magnetic head, a micromachine, or the like). As is shown in FIG. 16, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. In step 205 (device assembly step), a device is assembled using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 17:
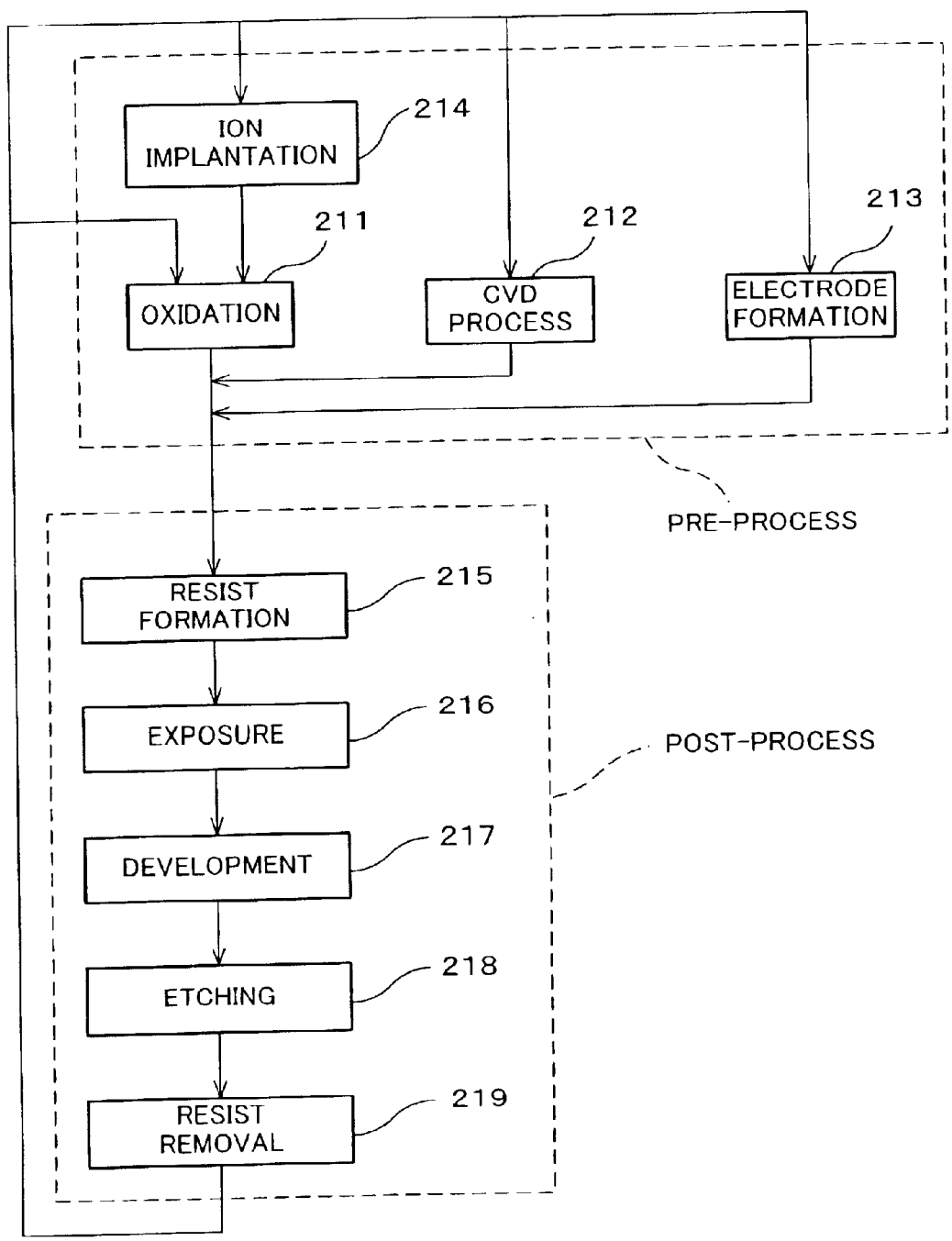
FIG. 17 is a flow chart for showing a process in step 204 in FIG. 16.
Figure 18:
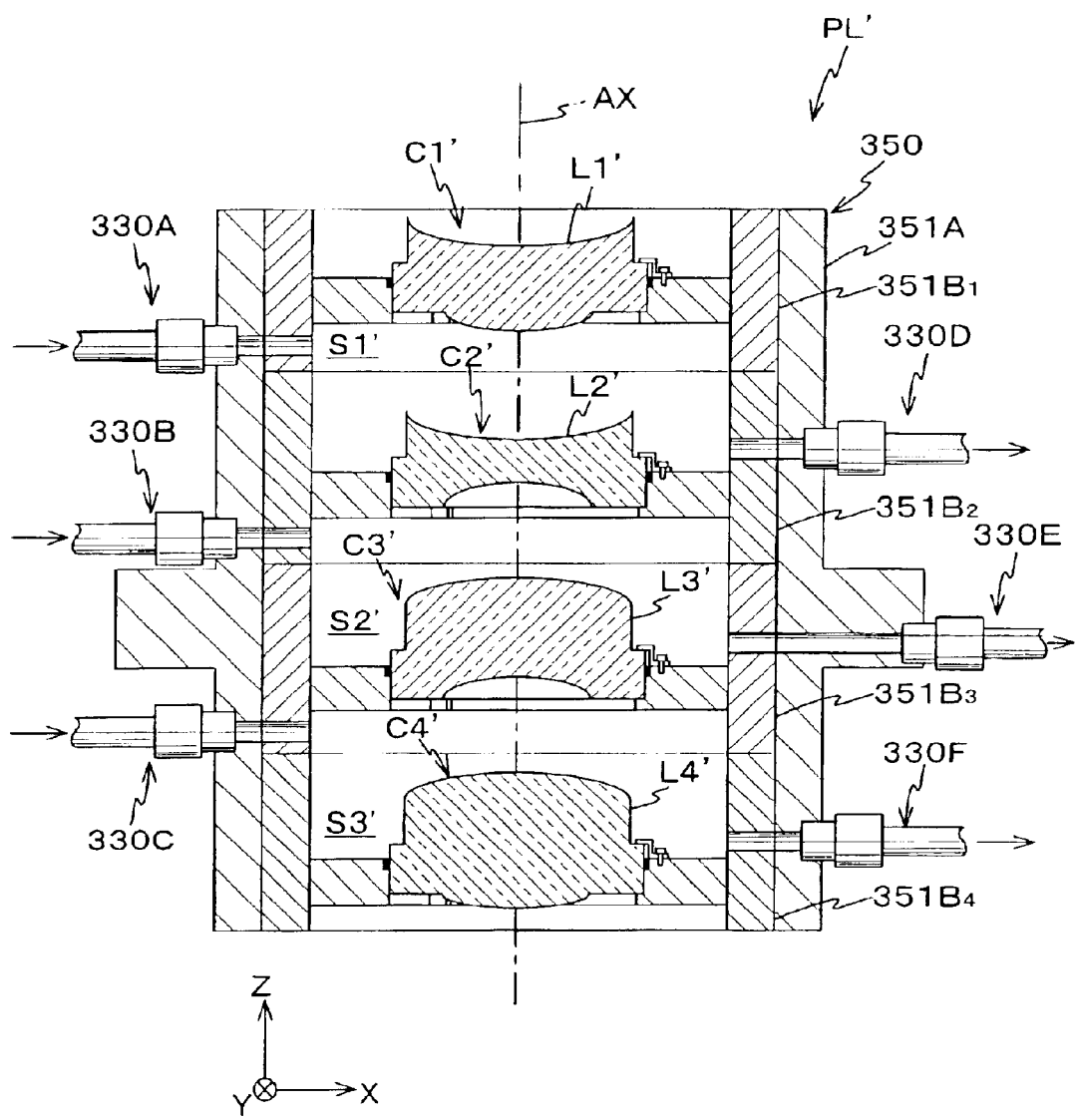
FIG. 18 is a sectional view for describing the inside of a conventional projection optical system.
Figure 19A:
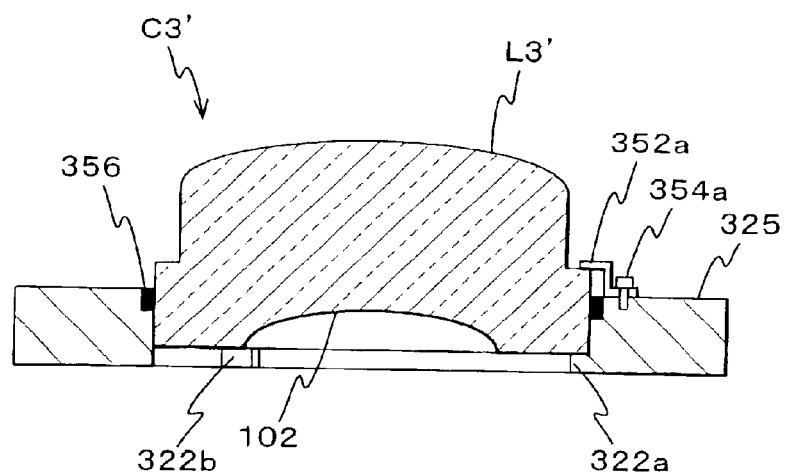
FIG. 19A is an enlarged sectional view of an optical member cell C3' in FIG. 18.
Figure 19B:
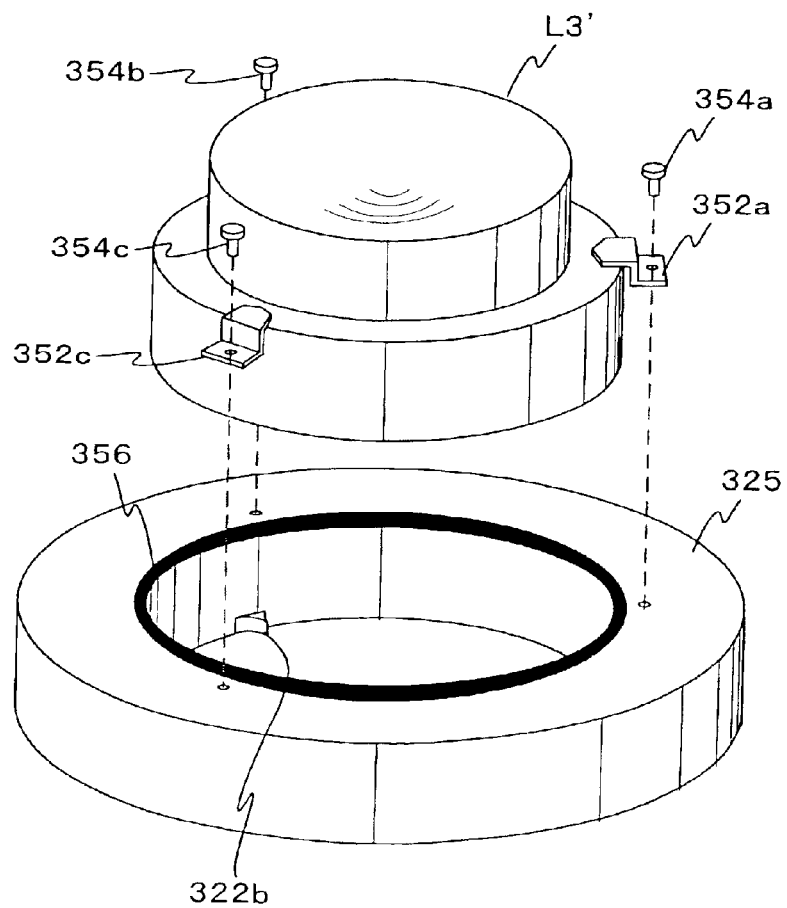
FIG. 19B is an exploded perspective view of the optical member cell C3'.

FIG. 17 is a flow chart showing a detailed example of step 204 described above in manufacturing the semiconductor device. Referring to FIG. 17, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process steps, multiple circuit patterns are formed on the wafer.

If the device manufacturing method in the present invention described so far is used, the exposure apparatus and the exposure method described in each of the embodiments above will be used in the exposure process (step 216). This allows the image forming characteristics of the projection optical system PL to be maintained for over a long period of time, and moreover, since the resolution can be improved due to the exposure light belonging to the vacuum ultraviolet region, exposure (transfer of the reticle pattern onto the wafer) can be performed with high accuracy for a long period. As a consequence, a highly integrated microdevice which minimum line width is around 0.1 μm can be produced with high yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An optical device arranged on an optical path of an energy beam, said optical device comprising:

a barrel;

a plurality of optical members arranged in a predetermined positional relationship on said optical path of said energy beam within said barrel;

a gas supply system having a supply opening arranged in said barrel, and configured to supply a specific gas having permeability to said energy beam into a space divided by said plurality of optical members via said supply opening; and an exhaust system having an exhaust opening arranged in said barrel, and configured to exhaust gas within said space via said exhaust opening;

wherein said supply opening of said specific gas is arranged closer to said optical path of said energy beam than said exhaust opening of said gas.

2. The optical device according to claim 1, wherein said supply opening is arranged in a gap located between said optical members reciprocally adjacent.

3. The optical device according to claim 1, wherein a flange portion is provided on at least a part of a periphery portion close to a neutral plane position of a specific optical member, said specific optical member is at least one of the plurality of optical members, and said optical device further comprises:

a holding device holding said specific optical member.

4. The optical device according to claim 1, wherein a plurality of said spaces are formed inside said barrel with said plurality of optical members, and said optical device further comprises:

a control system configured to control specific gas environments in each of said sealed spaces to keep pressure difference from occurring in adjacent spaces.

5. An exposure apparatus configured to expose a substrate via an optical system and a mask with the energy beam and to transfer a pattern formed on said mask onto said substrate, said exposure apparatus comprising:

the optical device according to claim 1 arranged on the optical path of said energy beam from said mask to said substrate.

6. The exposure apparatus according to claim 5, further comprising:

a scanning unit configured to scan said mask and said substrate synchronously with respect to said energy beam during exposure of said substrate.

7. A device manufacturing method including a lithographic process, wherein in said lithographic process exposure is performed using said exposure apparatus according to claim 5.

8. The optical device according to claim 1, wherein said gas supply system has a first supply opening with a predetermined opening area and a second supply opening with an opening area smaller than said first supply opening, as a supply opening of said specific gas.

9. The optical device according to claim 1, wherein said gas supply system has a first supply opening provided at said barrel, and a second supply opening arranged closer to said optical path of said energy beam than said first supply opening.

10. An optical device arranged on an optical path of an energy beam, said optical device comprising:

a barrel;

a plurality of optical members arranged in a predetermined positional relationship on said optical path of said energy beam within said barrel;

a first supplying route provided at said barrel, and having a first supply opening with a predetermined opening area configured to supply a specific gas, which has permeability to said energy beam, into a space inside said barrel divided by said plurality of optical members;

a second supplying route provided at said barrel, and having a second supply opening with an opening area smaller than said first supply opening configured to supply said specific gas into said space;

an exhausting route provided at said barrel, and configured to exhaust outside internal gas in said space; and a control unit connected to said first supplying route and said second supplying route, and configured to control supply of said specific gas into said space by selecting at least one of said first supplying route and said second supplying route, depending on a state inside said space.

11. The optical device according to claim 10, wherein said control unit is configured to replace said internal gas with said specific gas by supplying said specific gas via at least said first supplying route of said first supplying route and said second supplying route, when said internal gas of said space contains much absorptive gas having properties of absorbing said energy beam.

12. The optical device according to claim 10, wherein said control unit is configured to supply said space with said specific gas via said second supplying route, when said internal gas of said space contains less of absorptive gas having properties of absorbing said energy beam.

13. The optical device according to claim 10, wherein said second supply opening is arranged closer to said optical path of said energy beam than said first supply opening.

14. The optical device according to claim 10, wherein said second supply opening is arranged in a gap located between said optical members reciprocally adjacent, and said control unit is configured to supply said space with said specific gas via both said first and said second supplying routes, when said internal gas of said space contains much absorptive gas having properties of absorbing said energy beam.

15. The optical device according to claim 10, wherein a flange portion is provided on at least a part of a periphery portion close to a neutral plane position of a specific optical member, said specific optical member is at least one of the plurality of optical members, and said optical device further comprises:

a holding device holding said specific optical member.

16. The optical device according to claim 10, wherein a plurality of said spaces are formed inside said barrel with said plurality of optical members, and said optical device further comprises:

a control system configured to control specific gas environments in each of said sealed spaces to keep pressure difference from occurring in adjacent sealed spaces.

17. An exposure apparatus configured to expose a substrate via an optical system and a mask with an energy beam and to transfer a pattern formed on said mask onto said substrate, said exposure apparatus comprising:

the optical device according to claim 10 as said optical system.

18. The exposure apparatus according to claim 17, wherein said second supply opening is arranged in a gap between adjacent optical elements structuring said optical system, and said control unit is configured to supply said specific gas into said space via both said first supplying route and said second supplying route on initial gas replacement.

19. An optical device comprising:

a first barrel portion extending in a direction intersecting a gravitational direction;

a second barrel portion connected to said first barrel portion and extending in said gravitational direction;

a reflection element arranged within said first barrel portion and configured to reflect an energy beam;

at least one refraction optical element arranged within said second barrel portion, and configured to pass therethrough said energy beam reflected off said reflection element;

a first supply mechanism provided at said first barrel portion, and configured to supply a specific gas having permeability to said energy beam; and a second supply mechanism provided at said second barrel portion, and configured to supply said specific gas.

20. The optical device according to claim 19, wherein said optical device has a first exhaust mechanism provided at said first barrel portion and a second exhaust mechanism provided at said second barrel portion, and when said specific gas is a gas with a relative density lighter than air, gas supply openings of said first and second supply mechanisms are arranged in the upper portion of said gravitational direction in each of said barrel portions, whereas exhaust openings of said first and second exhaust mechanisms are arranged in the lower portion of said gravitational direction in each of said barrel portions.

21. The optical device according to claim 19, wherein said optical device has a reflection member arranged within at least one of said first barrel portion and said second barrel portion, and has a first reflection surface configured to reflect said energy beam toward said reflection element and a second reflection surface configured to reflect said energy beam reflected off said reflection element toward said refraction optical element, and in a space where said reflection member is arranged, a purity level of said specific gas is maintained higher compared with a purity level of other spaces.

22. The optical device according to claim 21, wherein a gas supply opening configured to supply said specific gas is provided in the vicinity of said reflection member.

23. The optical device according to claim 19, wherein a plurality of said refraction optical elements is arranged in a predetermined positional relationship, and said optical device further comprises:

a holding device holding a specific refraction optical element via a flange portion provided on at least a part of a periphery portion close to a neutral plane position of said specific refraction optical element, said specific refraction optical element being at least one of said plurality of said refraction optical elements.

24. The optical device according to claim 19, wherein a first space is formed inside said first barrel portion, and a second space is formed inside said second barrel portion, said first space and said second space are reciprocally adjacent, and said optical device further comprises:

a control system configured to control pressure within each of said spaces to keep pressure difference from occurring in said first space and said second space.

25. The optical device according to claim 19, wherein one of gas supply openings of said specific gas of said first and second supply mechanisms is arranged closer to an optical path of said energy beam than the other gas supply opening of said specific gas.

26. The optical device according to claim 19, wherein at least one of said first and second supply mechanisms has a first supplying route having a first gas supply opening with a predetermined opening area configured to supply said specific gas, and a second supplying route having a second gas supply opening with an opening area smaller than said first gas supply opening configured to supply said specific gas, and said optical device further comprises:

a control unit configured to control supply of said specific gas by selecting at least one of said first supplying route and said second supplying route, depending on a space subject to supply of said specific gas.

27. An exposure apparatus configured to irradiate the energy beam on a mask and to transfer a pattern formed on said mask onto a substrate, said exposure apparatus comprising:

the optical device according to claim 19 arranged on the optical path of said energy beam from said mask to said substrate.

28. The exposure apparatus according to claim 27, wherein said optical device comprises a reflection member arranged within at least one of said first barrel portion and said second barrel portion, and has a first reflection surface configured to reflect said energy beam toward said reflection element and a second reflection surface configured to reflect said energy beam reflected off said reflection element toward said refraction optical element, and in a space where said reflection member is arranged, a purity level of said specific gas is maintained higher compared with a purity level of other spaces.

29. The optical device according to claim 19, wherein said optical device has a first exhaust mechanism provided at said first barrel portion and a second exhaust mechanism provided at said second barrel portion, and gas supply openings of said first and second supply mechanisms are arranged closer to an optical path of said energy beam than exhaust openings of said first and second exhaust mechanisms.

30. The optical device according to claim 19, wherein at least one of said first and second supply mechanisms has a first gas supply opening provided at said barrel portion and a second gas supply opening arranged closer to an optical path of said energy beam than said first gas supply opening, said barrel portion being at least one of said first barrel portion at which said first supply mechanism is provided and said second barrel portion at which said second supply mechanism is provided.

31. The optical device according to claim 30, wherein said first gas supply opening has a predetermined opening area, and said second gas supply opening has an opening area smaller than said first gas supply opening.

* * * * *